United States Patent
Matsumiya et al.

(10) Patent No.: US 8,404,428 B2
(45) Date of Patent: *Mar. 26, 2013

(54) POSITIVE RESIST COMPOSITION, METHOD OF FORMING RESIST PATTERN USING THE SAME, AND FLUORINE-CONTAINING POLYMERIC COMPOUND

(75) Inventors: Tasuku Matsumiya, Kawasaki (JP);
Daiju Shiono, Kawasaki (JP);
Tomoyuki Hirano, Kawasaki (JP);
Takahiro Dazai, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 217 days.

This patent is subject to a terminal disclaimer.

(21) Appl. No.: 12/824,089

(22) Filed: Jun. 25, 2010

(65) Prior Publication Data

US 2011/0117499 A1    May 19, 2011

(30) Foreign Application Priority Data

Jul. 3, 2009    (JP) .................. P2009-159073

(51) Int. Cl.
G03F 7/004 (2006.01)
G03F 7/033 (2006.01)
G03F 7/039 (2006.01)
G03F 7/26 (2006.01)

(52) U.S. Cl. .............. 430/270.1; 430/326; 430/907; 430/910

(58) Field of Classification Search .......... 430/270.1, 430/326, 907, 910
See application file for complete search history.

(56) References Cited

U.S. PATENT DOCUMENTS

| | | | |
|---|---|---|---|
| 4,638,024 A * | 1/1987 | Sato et al. .......... | 524/22 |
| 5,945,517 A | 8/1999 | Nitta et al. | |
| 6,153,733 A | 11/2000 | Yukawa et al. | |
| 6,255,392 B1 * | 7/2001 | Inoue et al. .......... | 525/101 |
| 7,074,543 B2 | 7/2006 | Iwai et al. | |
| 7,291,690 B2 | 11/2007 | Yamago et al. | |
| 7,459,261 B2 | 12/2008 | Hatakeyama et al. | |
| 7,482,108 B2 | 1/2009 | Matsumaru et al. | |
| 8,221,956 B2 * | 7/2012 | Shiono et al. .......... | 430/270.1 |
| 2005/0271978 A1 | 12/2005 | Takeda et al. | |
| 2007/0160929 A1 * | 7/2007 | Hasegawa et al. ..... | 430/270.1 |
| 2007/0172769 A1 * | 7/2007 | Kanna et al. .......... | 430/311 |
| 2007/0231738 A1 * | 10/2007 | Kaneko et al. ........ | 430/270.1 |
| 2008/0311507 A1 * | 12/2008 | Isono et al. .......... | 430/270.1 |
| 2008/0319134 A1 * | 12/2008 | Ma et al. ............. | 525/123 |
| 2009/0197204 A1 * | 8/2009 | Shiono et al. ........ | 430/286.1 |
| 2009/0226842 A1 | 9/2009 | Shimizu et al. | |
| 2009/0317743 A1 * | 12/2009 | Shiono et al. ........ | 430/270.1 |
| 2010/0081088 A1 * | 4/2010 | Kawaue et al. ....... | 430/285.1 |
| 2010/0196820 A1 | 8/2010 | Kawaue et al. | |
| 2010/0209848 A1 | 8/2010 | Dazai et al. | |
| 2010/0233623 A1 * | 9/2010 | Kurosawa et al. .... | 430/285.1 |
| 2010/0233625 A1 * | 9/2010 | Hirano et al. ........ | 430/285.1 |
| 2010/0233626 A1 * | 9/2010 | Shimizu et al. ....... | 430/285.1 |
| 2011/0236824 A1 * | 9/2011 | Hirano et al. ........ | 430/270.1 |
| 2012/0077125 A1 * | 3/2012 | Shiono et al. ........ | 430/285.1 |
| 2012/0094236 A1 * | 4/2012 | Shiono et al. ........ | 430/285.1 |

FOREIGN PATENT DOCUMENTS

| | | |
|---|---|---|
| JP | H09-208554 | 8/1997 |
| JP | H10-221852 | 8/1998 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2004-323693 | 11/2004 |
| JP | 2005-126459 | 5/2005 |
| JP | 2005-344009 | 12/2005 |
| JP | 2006-045311 | 2/2006 |
| JP | 2006-215526 | 8/2006 |
| JP | 2006-299278 | 11/2006 |
| JP | 2008-247919 | 10/2008 |
| JP | 2009-091350 | 4/2009 |
| JP | 2009-091351 | 4/2009 |
| WO | WO 2004/074242 | 9/2004 |
| WO | WO 2008/021291 | * 2/2008 |

OTHER PUBLICATIONS

D. Gil et al., "First Microprocessors with Immersion Lithograhy," Optical Microlithography XVIII, Proceedings of SPIE vol. 5754, pp. 119-128 (2005).
Kodama et al., "Synthesis of Novel Fluoropolymer for 157nm Photoresists by Cyclo-polymerization." Advances in Resist Technology and Processing XIX, Proceedings of SPIE vol. 4690, pp. 76-83 (2002).
Irie et al. Surface Property Control for 193nm Immersion Resist, Journal of Photopolymer Science and Technology, vol. 19, No. 4, pp. 565-568 (2006).
Office Action issued in U.S. Appl. No. 12/721,291 on Jan. 6, 2012.
Office Action issued in U.S. Appl. No. 12/717,785 on Mar. 15, 2012.

* cited by examiner

Primary Examiner — Anca Eoff
(74) Attorney, Agent, or Firm — Knobbe Martens Olson & Bear LLP

(57) ABSTRACT

A fluorine-containing polymeric compound which contains a structural unit (f1) that is decomposable in an alkali developing solution as a block copolymer portion, a base component (A) that exhibits increased solubility in an alkali developing solution under the action of acid, and an acid generator component (B) that generates acid upon exposure.

7 Claims, 1 Drawing Sheet

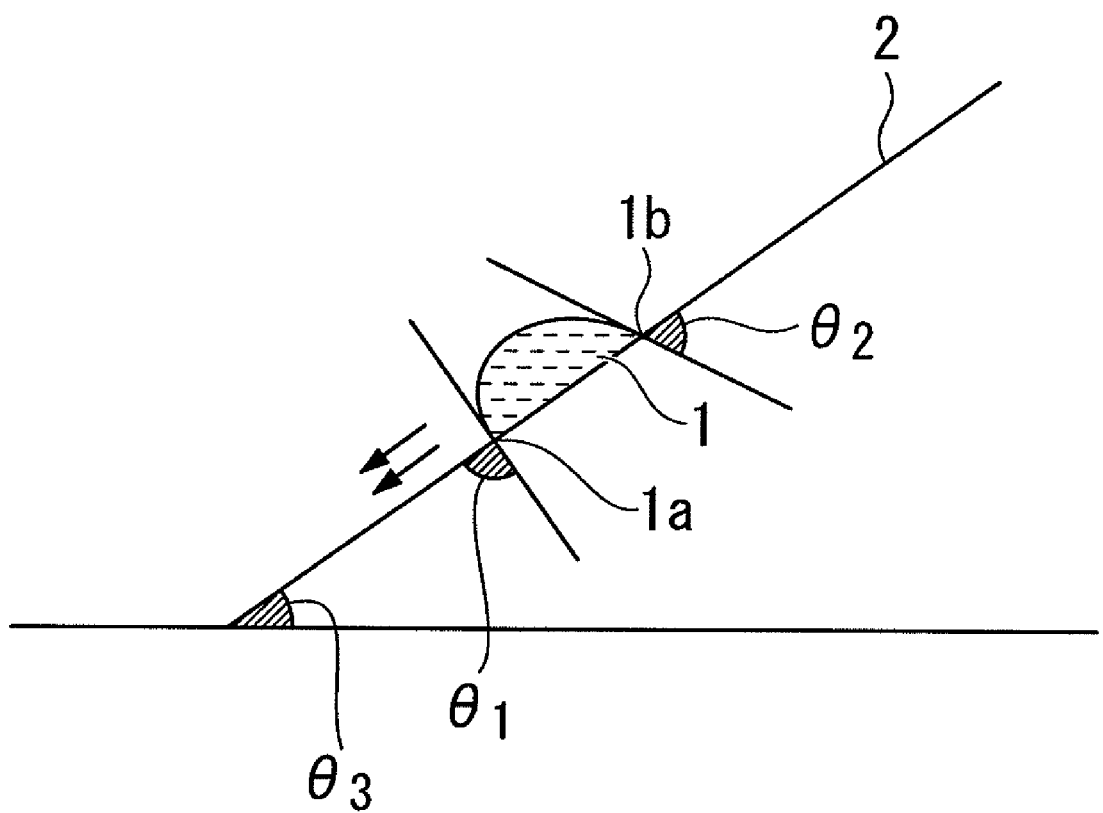

US 8,404,428 B2

POSITIVE RESIST COMPOSITION, METHOD OF FORMING RESIST PATTERN USING THE SAME, AND FLUORINE-CONTAINING POLYMERIC COMPOUND

TECHNICAL FIELD

The present invention relates to a positive resist composition including a fluorine-containing compound, a method of forming a resist pattern using the resist composition, and a fluorine-containing polymeric compound.

Priority is claimed on Japanese Patent Application No. 2009-159073, filed Jul. 3, 2009, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

As shortening the wavelength of the exposure light source progresses, it is required to improve various lithography properties of the resist material, such as the sensitivity to the exposure light source and a resolution capable of reproducing patterns of minute dimensions. As a resist material which satisfies these conditions, a chemically amplified resist is used, which includes a base resin that exhibits a changed solubility in an alkali developing solution under action of acid and an acid generator that generates acid upon exposure.

Currently, resins that contain structural units derived from (meth)acrylate esters within the main chain (acrylic resins) are now widely used as base resins for chemically amplified resists that use ArF excimer laser lithography, as they exhibit excellent transparency in the vicinity of 193 nm (for example, see Patent Document 1).

Here, the term "(meth)acrylic acid" is a generic term that includes either or both of acrylic acid having a hydrogen atom bonded to the $\alpha$-position and methacrylic acid having a methyl group bonded to the $\alpha$-position. The term "(meth)acrylate ester" is a generic term that includes either or both of the acrylate ester having a hydrogen atom bonded to the $\alpha$-position and the methacrylate ester having a methyl group bonded to the $\alpha$-position. The term "(meth)acrylate" is a generic term that includes either or both of the acrylate having a hydrogen atom bonded to the $\alpha$-position and the methacrylate having a methyl group bonded to the $\alpha$-position.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

In recent years, fluorine-containing compounds have been attracting attention for their properties such as water repellency and transparency, and active research and development of fluorine-containing compounds have been conducted in various fields.

For example, in the fields of resist materials, currently, an acid-labile group such as a methoxymethyl group, tert-butyl group or tert-butoxycarbonyl group is being introduced into a fluorine-containing polymeric compound, and the fluorine-containing polymeric compound is used as a base resin for a chemically amplified positive resist.

However, when such a fluorine-containing polymeric compound is used as a base resin for a positive resist, disadvantages are caused in that a large amount of an out gas is generated, and resistance to a dry-etching gas (etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

In addition, a fluorine-containing polymeric compound has been reported in order to provide a resist film with water repellency in a resist composition for immersion exposure (see, for example, Non-Patent Document 3).

DOCUMENTS OF RELATED ART

Patent Document

[Patent Document 1] Japanese Unexamined Patent Application, First Publication No. 2003-241385

Non-Patent Documents

[Non-Patent Document 1] Proceedings of SPIE (U.S.), vol. 5754, pp. 119-128 (2005)

[Non-Patent Document 2] Proceedings of SPIE (U.S.), vol. 4690, pp. 76-83 (2002)

[Non-Patent Document 3] Journal of Photopolymer. Sci. Technol., vol. 19, No. 4, pp. 565-568 (2006)

SUMMARY OF THE INVENTION

For example, in immersion exposure, a resist material is required which exhibits not only general lithography properties (e.g., sensitivity, resolution, etching resistance and the like), but also properties suited for immersion lithography. In immersion exposure, when the resist film comes in contact with the immersion medium, elution of a substance contained in the resist film into the immersion medium occurs. This elution of a substance causes phenomenon such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, the elution of a substance can be reduced. Further, when the immersion medium is water, and immersion exposure is performed using a scanning-type immersion exposure apparatus as disclosed in Non-Patent Document 1, a water tracking ability in which the immersion medium is capable of tracking the movement of the lens is required. When the water tracking ability is low, the exposure speed becomes low, and as a result, there is a possibility that the productivity is adversely affected. It is presumed that the water tracking ability can be improved by enhancing the hydrophobicity of the resist film (rendering the resist film hydrophobic).

Accordingly, it is presumed that the above-described characteristic problems of immersion lithography, which require a reduction in substance elution and an improvement in the water tracking ability, can be addressed by enhancing the hydrophobicity of the resist film surface. However, if the resist film is simply rendered hydrophobic, then adverse effects are seen on the lithography properties. For example, as the hydrophobicity of the resist film is increased, defects tend to occur more readily on the surface of the formed resist pattern following alkali developing. Especially, in the case of a positive resist composition, defects are likely to be generated at unexposed portions.

The term "defects" refers to general abnormalities within a resist film that are detected when observed from directly above the developed resist film using, for example, a surface defect detection apparatus (product name: "KLA") manufactured by KLA-TENCOR Corporation. Examples of these abnormalities include post-developing scum, foam, dust, bridges (structures that bridge different portions of the resist pattern), color irregularities, and foreign deposits and residues. These defects are regarded as problems not only in immersion lithography, but also in other lithography techniques. It is presumed that the problem of defects can be solved by a material which is capable of increasing the hydrophilicity of the resist film during development. However, such a material is essentially unknown in the art.

The present invention takes the above circumstances into consideration, with an object of providing a resist composition, a method of forming a resist pattern that uses the resist composition, and a fluorine-containing polymeric compound that is useful as an additive for the resist composition.

For solving the above-mentioned problems, the present invention employs the following aspects.

Specifically, a first aspect of the present invention is a positive resist composition including a fluorine-containing polymeric compound (F) which contains a structural unit (f1) that is decomposable in an alkali developing solution as a block copolymer portion, a base component (A) that exhibits increased solubility in an alkali developing solution under the action of acid, and an acid generator component (B) that generates acid upon exposure.

A second aspect of the present invention is a method of forming a resist pattern including using a resist composition according to the first aspect to form a resist film on a substrate, subjecting the resist film to immersion exposure, and subjecting the resist film to alkali developing to form a resist pattern.

A third aspect of the present invention is a fluorine-containing polymeric compound including a structural unit (f1) that is decomposable in an alkali developing solution as a block copolymer portion.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

According to the present invention, there are provided a resist composition preferable for improving defects during development and suitable for use in immersion exposure, a method of forming a resist pattern that uses the resist composition, and a fluorine-containing compound that is useful as an additive for the resist composition.

BRIEF DESCRIPTION OF THE DRAWINGS

FIG. 1 is an explanatory diagram of an advancing angle ($\theta 1$), a receding angle ($\theta 2$) and a sliding angle ($\theta 3$).

MODE FOR CARRYING OUT THE INVENTION

The positive resist composition of the present invention includes a base component (A) which exhibits changed solubility in an alkali developing solution under action of acid (hereafter, referred to as "component (A)"), an acid-generator component (B) which generates acid upon exposure (hereafter, referred to as "component (B)") and a fluorine-containing polymeric compound (F) (hereafter, referred to as "component (F)") which includes a structural unit (f1) that is decomposable in an alkali developing solution as a block copolymer portion.

<Component (A)>

In the present invention, the term "base component" refers to an organic compound capable of forming a film.

As the base component, an organic compound having a molecular weight of 500 or more can be preferably used. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

In the present invention, the component (A) contains a polymeric compound (A1) (hereafter, referred to as "component (A1)") including a structural unit (a1) derived from an acrylate ester containing an acid dissociable, dissolution inhibiting group.

[Component (A1)]

The component (A1) is a polymeric compound including the structural unit (a1).

Further, the component (A1) preferably includes a structural unit (a0) represented by general formula (a0-1), as well as the structural unit (a1).

Furthermore, it is preferable that the component (A1) include a structural unit (a3) derived from an acrylate ester containing a polar group-containing aliphatic hydrocarbon group, as well as the structural unit (a1), or the structural unit (a1) and the structural unit (a0).

The component (A1) may further include a structural unit (a2).

[Chemical Formula 1]

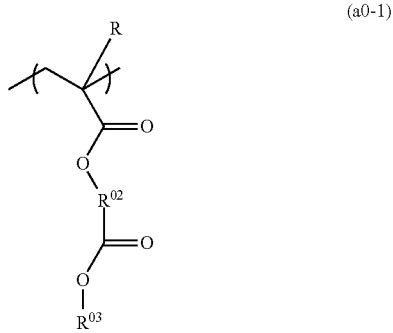

(a0-1)

In formula (a0-1), R represents a hydrogen atom, an alkyl group of 1 to 5 carbon atoms or a halogenated alkyl group of 1 to 5 carbon atoms; $R^{02}$ represents a divalent linking group; and $R^{03}$ represents a cyclic group containing an —$SO_2$— group within the ring skeleton thereof.

(Structural Unit (a0))

In general formula (a0-1), R represents a hydrogen atom, an alkyl group of 1 to 5 carbon atoms or a halogenated alkyl group of 1 to 5 carbon atoms.

As the alkyl group for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group has been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a0-1), $R^{02}$ represents a divalent linking group.

Preferable examples of $R^{02}$ include a divalent hydrocarbon group which may have a substituent, and a divalent linking group containing a hetero atom.

Divalent Hydrocarbon Group which May have a Substituent

With respect to $R^{02}$, the hydrocarbon group "has a substituent" means that part or all of the hydrogen atoms within the hydrocarbon group has been substituted with a group or an atom other than a hydrogen atom.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group.

As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of the substituent include an alkyl group of 1 to 5 carbon atoms, a fluorine atom, a fluorinated alkyl group of 1 to 5 carbon atoms, and an oxygen atom (=O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Divalent Linking Group Containing a Hetero Atom

With respect to the "divalent linking group containing a hetero atom" for $R^{02}$, a hetero atom refers to an atom other than carbon and hydrogen, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —$NR^{04}$— ($R^{04}$ represents a substituent such as an alkyl group or an acyl group), —NH—C(=O)—, =N—, —S—, —S(=O)$_2$—, and —S(=O)$_2$—O—. Further, a combination of any one of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

In the —$NR^{04}$— group, $R^{04}$ represents a substituent such as an alkyl group or an acyl group. The substituent (an alkyl group, an acyl group or the like) preferably has 1 to 10 carbon atoms, more preferably 1 to 8, and most preferably 1 to 5.

$R^{02}$ may or may not have an acid dissociable portion in the structure thereof.

An "acid dissociable portion" refers to a portion within the $R^{02}$ group which is dissociated from the group by action of acid generated upon exposure. When the $R^{02}$ group has an acid dissociable portion, it preferably has an acid dissociable portion having a tertiary carbon atom.

In the present invention, as the divalent linking group for $R^{02}$, an alkylene group, a divalent aliphatic cyclic group or a divalent linking group containing a hetero atom is preferable. Among these, an alkylene group is particularly desirable.

When $R^{02}$ represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When $R^{02}$ represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

When $R^{02}$ represents a divalent linking group containing a hetero atom, preferable examples of the divalent linking group containing a hetero atom include —O—, —C(=O)—O—, —C(=O)—, —O—C(=O)—O—, —C(=O)—NH—, —$NR^{04}$— ($R^{04}$ represents a substituent such as an alkyl group or an acyl group), —S—, —S(=O)$_2$—, —S(=O)$_2$—O—, a group represented by the formula -A-O—B—, and a group represented by the formula -[A-C(=O)—O]$_q$—B—. Herein, each of A and B independently represents a divalent hydrocarbon group which may have a substituent, and q represents an integer of 0 to 3.

In the group represented by the formula -A-O—B— or -[A-C(=O)—O]$_q$—B—, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as $R^{02}$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_q$—B—, q represents an integer of 0 to 3, preferably an integer of 0 to 2, more preferably 0 or 1, and most preferably 1.

In general formula (a0-1), $R^{03}$ represents a cyclic group containing —SO$_2$— within the ring skeleton thereof.

The cyclic group for $R^{03}$ refers to a cyclic group including a ring that contains —SO$_2$— within the ring skeleton thereof, and this ring is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The cyclic group for $R^{03}$ may be either a monocyclic group or a polycyclic group.

As $R^{03}$, a cyclic group containing —O—SO$_2$— within the ring skeleton thereof, i.e., a sultone ring is particularly desirable.

The cyclic group for $R^{03}$ preferably has 3 to 30 carbon atoms, more preferably 4 to 20, still more preferably 4 to 15, and most preferably 4 to 12.

Herein, the number of carbon atoms refers to the number of carbon atoms constituting the ring skeleton, excluding the number of carbon atoms within a substituent.

The cyclic group for $R^{03}$ may be either an aliphatic cyclic group or an aromatic cyclic group, and is preferably an aliphatic cyclic group.

Examples of aliphatic cyclic groups for $R^{03}$ include the aforementioned cyclic aliphatic hydrocarbon groups in which part of the carbon atoms constituting the ring skeleton thereof has been substituted with —SO$_2$— or —O—SO$_2$—.

More specifically, examples of monocyclic groups include a monocycloalkane in which one hydrogen atom have been removed therefrom and a —CH$_2$— group constituting the ring skeleton thereof has been substituted with —SO$_2$—; and a monocycloalkane in which one hydrogen atom have been removed therefrom and a —CH$_2$—CH$_2$— group constituting the ring skeleton thereof has been substituted with —O—SO$_2$—. Examples of polycyclic groups include a polycycloalkane (a bicycloalkane, a tricycloalkane, a tetracycloalkane or the like) in which one hydrogen atom have been removed therefrom and a —CH$_2$— group constituting the ring skeleton thereof has been substituted with —SO$_2$—; and a polycycloalkane in which one hydrogen atom have been removed therefrom and a —CH$_2$—CH$_2$— group constituting the ring skeleton thereof has been substituted with —O—SO$_2$—.

The cyclic group for $R^{03}$ may have a substituent. Examples of the substituent include an alkyl group, an alkoxy group, a halogen atom, a halogenated alkyl group, a hydroxy group, an oxygen atom (═O), —COOR", —OC(═O)R", a hydroxyalkyl group and a cyano group. R" represents a hydrogen atom or an alkyl group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(═O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of $R^{03}$ include groups represented by general formulas (3-1) to (3-4) shown below.

[Chemical Formula 2]

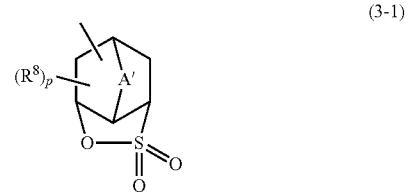

(3-1)

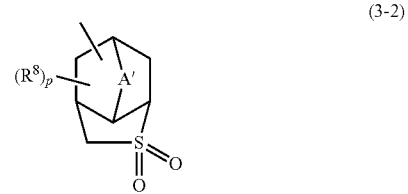

(3-2)

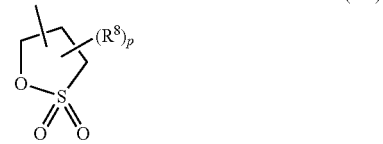

(3-3)

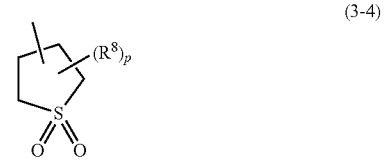

(3-4)

In the formulas, A' represents an oxygen atom, a sulfur atom, or an alkylene group of 1 to 5 carbon atoms which may contain an oxygen atom or a sulfur atom; p represents an integer of 0 to 2; and $R^8$ represents an alkyl group, an alkoxy group, a halogenated alkyl group, a hydroxyl group, —COOR", —OC(═O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkyl group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

p represents an integer of 0 to 2, and is most preferably 0.

When p is 2, the plurality of R$^8$ may be the same or different from each other.

As the alkyl group, alkoxy group, halogenated alkyl group, halogenated alkyl group, hydroxyl group, —COOR", —OC(═O)R", hydroxyalkyl group and cyano group for R$^8$, the same alkyl groups, alkoxy groups, halogenated alkyl groups, halogenated alkyl groups, hydroxyl groups, —COOR", —OC(═O)R", hydroxyalkyl groups and cyano groups as those described above as the substituent for the cyclic group represented by R$^{03}$ can be used.

Specific examples of the cyclic groups represented by general formulas (3-1) to (3-4) are shown below. In the formulas shown below, "Ac" represents an acetyl group.

[Chemical Formula 3]

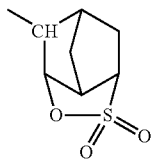

(3-1-1)

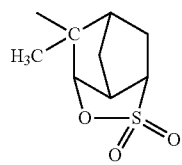

(3-1-2)

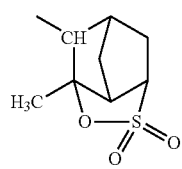

(3-1-3)

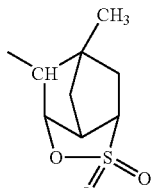

(3-1-4)

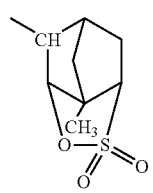

(3-1-5)

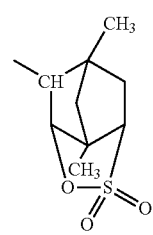

(3-1-6)

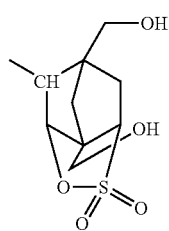

(3-1-7)

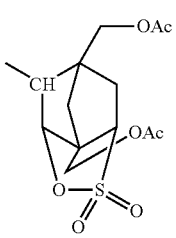

(3-1-8)

[Chemical Formula 4]

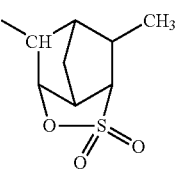

(3-1-9)

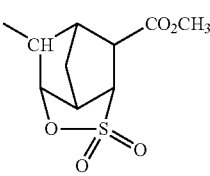

(3-1-10)

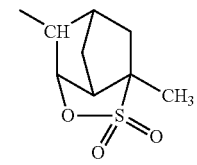

(3-1-11)

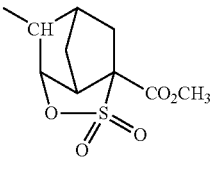

(3-1-12)

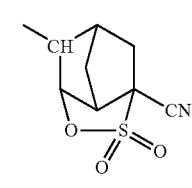

(3-1-13)

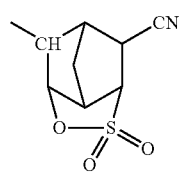 (3-1-14)
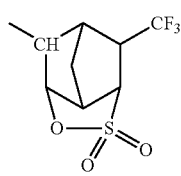 (3-1-15)
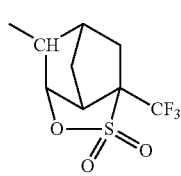 (3-1-16)
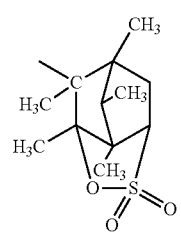 (3-1-17)
[Chemical Formula 5]
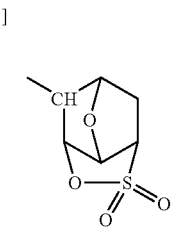 (3-1-18)
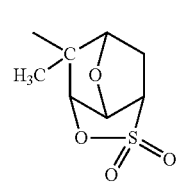 (3-1-19)
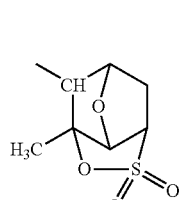 (3-1-20)
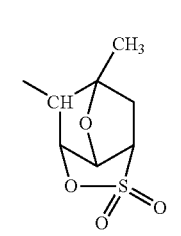 (3-1-21)
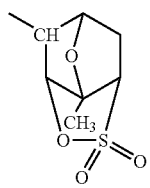 (3-1-22)
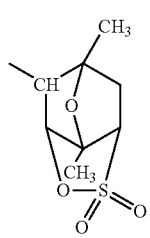 (3-1-23)
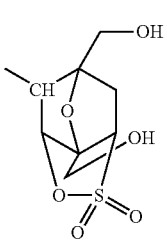 (3-1-24)
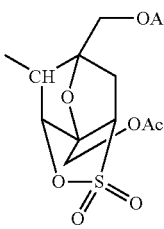 (3-1-25)
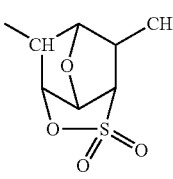 (3-1-26)
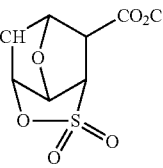 (3-1-27)
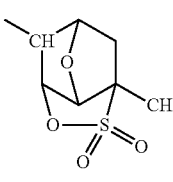 (3-1-28)
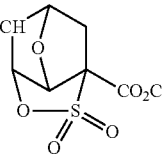 (3-1-29)

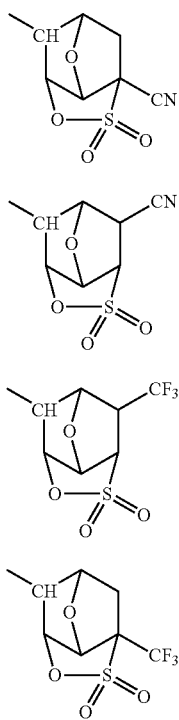

(3-1-30)
(3-1-31)
(3-1-32)
(3-1-33)

[Chemical Formula 6]

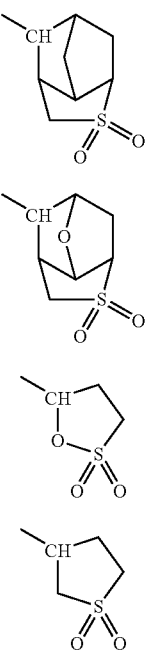

(3-2-1)
(3-2-2)
(3-3-1)
(3-4-1)

Among the examples shown above, as $R^{03}$, a cyclic group represented by general formula (3-1), (3-3) or (3-4) above is preferable, and a cyclic group represented by general formula (3-1) above is particularly desirable.

More specifically, as $R^{03}$, it is preferable to use at least one cyclic group selected from the group consisting of cyclic groups represented by chemical formulas (3-1-1), (3-1-18), (3-3-1) and (3-4-1) above, and a cyclic group represented by chemical formula (3-1-1) above is particularly desirable.

In the present invention, as the structural unit (a0), a structural unit represented by general formula (a0-1-11) shown below is particularly desirable.

[Chemical Formula 7]

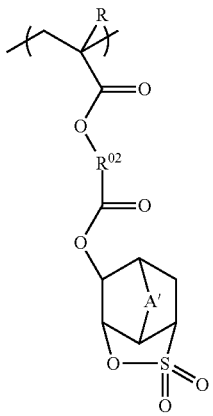

(a0-1-11)

In the formula, R is the same as defined above; $R^{02}$ represents a linear or branched alkylene group or -A-C(=O)—O—B— (wherein A and B are the same as defined above); and A' is the same as defined above.

The linear or branched alkylene group for $R^{02}$ preferably has 1 to 10 carbon atoms, more preferably 1 to 8, still more preferably 1 to 5, still more preferably 1 to 3, and most preferably 1 or 2.

In the -A-C(=O)—O—B— group, each of A and B preferably represents a linear or branched alkylene group, more preferably an alkylene group of 1 to 5 carbon atoms, and most preferably a methylene group or an ethylene group. Specific examples thereof include —(CH$_2$)$_2$—C(=O)—O—(CH$_2$)$_2$—, and —(CH$_2$)$_2$—O—C(=O)—(CH$_2$)$_2$—.

A' is preferably a methylene group, an oxygen atom (—O—) or a sulfur atom (—S—).

As the structural unit (a0), one type of structural unit may be used alone, or two or more types of structural units may be used in combination.

In terms of achieving excellent lithography properties such as exposure margin (EL margin), line width roughness (LWR) and the like in the formation of a resist pattern using a positive resist composition containing the component (A1), the amount of the structural unit (a0) within the component (A1), based on the combined total of all structural units constituting the component (A1) is preferably 1 to 60 mol %, more preferably 5 to 55 mol %, still more preferably 10 to 50 mol %, and most preferably 15 to 45 mol %.

(Structural Unit (a1))

The structural unit (a1) is a structural unit derived from an acrylate ester containing an acid dissociable, dissolution inhibiting group and does not fall under the category of the aforementioned structural unit (a0).

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

As an example of the aliphatic branched, acid dissociable, dissolution inhibiting group, for example, a group represented by the formula —C($R^{71}$)($R^{72}$)($R^{73}$) can be given (in the formula, each of $R^{71}$ to $R^{73}$ independently represents a linear alkyl group of 1 to 5 carbon atoms). The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantine, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

Examples of aliphatic cyclic group-containing acid dissociable, dissolution inhibiting groups include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded.

Specific examples of (i) a group which has a tertiary carbon atom on the ring structure of a monovalent aliphatic cyclic group include groups represented by general formulas (1-1) to (1-9) shown below.

Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 8]

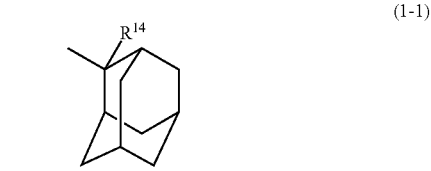

(1-1)

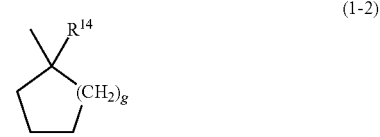

(1-2)

(1-3)

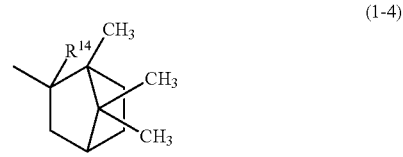

(1-4)

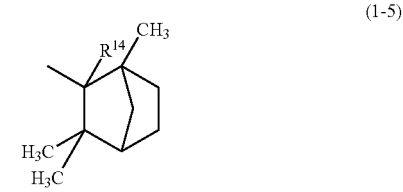

(1-5)

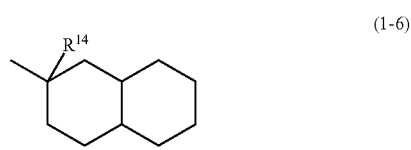

(1-6)

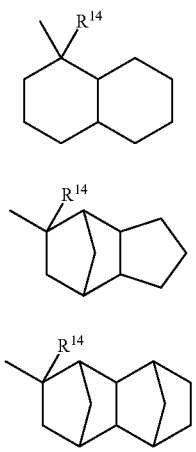

(1-7)

(1-8)

(1-9)

In the formulas above, R$^{14}$ represents an alkyl group; and g represents an integer of 0 to 8.

[Chemical Formula 9]

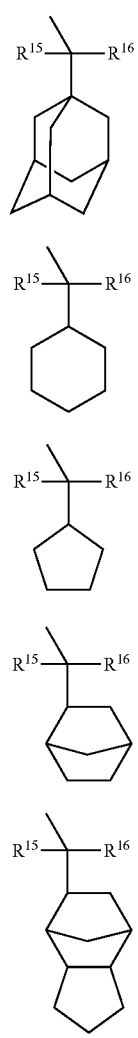

(2-1)

(2-2)

(2-3)

(2-4)

(2-5)

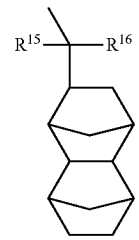

(2-6)

In the formulas above, each of R$^{15}$ and R$^{16}$ independently represents an alkyl group.

As the alkyl group for R$^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

As the alkyl group for R$^{15}$ and R$^{16}$, the same alkyl groups as those for R$^{r4}$ can be used.

In formulas (1-1) to (1-9) and (2-1) to (2-6), part of the carbon atoms constituting the ring may be replaced with an ethereal oxygen atom (—O—).

Further, in formulas (I-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 10]

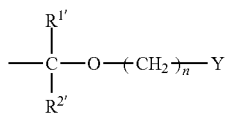

(p1)

In the formula, R$^{1\prime}$ and R$^{2\prime}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{1\prime}$ and $R^{2\prime}$, the same alkyl groups of 1 to 5 carbon atoms as those described above for R can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 11]

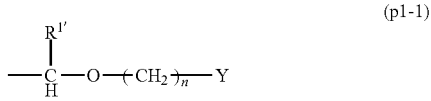

(p1-1)

In the formula, $R^{1\prime}$, n and Y are the same as defined above.

As the alkyl group of 1 to 5 carbon atoms for Y, the same alkyl groups of 1 to 5 carbon atoms as those for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 12]

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and an ethyl group is particularly desirable.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of acetal-type acid dissociable, dissolution inhibiting groups include groups represented by formulas (p3-1) to (p3-12) shown below.

[Chemical Formula 13]

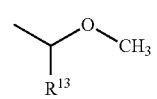

(p3-1)

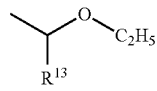

(p3-2)

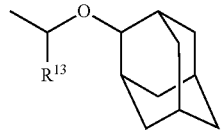

(p3-3)

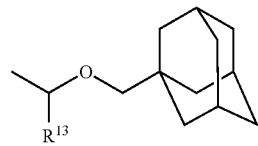

(p3-4)

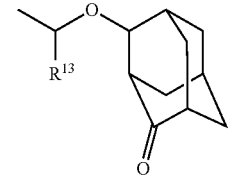

(p3-5)

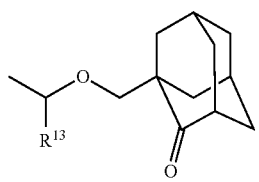

(p3-6)

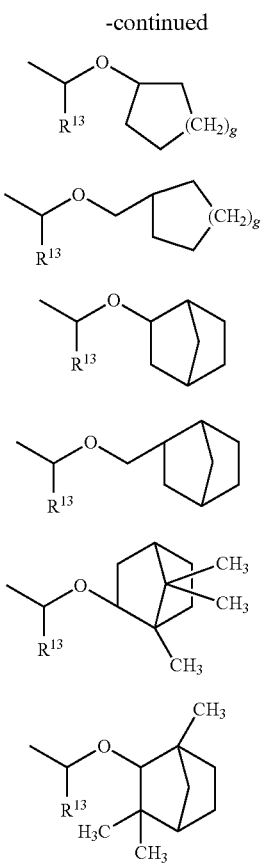

In the formulas above, $R^{13}$ represents a hydrogen atom or a methyl group; and g is the same as defined above.

Specific examples of the structural unit (a1) include a structural unit represented by general formula (a1-0-1) shown below and a structural unit represented by general formula (a1-0-2) shown below.

[Chemical Formula 14]

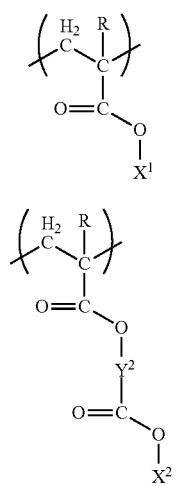

In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; and $X^2$ represents an acid dissociable, dissolution inhibiting group.

In general formula (a1-0-1), R is the same as defined for R in general formula (a0-1).

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

As examples of the divalent linking group for $Y^2$, the same groups as those described above for $R^{02}$ in formula (a0-1) can be given.

As $Y^{02}$, the aforementioned alkylene group, a divalent aliphatic cyclic group or a divalent linking group containing a hetero atom described in the explanation of $R^2$ is preferable. Among these, a divalent linking group containing a hetero atom is preferable, and a linear group containing an oxygen atom as a heteroatom, e.g., a group containing an ester bond is particularly desirable.

More specifically, a group represented by the aforementioned formula -A-O—B— or -A-C(=O)—O—B— is preferable, and a group represented by the formula —$(CH_2)_x$—C(=O)—O—$(CH_2)_y$— is particularly desirable.

x represents an integer of 1 to 5, preferably 1 or 2, and most preferably 1.

y represents an integer of 1 to 5, preferably 1 or 2, and most preferably 1.

Specific examples of the structural unit (a1) include structural units represented by general formulas (a1-1) to (a1-4) shown below.

[Chemical Formula 15]

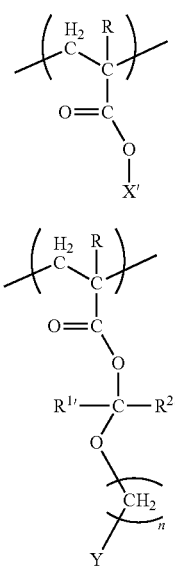

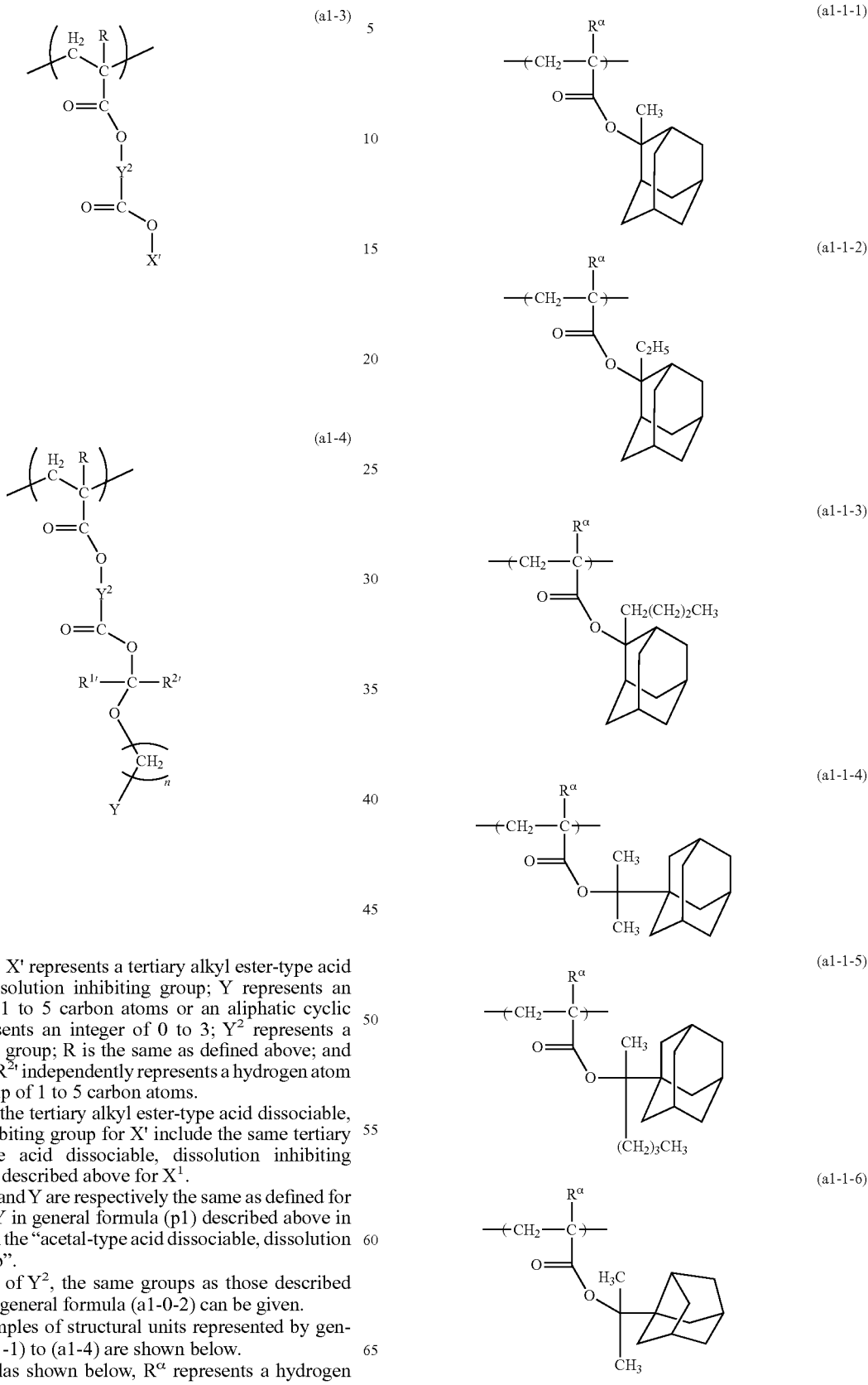

In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; $Y^2$ represents a divalent linking group; R is the same as defined above; and each of $R^{1\prime}$ and $R^{2\prime}$ independently represents a hydrogen atom or an alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^1$, $R^{2\prime}$, n and Y are respectively the same as defined for $R^{1\prime}$, $R^{2\prime}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

-continued
(a1-1-7)
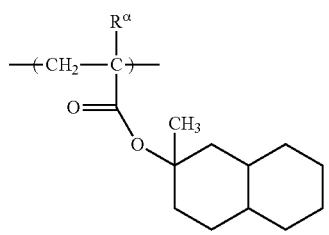
(a1-1-8)
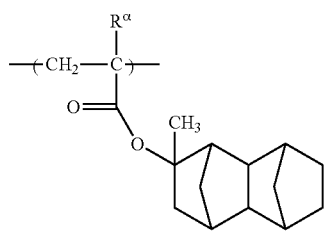
(a1-1-9)
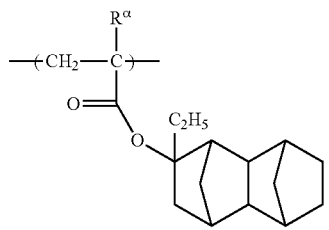
[Chemical Formula 17]
(a1-1-10)
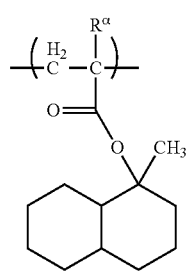
(a1-1-11)
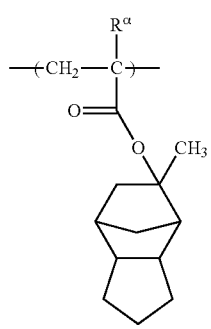
(a1-1-12)
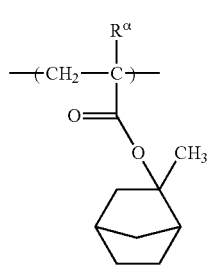
-continued
(a1-1-13)
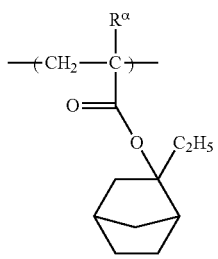
(a1-1-14)
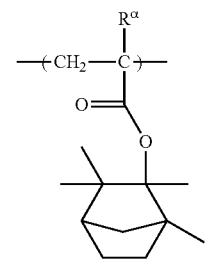
(a1-1-15)
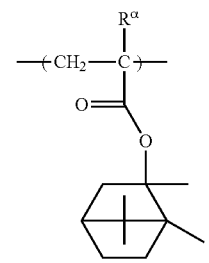
(a1-1-16)
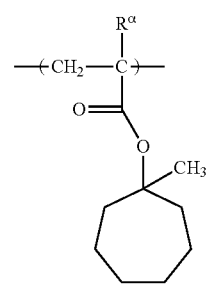
(a1-1-17)
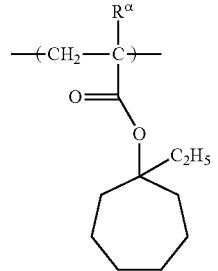
(a1-1-18)
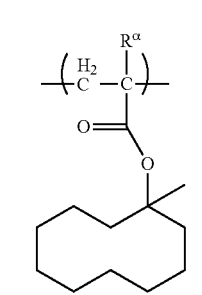

(a1-1-19) 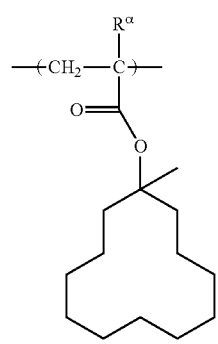
(a1-1-20) 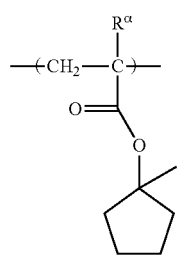
(a1-1-21) 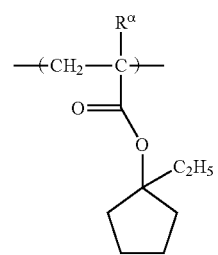
[Chemical Formula 18]
(a1-1-22) 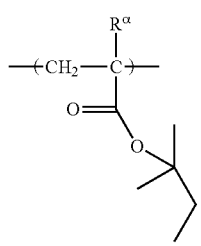
(a1-1-23) 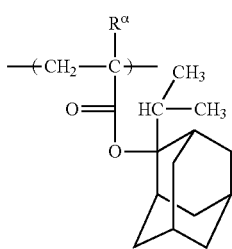
(a1-1-24) 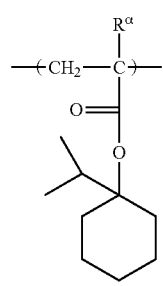
(a1-1-25) 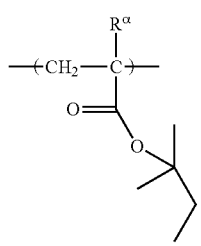
(a1-1-26) 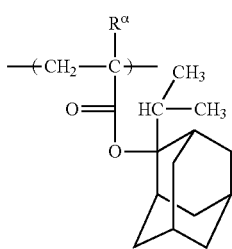
(a1-1-27) 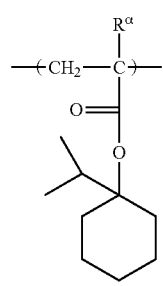
(a1-1-28) 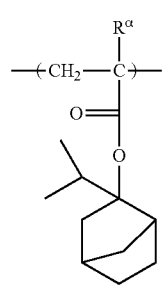
(a1-1-29) 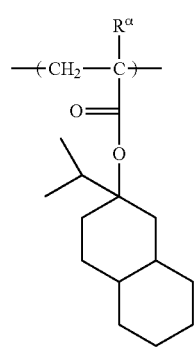

(a1-1-30)
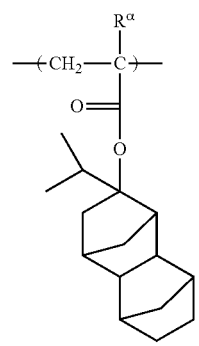
(a1-1-31)
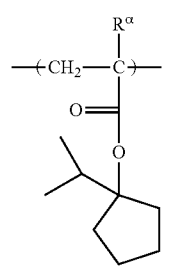
(a1-1-32)
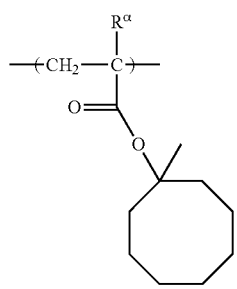
(a1-1-33)
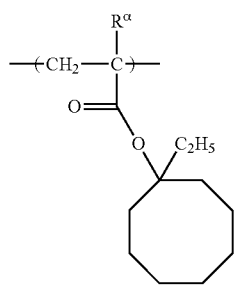
[Chemical Formula 19]
(a1-2-1)
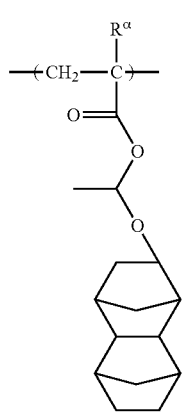
(a1-2-2)
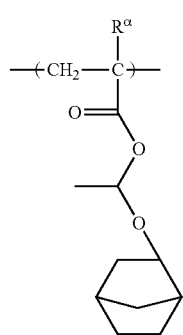
(a1-2-3)
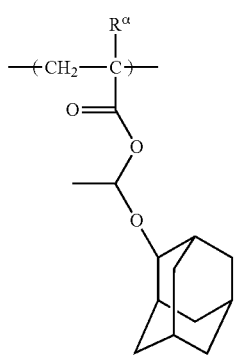
(a1-2-4)
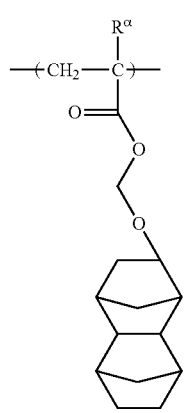
(a1-2-5)
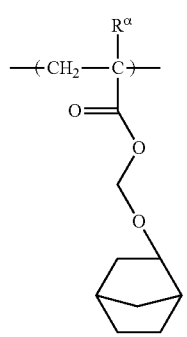

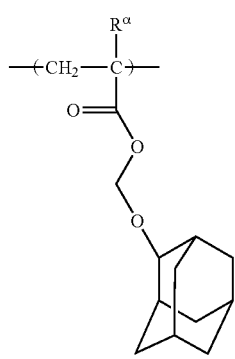
(a1-2-6)
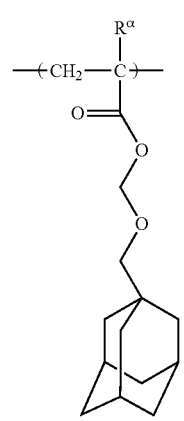
(a1-2-7)
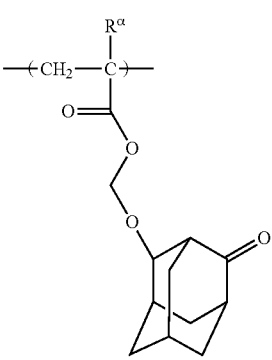
(a1-2-8)
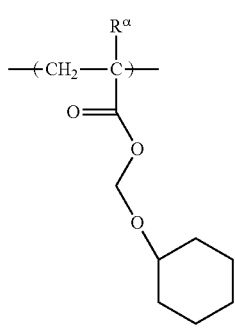
(a1-2-9)
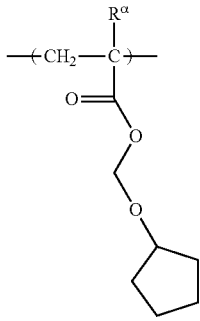
(a1-2-10)
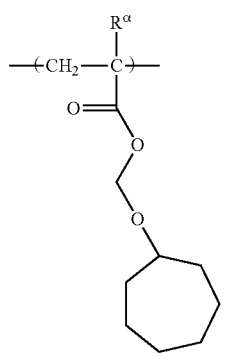
(a1-2-11)
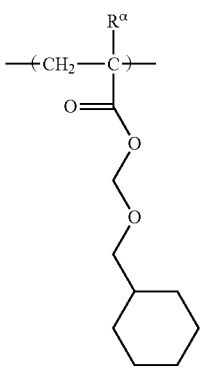
(a1-2-12)
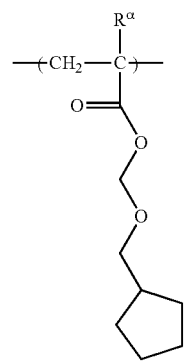
(a1-2-13)

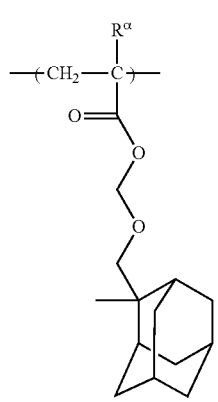 (a1-2-14)
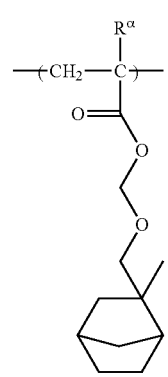 (a1-2-15)
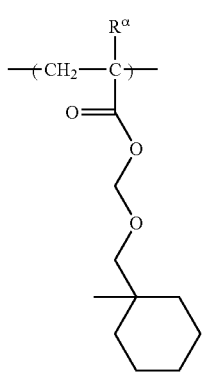 (a1-2-16)
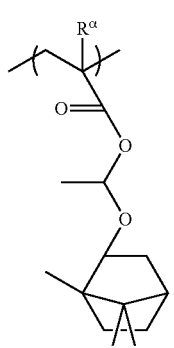 (a1-2-17)
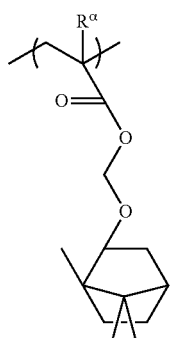 (a1-2-18)
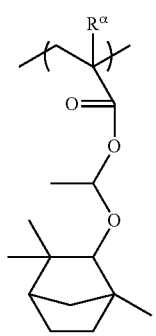 (a1-2-19)
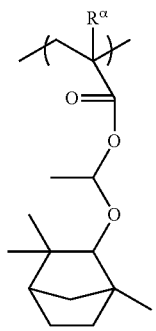 (a1-2-20)
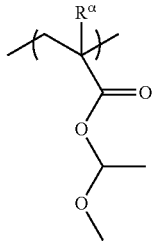 (a1-2-21)
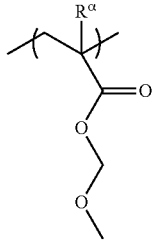 (a1-2-22)

(a1-2-23) 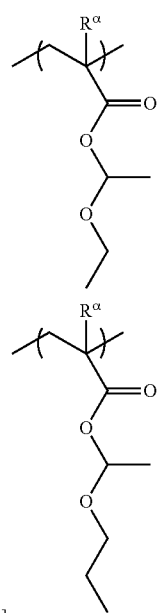
(a1-2-24)
[Chemical Formula 20]
(a1-3-1) 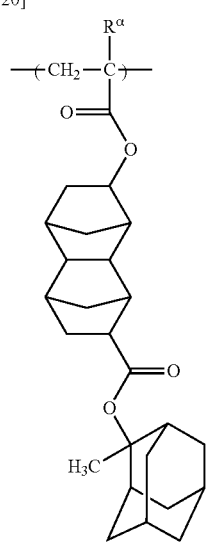
(a1-3-2) 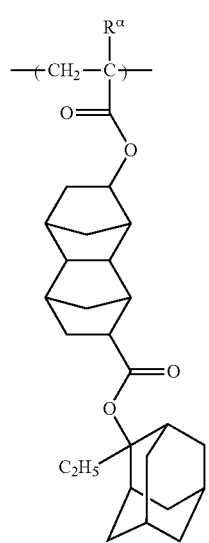
(a1-3-3) 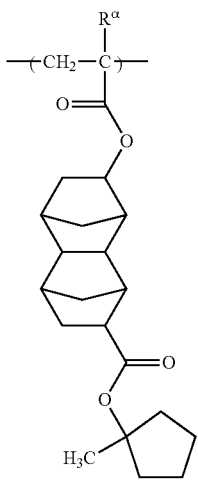
(a1-3-4) 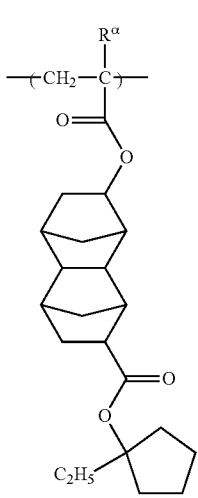
(a1-3-5) 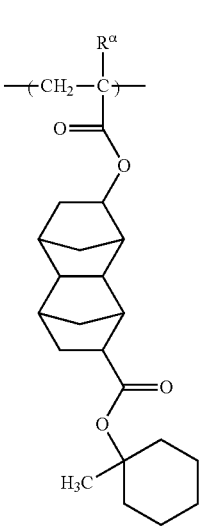

(a1-3-6)
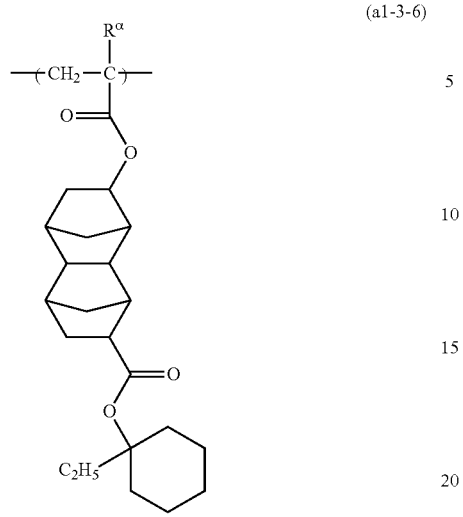
(a1-3-9)
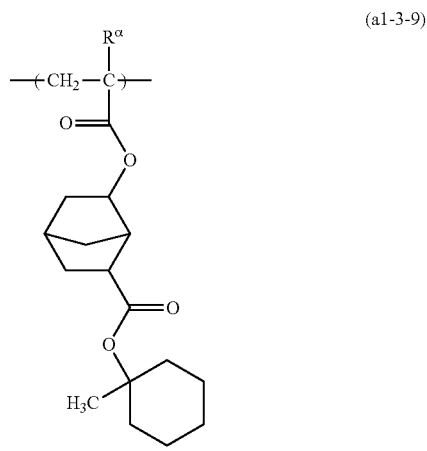
(a1-3-7)
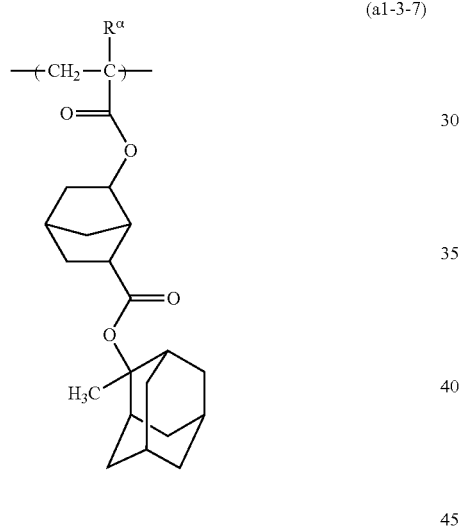
(a1-3-10)
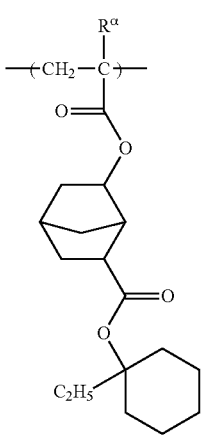
(a1-3-8)
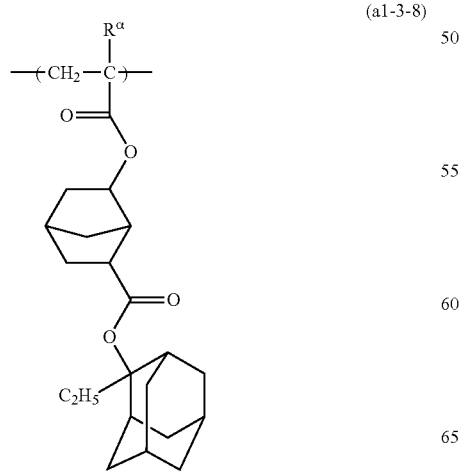
(a1-3-11)
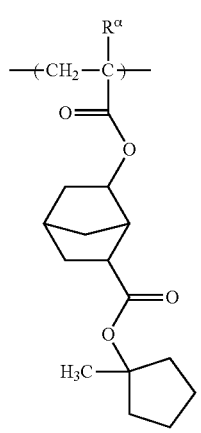

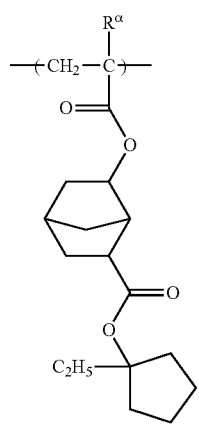
(a1-3-12)
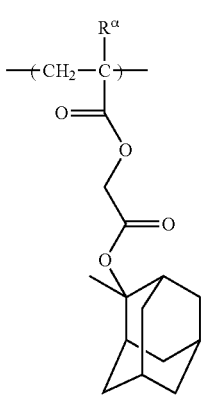
(a1-3-13)
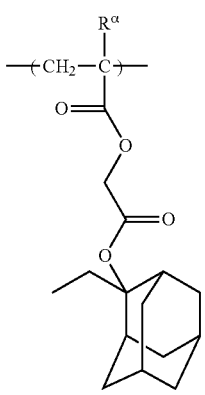
(a1-3-14)
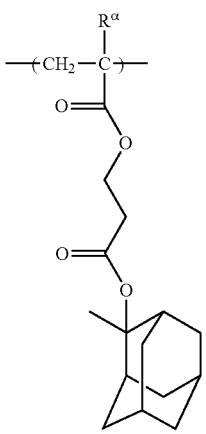
(a1-3-15)
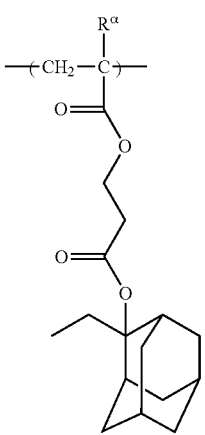
(a1-3-16)
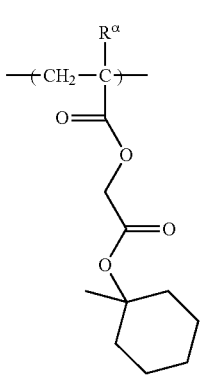
(a1-3-17)
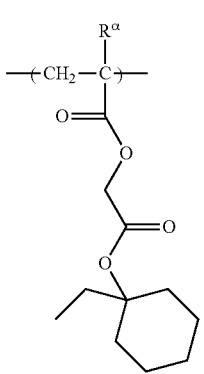
(a1-3-18)
[Chemical Formula 21]
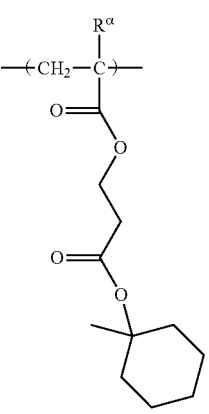
(a1-3-19)

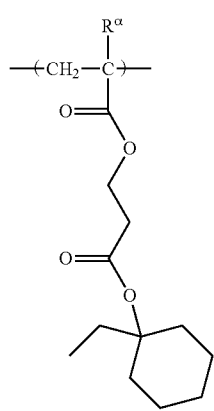 (a1-3-20)
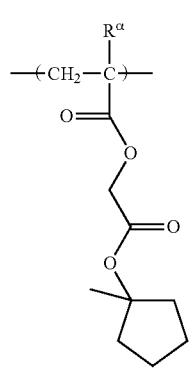 (a1-3-21)
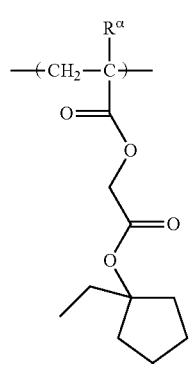 (a1-3-22)
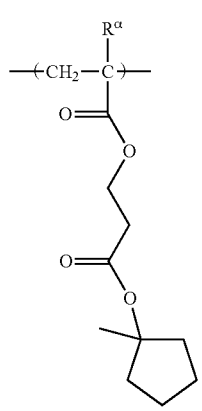 (a1-3-23)
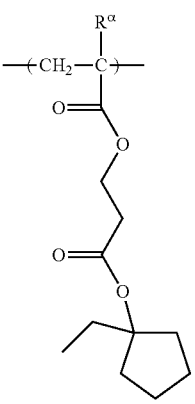 (a1-3-24)
[Chemical Formula 22]
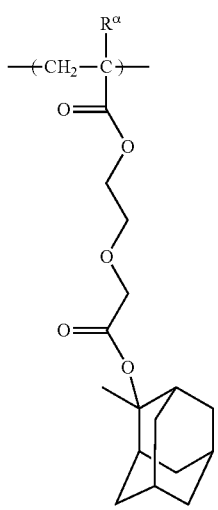 (a1-3-25)
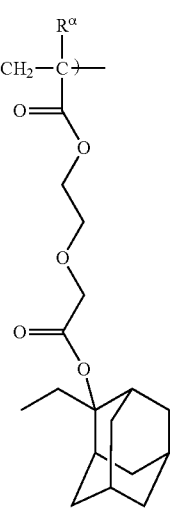 (a1-3-26)

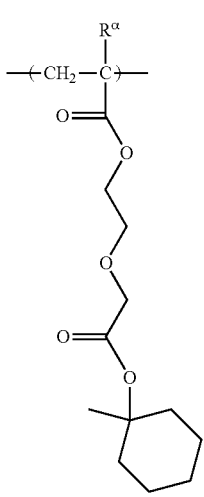
(a1-3-27)
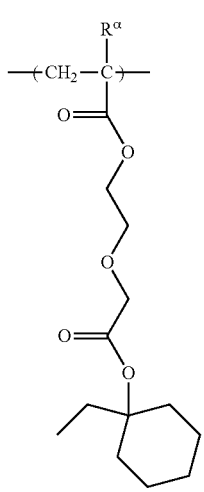
(a1-3-28)
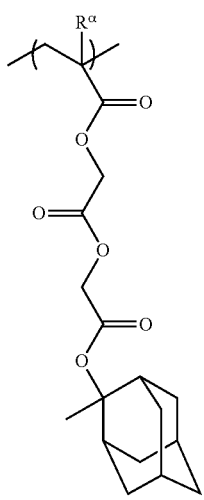
(a1-3-29)
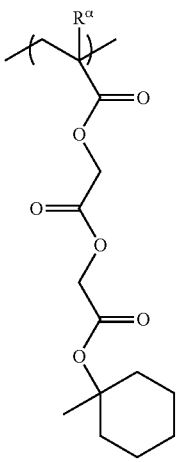
(a1-3-30)
[Chemical Formula 23]
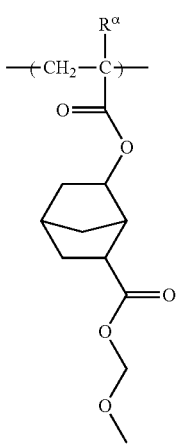
(a1-4-1)
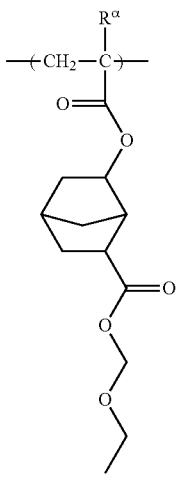
(a1-4-2)

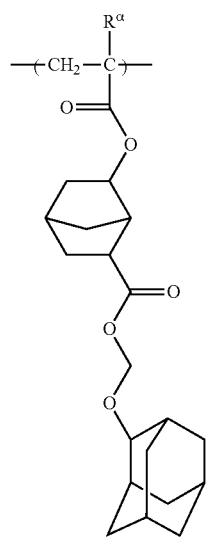
(a1-4-3)
(a1-4-4)
(a1-4-5)
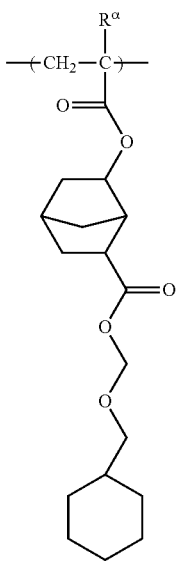
(a1-4-6)
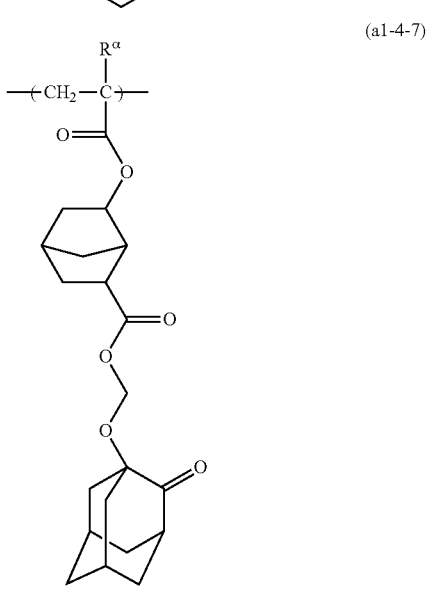
(a1-4-7)
(a1-4-8)

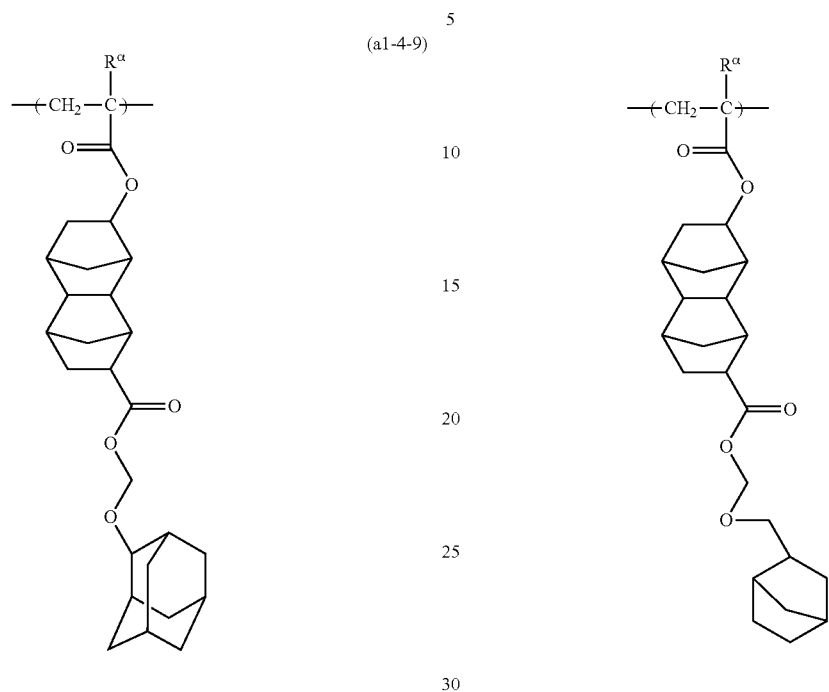
(a1-4-9)
(a1-4-11)
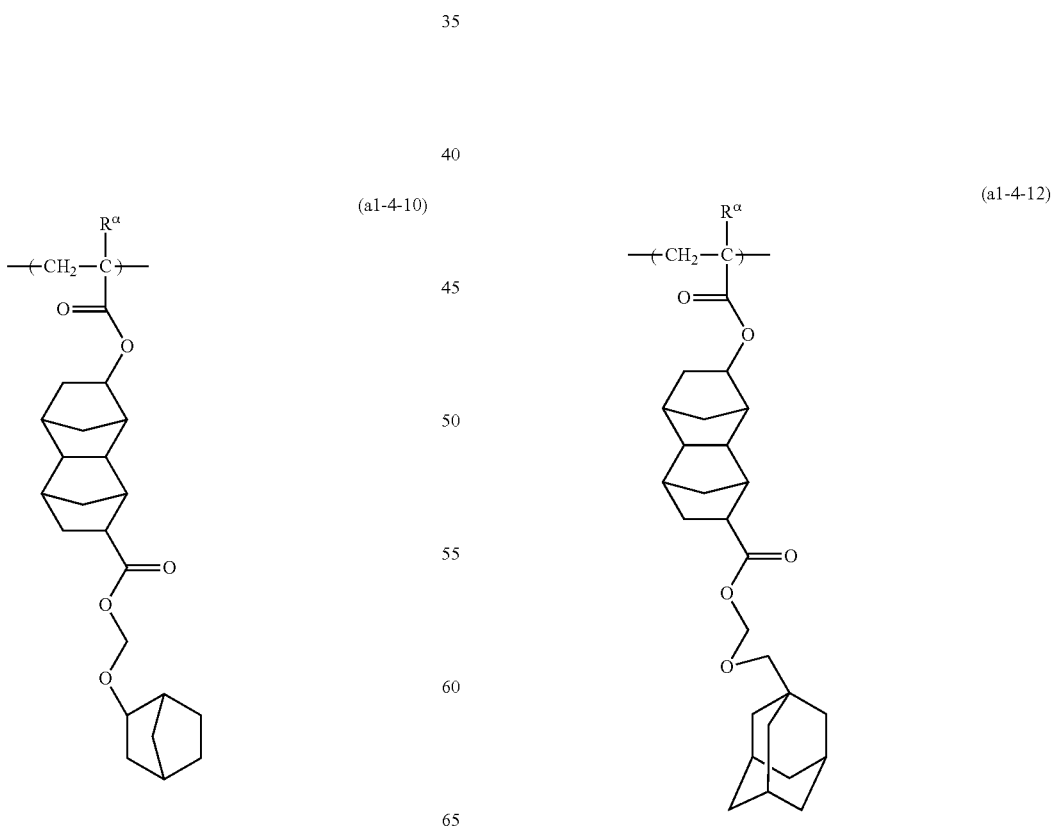
(a1-4-10)
(a1-4-12)

(a1-4-13)
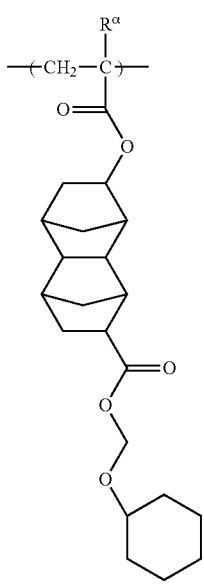

(a1-4-14)
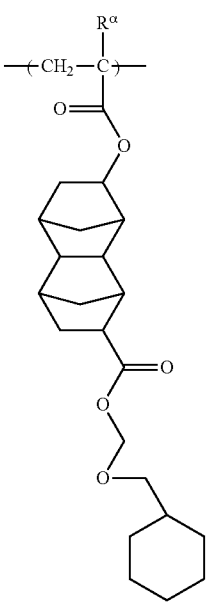

(a1-4-15)
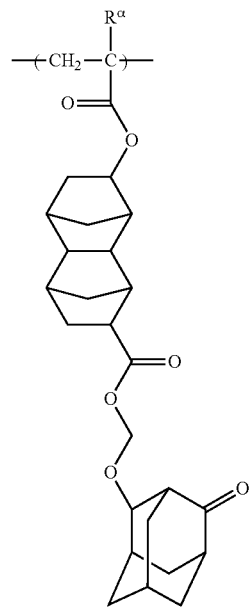

As the structural unit (a1), one type of structural unit may be used alone, or two or more types of structural units may be used in combination.

In the present invention, as the structural unit (a1), a structural unit represented by general formula (a1-1-01) shown below which includes the aforementioned formulas (a1-1-1), (a1-1-2) and (a1-1-7) to (a1-1-15) described above as examples of structural units represented by general formula (a1-1) is particularly desirable in terms of achieving excellent lithography properties (e.g., EL margin, LWR, resolution and the like) and an excellent resist pattern shape.

As a structural unit represented by general formula (a1-1-01) shown below, a structural unit represented by general formula (a1-1-101) shown below which includes the aforementioned formulas (a1-1-1) and (a1-1-2) is particularly desirable.

[Chemical Formula 24]

(a1-1-01)
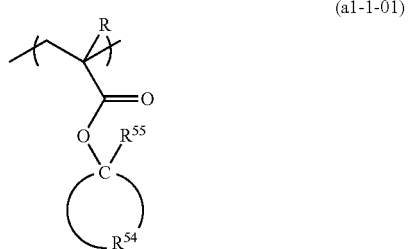

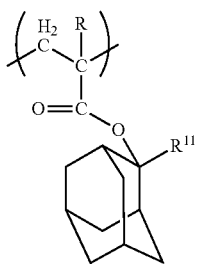
(a1-1-101)

in the formulas, R is the same as defined above; each of $R^{55}$ and $R^{11}$ independently represents a linear alkyl group of 1 to 5 carbon atoms; and $R^{54}$ represents a group which forms an aliphatic polycyclic group together with the carbon atom bonded to the $R^{54}$ group.

In general formula (a1-1-01), as the aliphatic polycyclic group formed by $R^{54}$ and the carbon atom to which $R^{54}$ is bonded, the same aliphatic cyclic groups as those described above for the aforementioned tertiary alkyl ester-type acid dissociable, dissolution inhibiting group and which are polycyclic can be used.

Further, it is preferable that the component (A1) include, as the structural unit (a1), at least one member selected from the group consisting of a structural unit represented by general formula (a1-0-11) shown below, a structural unit represented by general formula (a1-0-12) shown below, and a structural unit represented by general formula (a1-0-2) shown below.

[Chemical Formula 25]

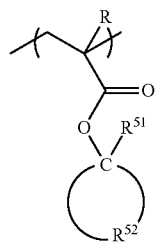
(a1-0-11)

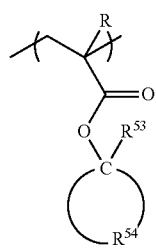
(a1-0-12)

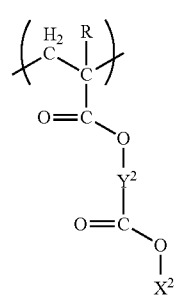
(a1-0-2)

In the formulas, R represents a hydrogen atom, an alkyl group of 1 to 5 carbon atoms or a halogenated alkyl group of 1 to 5 carbon atoms; $R^{51}$ represents an alkyl group; $R^{52}$ represents a group which forms an aliphatic monocyclic group with the carbon atom to which $R^{52}$ is bonded; $R^{53}$ represents a branched alkyl group; $R^{54}$ is the same as defined for $R^{54}$ in general formula (a1-1-01); $Y^2$ represents a divalent linking group; and $X^2$ represents an acid dissociable, dissolution inhibiting group.

In the formulas, R, $Y^2$ and $X^2$ are the same as defined above.

In general formula (a1-0-11), as the alkyl group for $R^{51}$, the same alkyl groups as those described above for $R^{14}$ in formulas (1-1) to (1-9) can be used, preferably a methyl group or an ethyl group, and most preferably an ethyl group.

As the aliphatic monocyclic group formed by $R^{52}$ and the carbon atoms to which $R^{52}$ is bonded, the same aliphatic cyclic groups as those described above for the aforementioned tertiary alkyl ester-type acid dissociable, dissolution inhibiting group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ethereal oxygen atom (—O—).

Further, the monocycloalkane may have a substituent such as an alkyl group of 1 to 5 carbon atoms, a fluorine atom or a fluorinated alkyl group.

As an examples of $R^{52}$ constituting such an aliphatic cyclic group, an alkylene group which may have an ethereal oxygen atom (—O—) interposed between the carbon atoms can be given.

Specific examples of structural units represented by general formula (a1-0-11) include structural units represented by the aforementioned formulas (a1-1-16) to (a1-1-23). Among these, a structural unit represented by general formula (a1-1-02) shown below which includes the structural units represented by the aforementioned formulas (a1-1-16), (a1-1-17), (a1-1-20) to (a1-1-23), (a1-1-32) and (a1-1-33) is preferable. Further, a structural unit represented by general formula (a1-1-02') shown below is also preferable.

In the formulas shown below, h is preferably 1 or 2, and most preferably 2.

[Chemical Formula 26]

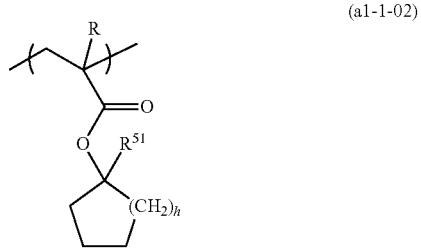
(a1-1-02)

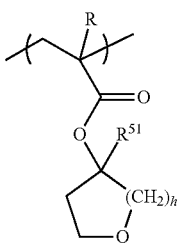

(a1-1-02')

In the formulas, R and $R^{51}$ are the same as defined above; and h represents an integer of 1 to 6.

In general formula (a1-0-12), as the branched alkyl group for $R^{53}$, the same alkyl groups as those described above for $R^{14}$ in formulas (1-1) to (1-9) which are branched can be used, and an isopropyl group is particularly desirable.

$R^{54}$ is the same as defined for $R^{54}$ in formula (a1-1-01).

Specific examples of structural units represented by general formula (a1-0-12) include structural units represented by the aforementioned formulas (a1-1-26) to (a1-1-31).

Examples of structural units represented by general formula (a1-0-2) include structural units represented by the aforementioned formulas (a1-3) and (a1-4), and a structural unit represented by formula (a1-3) is preferable.

As a structural unit represented by general formula (a1-0-2), those in which $Y^2$ is a group represented by the aforementioned formula -A-O—B— or -A-C(=O)—O—B— is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 27]

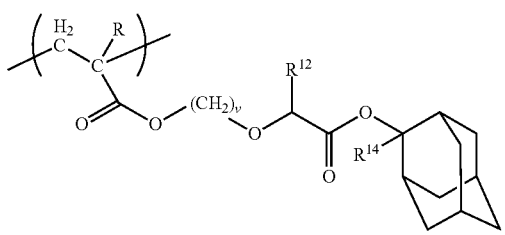

(a1-3-01)

In the formula, R and $R^{14}$ are the same as defined above; $R^{12}$ represents a hydrogen atom or a methyl group; and v represents an integer of 1 to 10.

[Chemical Formula 28]

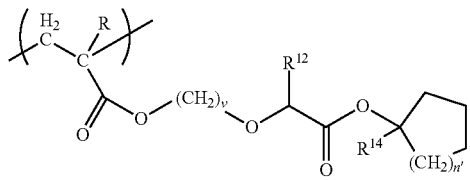

(a1-3-02)

In the formula, R and $R^{14}$ are the same as defined above; $R^{12}$ represents a hydrogen atom or a methyl group; v represents an integer of 1 to 10; and n' represents an integer of 0 to 3.

[Chemical Formula 29]

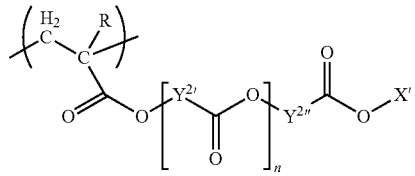

(a1-3-03)

In the formula, R is as defined above; each of $Y^{2'}$ and $Y^{2''}$ independently represents a divalent linking group; X' represents an acid dissociable, dissolution inhibiting group; and n represents an integer of 1 to 3.

In general formulas (a1-3-01) and (a1-3-02), $R^{12}$ is preferably a hydrogen atom.

v is preferably an integer of 1 to 8, more preferably 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

n represents an integer of 0 to 3, preferably an integer of 0 to 2, more preferably 0 or 1, and most preferably 1.

As the structural unit represented by general formula (a1-3-03), a structural unit represented by general formula (a1-3-03-1) or (a1-3-03-2) shown below is preferable. Among these, a structural unit represented by general formula (a1-3-03-1) is preferable, and a structural unit represented by the aforementioned formula (a1-3-29) or (a1-3-30) is particularly desirable.

[Chemical Formula 30]

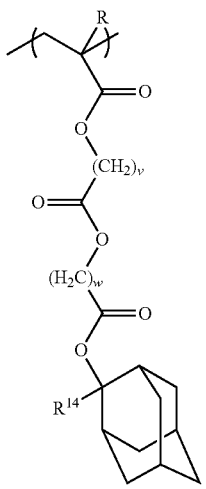

(a1-3-03-1)

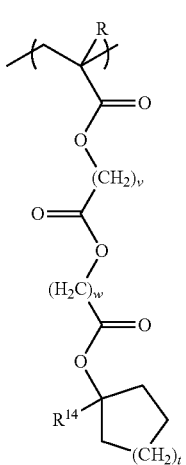

(a1-3-03-2)

In the formulas, R and $R^{14}$ are the same as defined above; v represents an integer of 1 to 10; w represents an integer of 1 to 10; and t represents an integer of 0 to 3.

v is preferably an integer of 1 to 5, and most preferably 1 or 2.

w is preferably an integer of 1 to 5, and most preferably 1 or 2.

t is preferably an integer of 1 to 3, and most preferably 1 or 2.

In the component (A1), the amount of the structural unit (a1) based on the combined total of all structural units constituting the component (A1) is preferably 10 to 80 mol %, more preferably 20 to 70 mol %, and still more preferably 25 to 65 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 31]

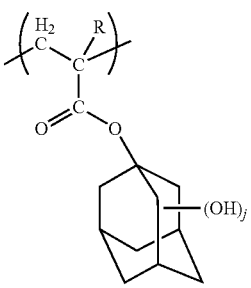

(a3-1)

-continued

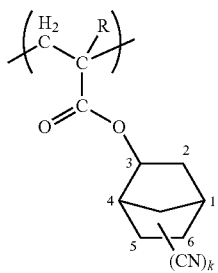

(a3-2)

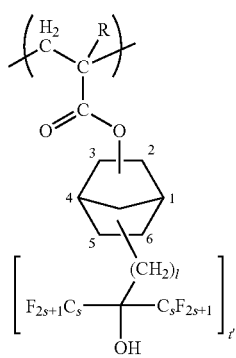

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3), one type of structural unit may be used, or two or more types may be used in combination.

The amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1) may also have a structural unit other than the above-mentioned structural units (a0), (a1) and (a3), as long as the effects of the present invention are not impaired.

As such a structural unit, any other structural unit which cannot be classified as one of the above structural units (a0), (a1) and (a3) can be used without any particular limitations, and any of the multitude of conventional structural units used within resist resins for ArF excimer lasers or KrF excimer lasers (and particularly for ArF excimer lasers) can be used.

Examples of other structural units include a structural unit (a2) is a structural unit derived from an acrylate ester containing a lactone-containing cyclic group, a structural unit (a4) derived from an acrylate ester containing a non-acid-dissociable aliphatic polycyclic group, and a structural unit (a5) represented by general formula (a5-1) which will be described later.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propiolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 32]

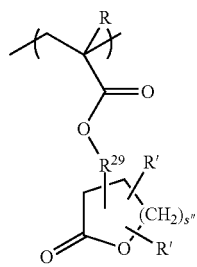

(a2-1)

-continued

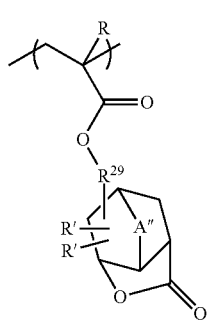 (a2-2)

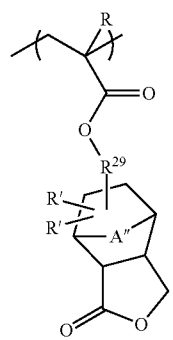 (a2-3)

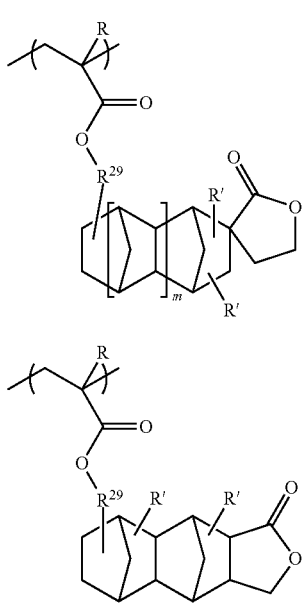

(a2-4)

(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

As examples of R', the same groups as those described above for $R^8$ in general formula (3-1) can be given. In terms of industrial availability, R' is preferably a hydrogen atom.

As examples of A", the same groups as those described above for A' in general formula (3-1) can be given.

$R^{29}$ represents a single bond or a divalent linking group. Examples of divalent linking groups include the same divalent linking groups as those described above for $R^{02}$ in general formula (a0-1). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for $R^{02}$.

s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.

[Chemical Formula 33]

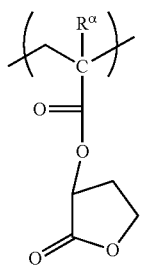 (a2-1-1)

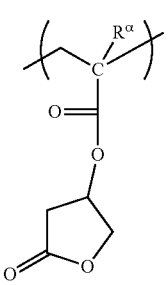 (a2-1-2)

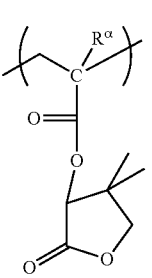 (a2-1-3)

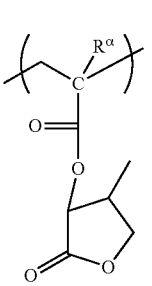 (a2-1-4)

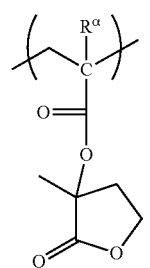 (a2-1-5)
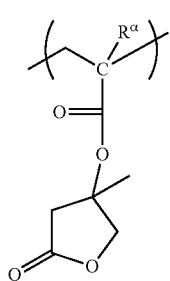 (a2-1-6)
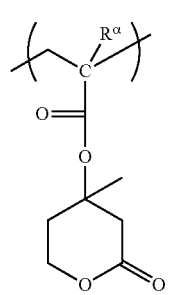 (a2-1-7)
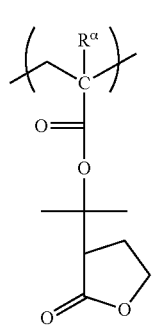 (a2-1-8)
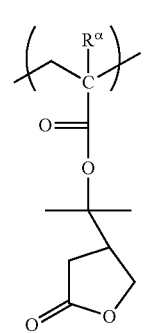 (a2-1-9)
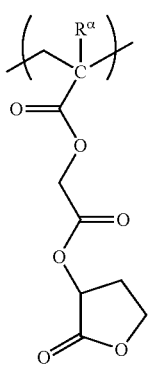 (a2-1-10)
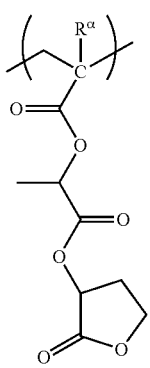 (a2-1-11)
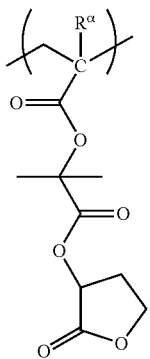 (a2-1-12)
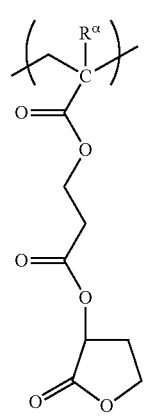 (a2-1-13)

[Chemical Formula 34]
(a2-2-1) 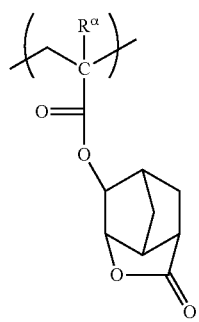
(a2-2-2) 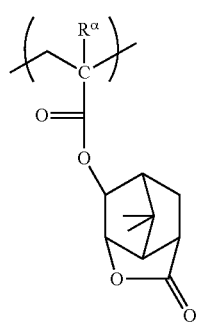
(a2-2-3) 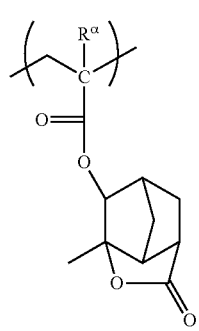
(a2-2-4) 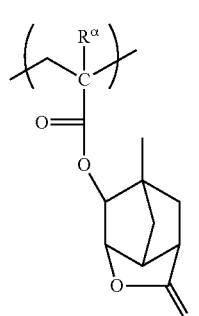
(a2-2-5) 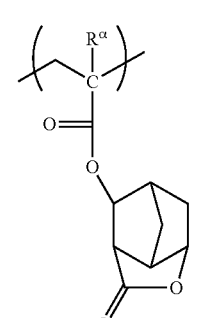
(a2-2-6) 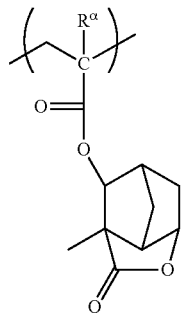
(a2-2-7) 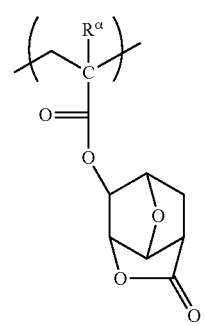
(a2-2-8) 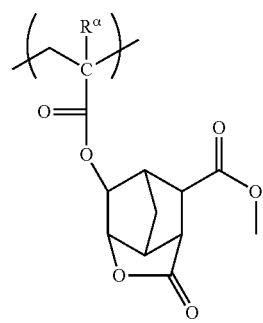
(a2-2-9) 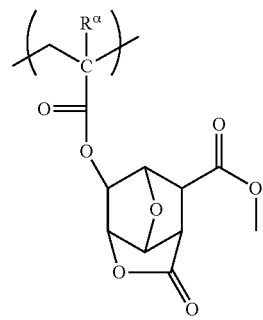
(a2-2-10) 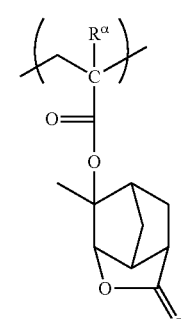

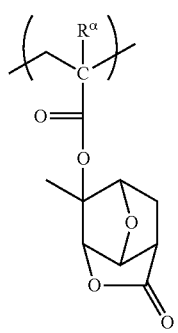 (a2-2-11)
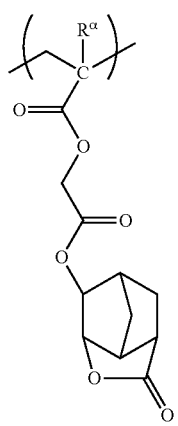 (a2-2-12)
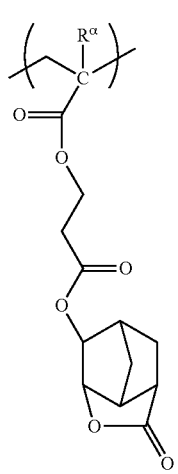 (a2-2-13)
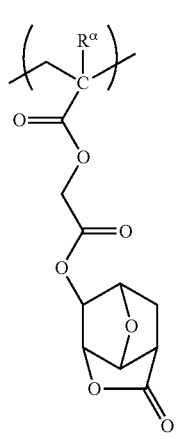 (a2-2-14)
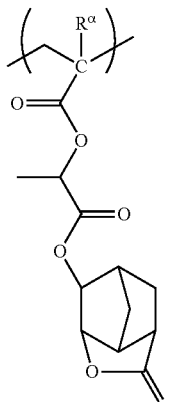 (a2-2-15)
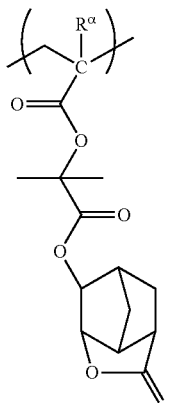 (a2-2-16)
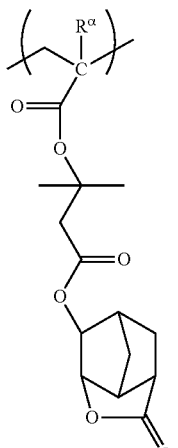 (a2-2-17)
[Chemical Formula 35]
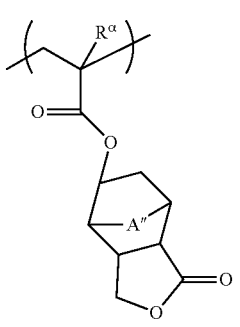 (a2-3-1)

-continued
(a2-3-2)
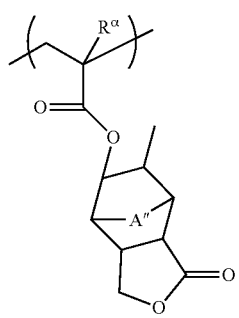
(a2-3-3)
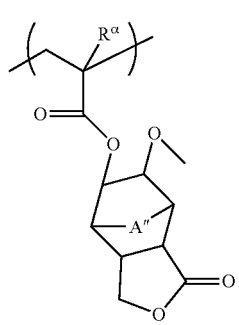
(a2-3-4)
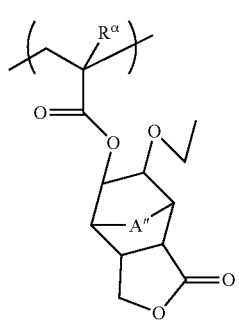
(a2-3-5)
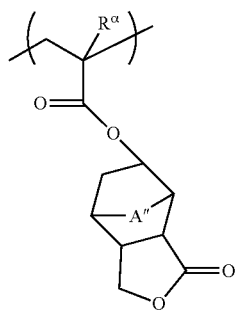
[Chemical Formula 36]
(a2-4-1)
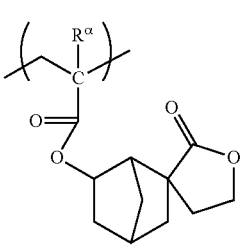
-continued
(a2-4-2)
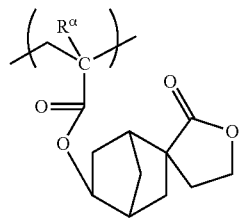
(a2-4-3)
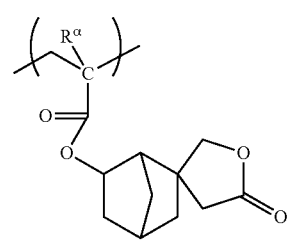
(a2-4-4)
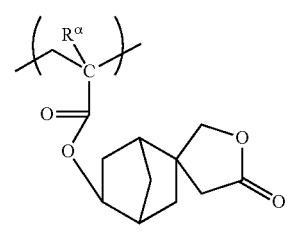
(a2-4-5)
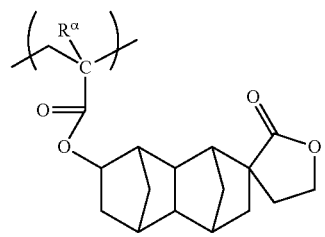
(a2-4-6)
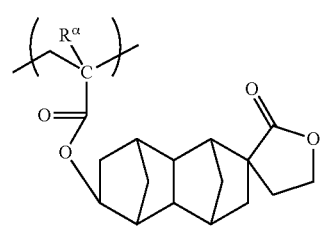
(a2-4-7)
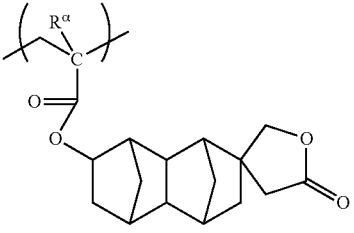
(a2-4-8)
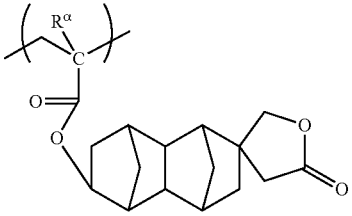

-continued
(a2-4-9)
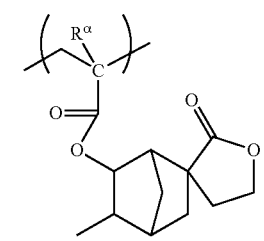
(a2-4-10)
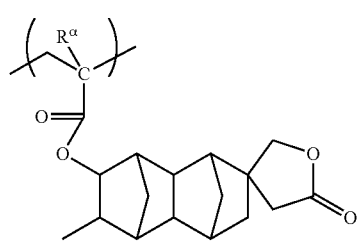
(a2-4-11)
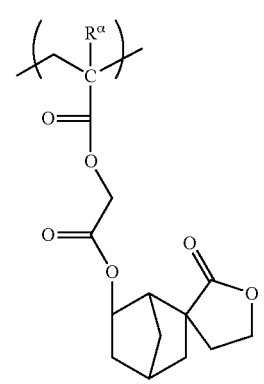
(a2-4-12)
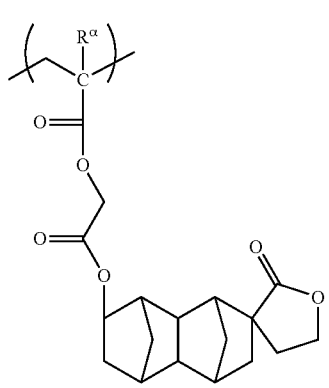
[Chemical Formula 37]
(a2-5-1)
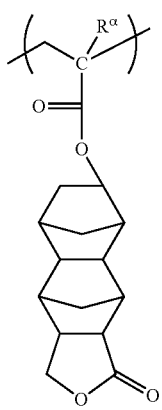
(a2-5-2)
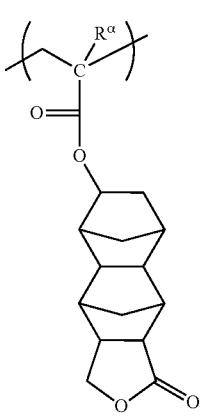
(a2-5-3)
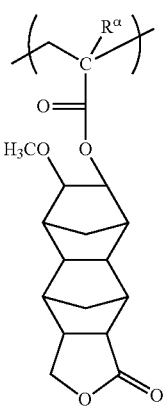
(a2-5-4)
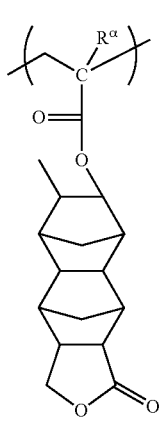

(a2-5-5)

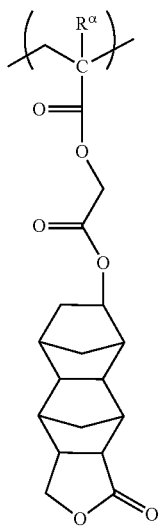

(a2-5-6)

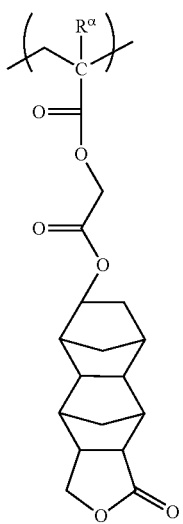

In the component (A1), as the structural unit (a2), one type of structural unit may be used, or two or more types may be used in combination.

In the present invention, it is particularly desirable that the component (A1) contain, as a structural unit (a2), at least one structural unit selected from the group consisting of a structural unit represented by general formula (a2-1) and a structural unit represented by general formula (a2-2).

In terms of improving the adhesion between a substrate and a resist film formed using a positive resist composition containing the component (A1) and increasing the compatibility with a developing solution, the amount of the structural unit (a2) within the component (A1), based on the combined total of all structural units constituting the component (A1) is preferably 1 to 50 mol %, more preferably 5 to 50 mol %, and still more preferably 10 to 45 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units. By ensuring the above-mentioned range, various lithography properties can be further improved.

Structural Unit (a4)

The structural unit (a4) is a structural unit derived from an acrylate ester containing a non-acid dissociable, aliphatic polycyclic group.

Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a-4-1) to (a-4-5) shown below.

[Chemical Formula 38]

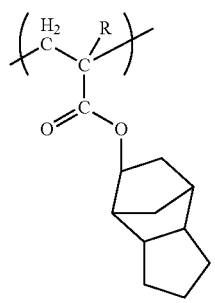

(a4-1)

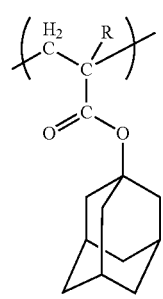

(a4-2)

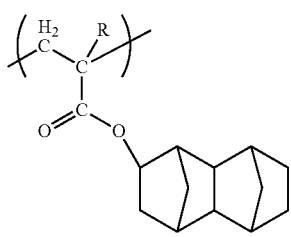

(a4-3)

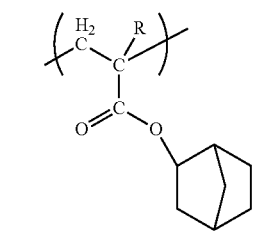

(a4-4)

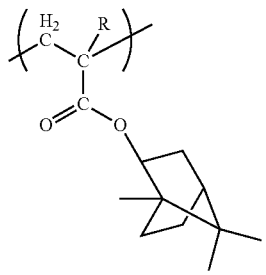

(a4-5)

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

Structural Unit (a5)

The structural unit (a5) is a structural unit represented by general formula (a5-1) shown below.

[Chemical Formula 39]

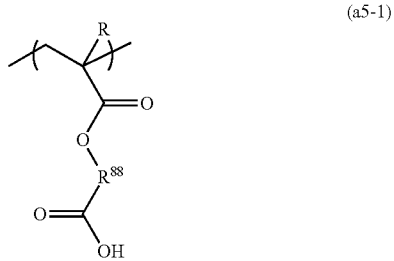

(a5-1)

In the formula, R represents a hydrogen atom, an alkyl group of 1 to 5 carbon atoms or a halogenated alkyl group of 1 to 5 carbon atoms; and $R^{88}$ represents a divalent aliphatic hydrocarbon group of 2 to 12 carbon atoms which may have an oxygen atom.

In general formula (a5-1), R is the same as defined above for R in the structural unit (a1).

In general formula (a5-1), $R^{88}$ represents a divalent aliphatic hydrocarbon group of 2 to 12 carbon atoms which may have an oxygen atom.

The divalent aliphatic hydrocarbon group of 2 to 12 carbon atoms represented by $R^{88}$ may or may not contain an oxygen atom.

The divalent aliphatic hydrocarbon group "has an oxygen atom" means that part or all of the hydrogen atoms within the divalent aliphatic hydrocarbon group and/or part of the carbon atoms within the divalent aliphatic hydrocarbon group is substituted with an oxygen atom.

A "divalent aliphatic hydrocarbon group" refers to a divalent hydrocarbon group that has no aromaticity.

The divalent aliphatic hydrocarbon group may be either saturated or unsaturated. In general, the divalent aliphatic hydrocarbon group is preferably saturated.

Further, the divalent aliphatic hydrocarbon group may be a divalent aliphatic hydrocarbon group having a substituent. The expression "has a substituent" means that part or all of the hydrogen atoms within the divalent aliphatic hydrocarbon group is substituted with groups or atoms other than hydrogen atom.

As specific examples of the divalent aliphatic hydrocarbon group, a linear or branched, divalent aliphatic hydrocarbon group, and a divalent aliphatic hydrocarbon group containing a ring in the structure thereof can be given.

The linear or branched, divalent aliphatic hydrocarbon group preferably has 2 to 10 carbon atoms, more preferably 2 to 8, and most preferably 3 to 6.

As a linear, divalent aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—] and a hexamethylene group [—CH$_2$)$_6$—].

As the branched, divalent aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched, divalent aliphatic hydrocarbon group (chain-like, divalent aliphatic hydrocarbon group) may or may not have a substituent. Examples of the substituent include a fluorine atom, a fluorinated alkyl group of 1 to 5 carbon atoms and an oxygen atom (═O). Among these, an oxygen atom (═O) is preferable.

As examples of the divalent hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like, divalent aliphatic hydrocarbon group or interposed within the aforementioned chain-like, divalent aliphatic hydrocarbon group, can be given.

The cyclic aliphatic hydrocarbon group preferably has 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantine, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

Examples of the divalent aliphatic hydrocarbon group containing an oxygen atom include groups in which —O—, —C(=O)—, —O—C(=O)—, —C(=O)—O—, a carbonate bond (—O—C(=O)—O—), —S(=O)$_2$—, —S(=O)$_2$—O— or —NH—C(=O)— is bonded to a terminal of the aforementioned chain-like, aliphatic hydrocarbon group, interposed within the aforementioned chain-like, aliphatic hydrocarbon group or substituting a carbon atom that constitutes part of the ring skeleton of the aforementioned cyclic aliphatic hydrocarbon group.

In the present invention, as the divalent aliphatic hydrocarbon group of 2 to 12 carbon atoms represented by $R^{88}$ which may contain an oxygen atom, an alkylene group or a divalent aliphatic hydrocarbon group containing an oxygen atom is preferable. Among these, a divalent aliphatic hydrocarbon group containing an oxygen atom is particularly desirable.

When $R^{88}$ represents an alkylene group, the alkylene group preferably has 2 to 10 carbon atoms, and most preferably 2 to 6 carbon atoms. Specific examples of alkylene groups include the aforementioned linear alkylene groups and branched alkylene groups.

Preferable examples of the divalent aliphatic hydrocarbon group represented by $R^{88}$ that contains an oxygen atom include a group represented by the formula -A-O—, a group represented by the formula -A-O—B—, a group represented by the formula -[A-C(=O)—O]$_m$—B— and a group represented by the formula -[A-O—C(=O)]$_m$—B—. Among these, a group represented by the formula -[A-O—C(=O)]$_m$—B— is particularly desirable. In the formulas, each of A and B independently represents a divalent aliphatic hydrocarbon group, and m represents an integer of 1 to 3.

As the divalent aliphatic hydrocarbon group for A and B, the same divalent aliphatic hydrocarbon groups as those described above for $R^{88}$ can be mentioned.

As A, a linear or branched, divalent aliphatic hydrocarbon group is preferable, a linear or branched alkylene group is preferable, a linear or branched alkylene group of 2 to 6 carbon atoms is still more preferable, an ethylene group or an alkylethylene group is still more preferable, and an ethylene group is most preferable.

The alkyl group within the alkylethylene group is preferably a linear alkyl group of 1 to 5 carbon atoms, more preferably a linear alkyl group of 1 to 3 carbon atoms, and most preferably a methyl group.

As B, a linear or branched, divalent aliphatic hydrocarbon group is preferable, a linear or branched alkylene group is preferable, a linear or branched alkylene group of 2 to 6 carbon atoms is still more preferable, an ethylene group or an alkylethylene group is still more preferable, and an ethylene group is most preferable.

The alkyl group within the alkylethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_m$—B—, m represents an integer of 1 to 3, preferably 1 or 2, and most preferably 1.

In the present invention, as the structural unit (a5), a structural unit represented by general formula (a5-1-11) shown below is particularly desirable.

[Chemical Formula 40]

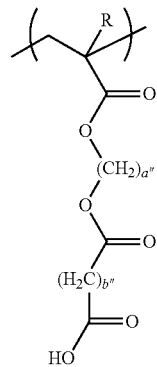

(a5-1-11)

In the formula, each of a" and b" independently represents an integer of 1 to 3.

In general formula (a5-1-11), a" represents an integer of 1 to 3, preferably 2.

In general formula (a5-1-11), b" represents an integer of 1 to 3, and preferably 2.

As the structural unit (a5), one type of structural unit may be used alone, or two or more types of structural units may be used in combination.

In terms of achieving excellent properties with respect to the shape of a formed resist pattern, line width roughness (LWR), compatibility with the substrate and the like in the formation of a resist pattern using a positive resist composition containing the component (A1), the amount of the structural unit (a5) within the component (A1), based on the combined total of all structural units constituting the component (A1) is preferably 1 mol % or more, more preferably 5 to 35 mol %, still more preferably 5 to 30 mol %, and most preferably 5 to 25 mol %.

The component (A1) is a polymeric compound including the structural unit (a1). Examples of the component (A1) include a polymer consisting of the structural unit (a1);

a copolymer consisting of the structural units (a1) and (a3);

a copolymer consisting of the structural units (a1), (a3) and (a5);

a copolymer consisting of the structural units (a1), (a2) and (a3);

a copolymer consisting of the structural units (a0), (a1), (a2) and (a3);

a copolymer consisting of the structural units (a0), (a1), (a2) and (a5);

a copolymer consisting of the structural units (a0), (a1), (a3) and (a5); and a copolymer consisting of the structural units (a0), (a1), (a2), (a3) and (a5).

In the present invention, as the component (A1), a copolymer that includes a combination of structural units such as that shown below (polymeric compounds (A1-1) to (A1-3)) is particularly desirable.

[Chemical Formula 41]

Polymeric compound (A1-1)

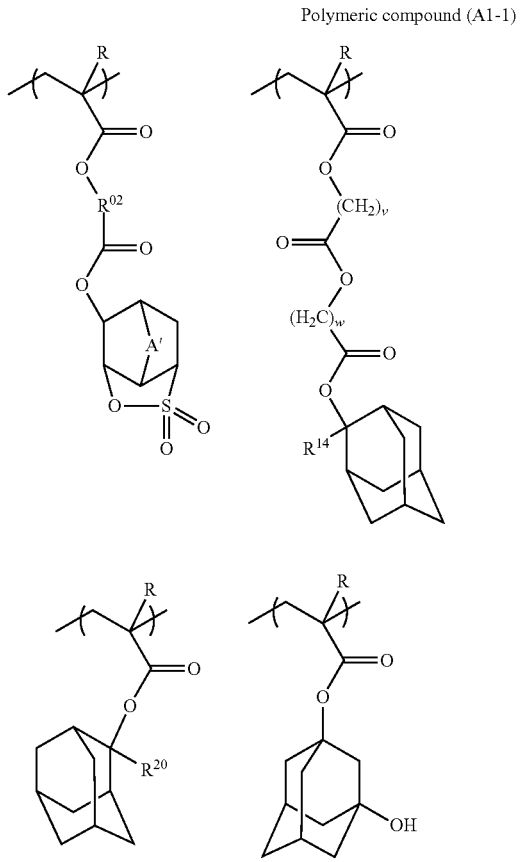

In the formula, R, $R^{02}$, A', $R^{14}$, v and w are the same as defined above, wherein the plurality of R may be the same or different from each other; and $R^{20}$ represents an alkyl group, and examples thereof include the same alkyl groups as those described above for $R^{14}$.

[Chemical Formula 42]

Polymeric compound (A1-2)

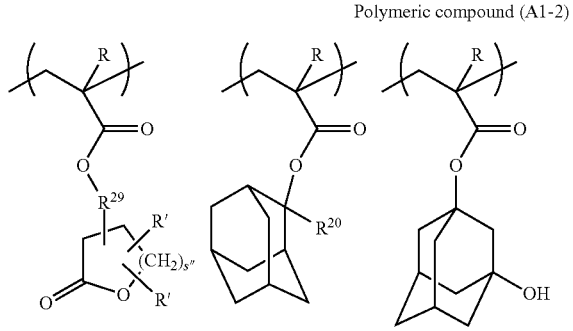

In the formula, R, A', $R^{14}$, v and w are the same as defined above, wherein the plurality of R may be the same or different from each other; $R^{20}$ represents an alkyl group, and examples thereof include the same alkyl groups as those described above for $R^{14}$; $R^{29}$ represents a single bond or a divalent linking group; and s" represents an integer of 0 to 2.

[Chemical Formula 43]

Polymeric compound (A1-3)

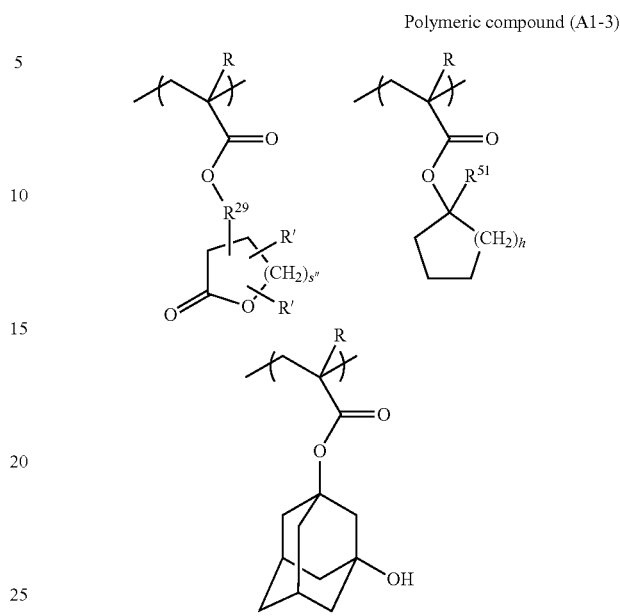

In the formula, R and $R^{51}$ are the same as defined above, wherein the plurality of R may be the same or different from each other; $R^{29}$ represents a single bond or a divalent linking group; s" represents an integer of 0 to 2; and h represents an integer of 1 to 6.

In the aforementioned chemical formulas representing the polymeric compounds (A1-1) to (A1-3), as the alkyl group for $R^{20}$, the same alkyl groups as those described above for $R^{14}$ can be mentioned, and is preferably a linear or branched alkyl group. As the linear alkyl group, a methyl group or an ethyl group is preferable. As the branched alkyl group, an isopropyl group is particularly desirable.

In the chemical formulas, the alkyl group for $R^{51}$ is the same as defined for the alkyl group of 1 to 5 carbon atoms represented by R, preferably a methyl group or an ethyl group, and most preferably a methyl group.

In the chemical formulas, A' is the same as defined for A' in general formula (a0-1-11), and is preferably an oxygen atom, a methylene group or an ethylene group.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,500 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved. Further, the solubility of the base component (A) in an organic solvent can be improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

For example, as a monomer for deriving the structural unit (a0), a compound represented by general formula (a0-1-0) shown below (hereafter, referred to as "compound (a0-1-0)") can be used.

[Chemical Formula 44]

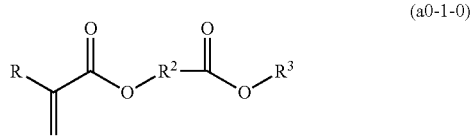

(a0-1-0)

In general formula (a0-1-0), R, $R^2$ and $R^3$ are the same as defined above.

The method for producing the compound (a0-1-0) is not particularly limited, and the compound (a0-1-0) can be produced by a conventional method.

For example, in the presence of a base, a compound (X-2) represented by general formula (X-2) shown below is added to a solution obtained by dissolving a compound (X-1) represented by general formula (X-1) shown below in a reaction solvent, and a reaction is effected to thereby obtain a compound (a0-1-0).

Examples of the base include inorganic bases such as sodium hydride, $K_2CO_3$ and $Cs_2CO_3$; and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

[Chemical Formula 45]

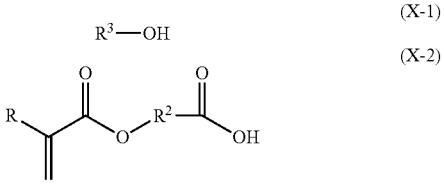

(X-1)

(X-2)

[Component (A2)]

In the positive resist composition of the present invention, the component (A) may contain "a base component which exhibits increased solubility in an alkali developing solution under action of acid" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a4) can be used. Further, the component (A2) may contain a non-polymer (low molecular weight compound) having a molecular weight of 500 to less than 4,000.

(Low-Molecular Weight Compound)

In the positive resist composition of the present invention, as the low-molecular weight compound, it is preferable to use a compound that has a molecular weight of at least 500 and less than 2,000, contains a hydrophilic group, and also contains an acid dissociable, dissolution inhibiting group described above in connection with the structural unit (a1). Specific examples include compounds containing a plurality of phenol skeletons in which a part of the hydrogen atoms within hydroxyl groups have been substituted with the aforementioned acid dissociable, dissolution inhibiting groups.

Examples of the low-molecular weight compound include low molecular weight phenolic compounds in which a portion of the hydroxyl group hydrogen atoms have been substituted with an aforementioned acid dissociable, dissolution inhibiting group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenol compound is not limited to these examples.

Also, there are no particular limitations on the acid dissociable, dissolution inhibiting group, and suitable examples include the groups described above.

As the component (A2), one type of resin may be used, or two or more types of resins may be used in combination.

In the positive resist composition of the present invention, as the component (A), one type may be used, or two or more types of compounds may be used in combination.

In the positive resist composition of the present invention, the amount of the component (A) can be appropriately adjusted depending on the thickness of the resist film to be formed, and the like.

<Component (B)>

In the present invention, as the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 46]

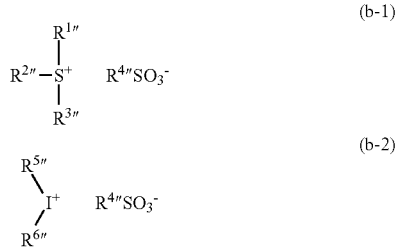

In the formulas above, $R^{1''}$ to $R^{3''}$, $R^{5''}$ and $R^{6''}$ each independently represent an aryl group or alkyl group, wherein two of $R^{1''}$ to $R^{3''}$ may be bonded to each other to form a ring with the sulfur atom; and $R^{4''}$ represents an alkyl group, a halogenated alkyl group, an aryl group or an alkenyl group which may have a substituent, with the provision that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. In formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

Further, at least one of $R^{1''}$ to $R^{3''}$ may be an aryl group having a substituent represented by general formula (b1-0) shown below.

[Chemical Formula 47]

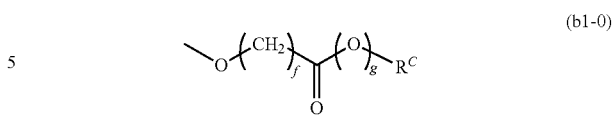

(b1-0)

In general formula (b1-0), $R^C$ represents a chain-like or cyclic hydrocarbon group; f represents 0 or 1; and g represents 0 or 1.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

In general formula (b1-0), $R^C$ represents a chain-like or cyclic hydrocarbon group.

With respect to $R^C$, the hydrocarbon group may be either an aromatic hydrocarbon group or an aliphatic hydrocarbon group.

Examples of the aliphatic hydrocarbon group for $R^C$ include a linear, branched or cyclic, saturated hydrocarbon group of 1 to 15 carbon atoms and a linear, branched or cyclic, unsaturated hydrocarbon group of 2 to 5 carbon atoms.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, a 4-methylpentyl group and a tert-butyl group.

The linear or branched, saturated hydrocarbon group may have a substituent. Examples of the substituent include an alkoxy group, a halogen atom, a hydroxyl group, an oxygen atom (=O), a cyano group and a carboxy group.

The alkoxy group as the substituent for the linear or branched, saturated alkyl group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated alkyl group include a fluorine atom, a chlorine atom, a bromine atom and an iodine atom, and a fluorine atom is preferable.

The cyclic, saturated hydrocarbon group may be either a polycyclic group or a monocyclic group. Examples thereof include cyclic, saturated hydrocarbon groups of 3 to 20 carbon atoms, such as groups in which one hydrogen atom has been removed from a monocycloalkane or a polycycloalkane such as a bicycloalkane, a tricycloalkane or a tetracycloalkane. More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. As the cyclic, saturated group having a substituent, for example, part of the carbon atoms constituting the ring within the cyclic, saturated hydrocarbon group may be substituted with a hetero atom (former example), or a hydrogen atom bonded to the ring within the cyclic, saturated hydrocarbon group may be substituted with a substituent (latter example).

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(=O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched, saturated hydrocarbon group, or an alkyl group can be used. The alkyl group as the substituent is preferably an alkyl group of 1 to 5 carbon atoms, and more preferably a methyl group or an ethyl group. The carbon atom which constitutes the ring and has the alkyl group bonded thereto is preferably bonded to the terminal of —C(O)—(O)g- within the substituent represented by general formula (b1-0).

Examples of the linear, unsaturated hydrocarbon group for $R^C$ include a vinyl group, a propenyl group (an allyl group) and a butynyl group.

Examples of branched unsaturated hydrocarbon groups include a 1-methylpropenyl group and a 2-methylpropenyl group.

The aforementioned linear or branched, unsaturated hydrocarbon group may have a substituent. Examples of substituents include the same substituents as those which the aforementioned linear or branched, saturated hydrocarbon group may have.

The aromatic hydrocarbon group for $R^C$ may be either a group including an aromatic hydrocarbon ring in which the ring skeleton of the aromatic ring is constituted of only carbon atoms, or a group including an aromatic hetero ring in which the ring skeleton of the aromatic ring contains not only carbon atoms but also a hetero atom.

Specific examples include an aryl group in which one hydrogen atom has been removed from an aromatic hydrocarbon ring, such as a phenyl group, a biphenyl group, a fluorenyl group, a naphthyl group, an anthryl group or a phenanthryl group; a heteroaryl group in which part of the carbon atoms constituting the ring of the aforementioned aryl group has been substituted with a hetero atom such as an oxygen atom, a sulfur atom or a nitrogen atom; and an arylalkyl group, such as a benzyl group, a phenethyl group, a 1-naphthylmethyl group, a 2-naphthylmethyl group, a 1-naphthylethyl group or a 2-naphthylethyl group. The alkyl chain within the arylalkyl group preferably has 1 to 4 carbon atom, more preferably 1 or 2, and most preferably 1.

The aromatic hydrocarbon group may have a substituent. As the aromatic hydrocarbon group having a substituent, for example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the ring of the aforementioned arylalkyl group has been substituted with the aforementioned heteroatom can be used.

In the latter example, as the substituent for the cyclic alkyl group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and more preferably a methyl group, an ethyl group, a propyl group, an n-butyl group or a tert-butyl group.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

Among the aforementioned examples, as $R^C$, a cyclic hydrocarbon group is preferable, a cyclic aliphatic hydrocarbon is more preferable, and a group in which one hydrogen atom has been removed from adamantane, a group in which one hydrogen atom has been removed from cyclopentane, or a group in which one hydrogen atom has been removed from cyclohexane is particularly desirable.

It is also preferable that $R^C$ represent a linear or branched, saturated hydrocarbon group which may have a substituent, and a fluorinated alkyl group is particularly desirable.

In general formula (b1-0), f represents 0 or 1.
In general formula (b1-0), g represents 0 or 1.

The alkyl group for $R^{1\prime\prime\prime}$ to $R^{3\prime\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1\prime\prime\prime}$ to $R^{3\prime\prime\prime}$ in formula (b-1) are bonded to each other to form a ring with the sulfur atom, it is preferable that the two of $R^{1\prime\prime\prime}$ to $R^{3\prime\prime\prime}$ form a 3 to 10-membered ring including the sulfur atom, and it is particularly desirable that the two of R$^1$" to R$^3$" form a 5 to 7-membered ring including the sulfur atom.

When two of R$^1$" to R$^3$" in formula (b-1) are bonded to each other to form a ring with the sulfur atom, the remaining one of R$^1$" to R$^3$" is preferably an aryl group. As examples of the aryl group, the same as the above-mentioned aryl groups for R$^1$" to R$^3$" can be given.

Specific examples of preferable cation moieties for the compound represented by general formula (b-1) are shown below. Among the examples, those which have a triphenyl-methane skeleton are preferable.

In formulas (I-1-7) and (I-1-8), each of R$^9$ and R$^{10}$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 48]

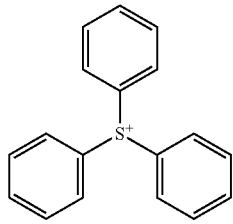

(I-1-1)

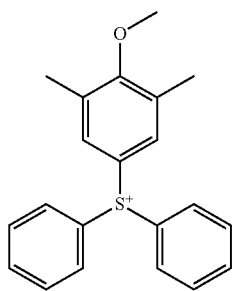

(I-1-2)

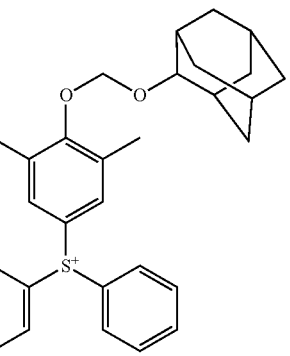

(I-1-3)

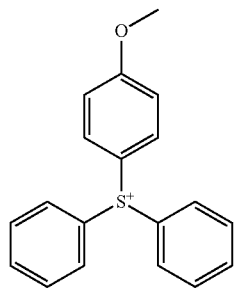

(I-1-4)

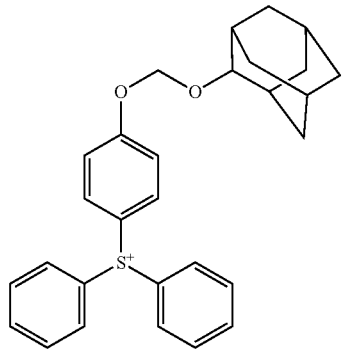

(I-1-5)

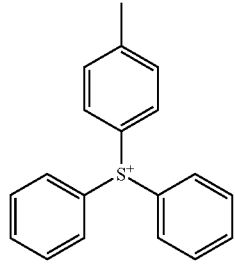

(I-1-6)

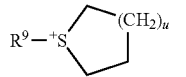

(I-1-7)

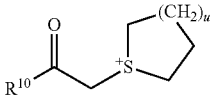

(I-1-8)

[Chemical Formula 49]

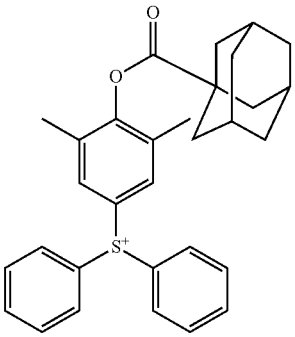

(I-1-11)

(I-1-12)
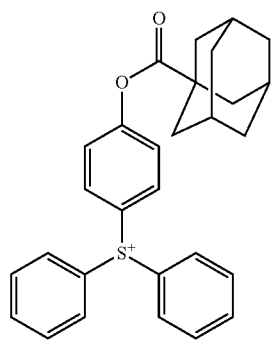
(I-1-13)
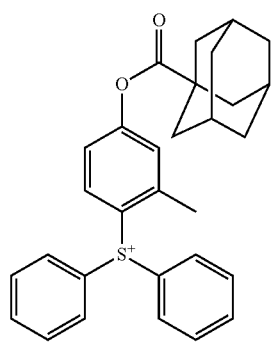
(I-1-14)
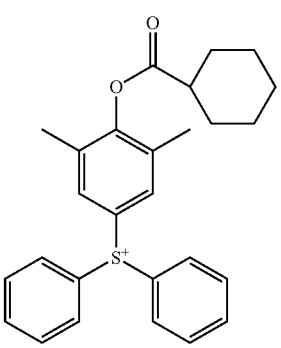
(I-1-15)
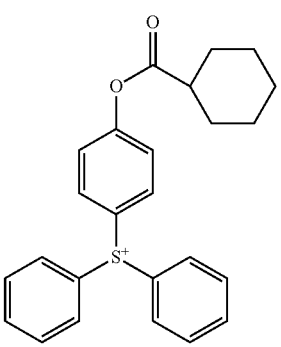
(I-1-16)
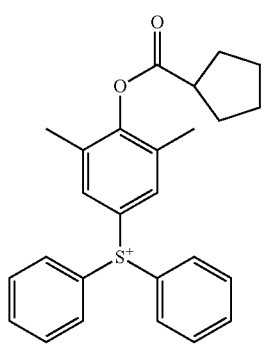
(I-1-17)
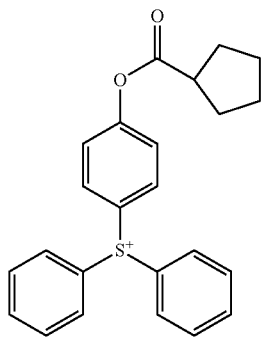
[Chemical Formula 50]
(I-1-21)
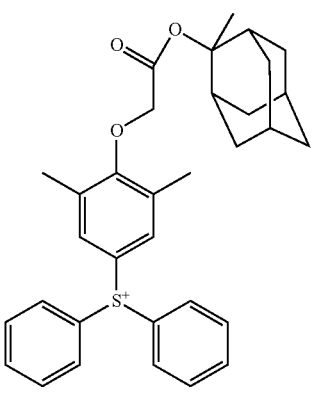
(I-1-22)
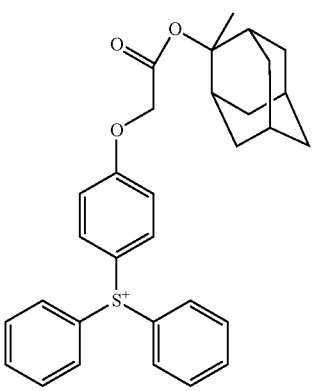

(I-1-23) 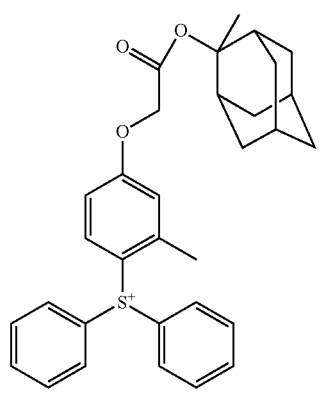
(I-1-24) 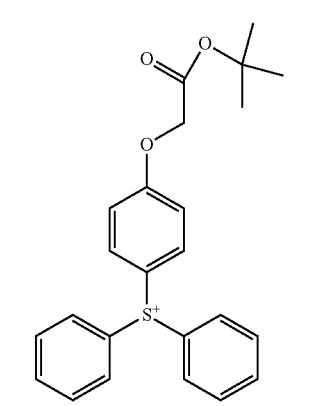
(I-1-25) 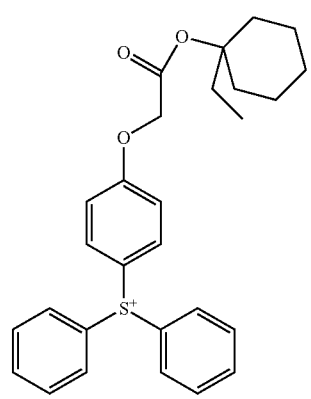
(I-1-26) 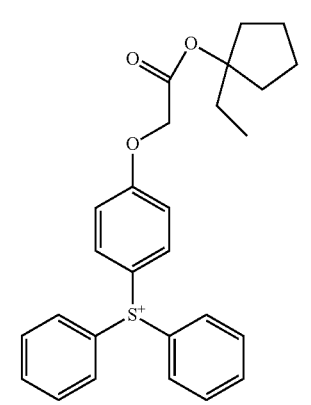
(I-1-27) 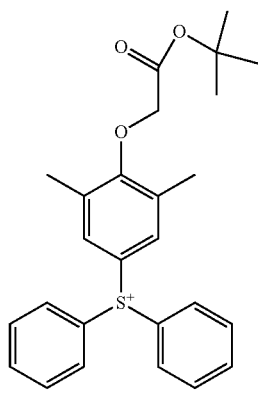
(I-1-28) 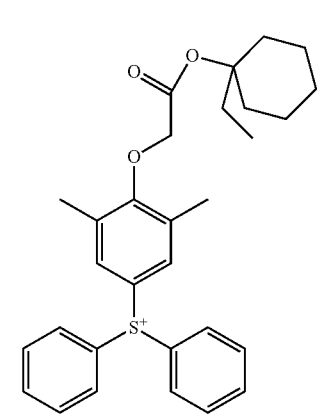
(I-1-29) 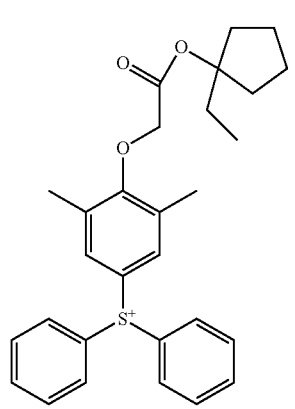
[Chemical Formula 51]
(I-1-31) 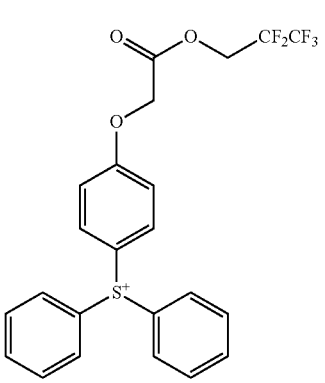

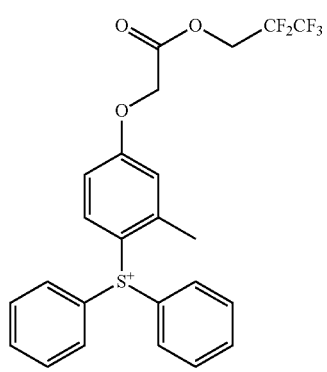
(I-1-32)

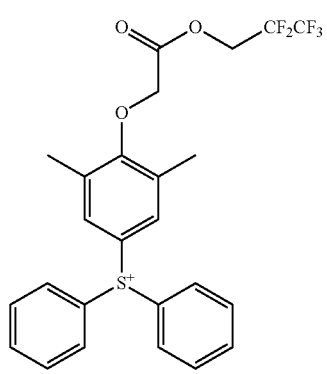
(I-1-33)

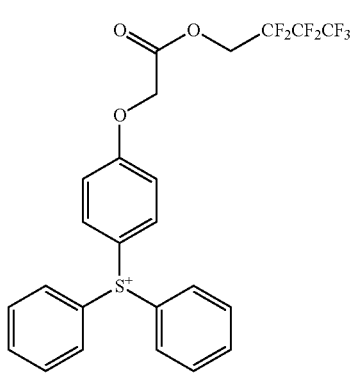
(I-1-34)

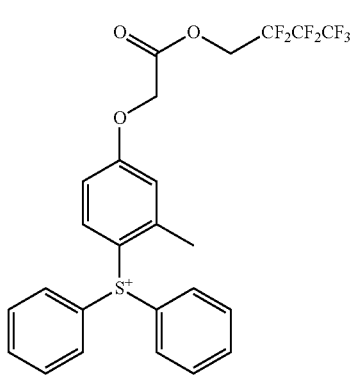
(I-1-35)

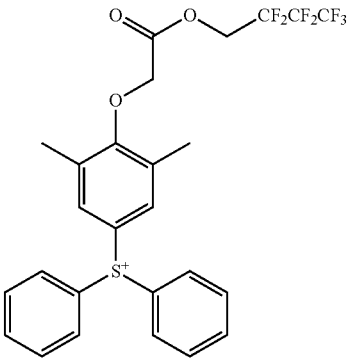
(I-1-36)

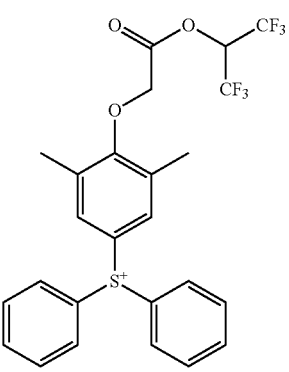
(I-1-37)

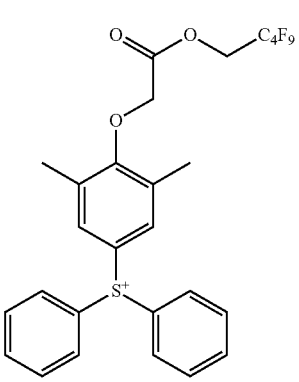
(I-1-38)

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X-Q^2-$ (in the formula, $Q^2$ represents a divalent linking group containing an oxygen atom; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X-Q^2-$, $Q^2$ represents a divalent linking group containing an oxygen atom.

$Q^2$ may contain an atom other than an oxygen atom. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

As $Q^2$, a divalent linking group containing an ester bond or an ether bond is preferable, and —$R^{91}$—O—, —$R^{92}$—O—C(=O)— or —C(=O)—O—$R^{93}$—O—C(=O)— is more preferable.

In the group represented by the formula $X-Q^2-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 52]

(L1)

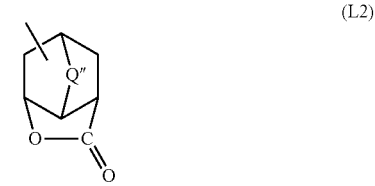

(L2)

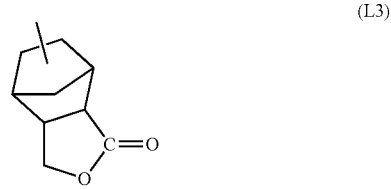

(L3)

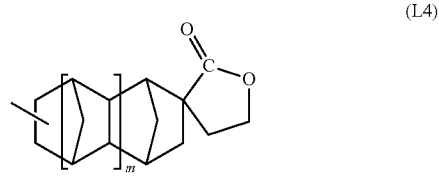

(L4)

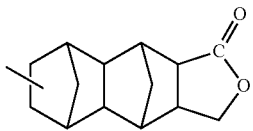
(L5)

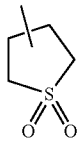
(S1)

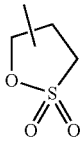
(S2)

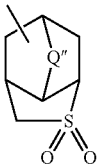
(S3)

(S4)

In the formula, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents 0 or 1.

As the alkylene group for Q", $R^{94}$ and $R^{95}$, the same alkylene groups as those described above for $R^{91}$ to $R^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

Among the examples described above, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the aforementioned formulas (L2) to (L5), (S3) and (S4) are preferable.

Further, in the present invention, X preferably has a structure similar to that of the $R^{o3}$ group within the structural unit (a0) for the component (A1), and a group having a polar portion is particularly desirable, because it results in improved lithographic properties and resist pattern shape.

Specific examples of X having a polar moiety include those in which a part of the carbon atoms constituting the aliphatic hydrocarbon group for X is substituted with a substituent group containing a hetero atom such as —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—.

In the present invention, $R^{4"}$ preferably has X-$Q^2$- as a substituent. In this case, $R^{4"}$ is preferably a group represented by formula X-$Q^2$-$Y^3$— [wherein $Q^2$ and X are the same as defined above; and $Y^3$ represents an alkylene group of 1 to 4 carbon atoms which may have a substituent, or a fluorinated alkylene group of 1 to 4 carbon atoms which may have a substituent].

In the group represented by the formula X-$Q^2$-$Y^3$—, as the alkylene group for $Y^3$, the same alkylene group as those described above for $Q^2$ in which the number of carbon atoms is 1 to 4 can be used.

As the fluorinated alkylene group for $Y^3$, the aforementioned alkylene group in which part or all of the hydrogen atoms has been substituted with fluorine atoms can be used.

Specific examples of $Y^3$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^3$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5'''}$ and $R^{6'''}$ each independently represent an aryl group or alkyl group. At least one of $R^{5'''}$ and $R^{6'''}$ represents an aryl group. It is preferable that both of $R^{5'''}$ and $R^{6'''}$ represent an aryl group.

As the aryl group for $R^{5'''}$ and $R^{6'''}$, the same as the aryl groups for $R^{1'''}$ to $R^{3'''}$ can be used.

As the alkyl group for $R^{5'''}$ and $R^{6'''}$, the same as the alkyl groups for $R^{1'''}$ to $R^{3'''}$ can be used.

It is particularly desirable that both of $R^{5'''}$ and $R^{6'''}$ represents a phenyl group.

As $R^{4'''}$ in formula (b-2), the same groups as those mentioned above for $R^{4'''}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by an alkylsulfonate such as methanesulfonate, n-propanesulfonate, n-butanesulfonate, or n-octanesulfonate.

Further, onium salts in which the anion moiety of these onium salts is replaced by an anion moiety represented by the chemical formula shown below which contains an alicyclic group can also be used.

Furthermore, onium salts in which the anion moiety of these onium salts is replaced by an anion moiety represented by any one of formulas (b1) to (b8) shown below can also be used.

[Chemical Formula 53]

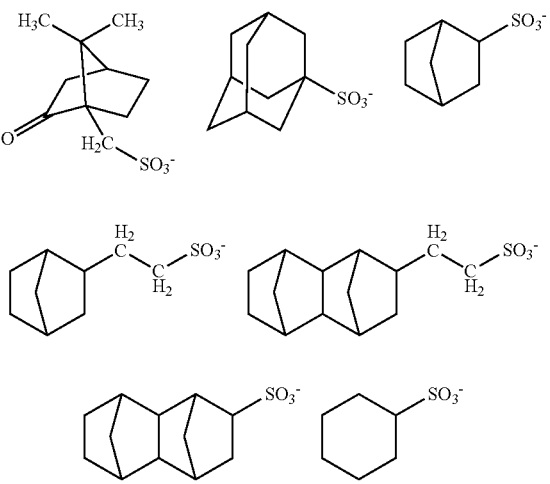

[Chemical Formula 54]

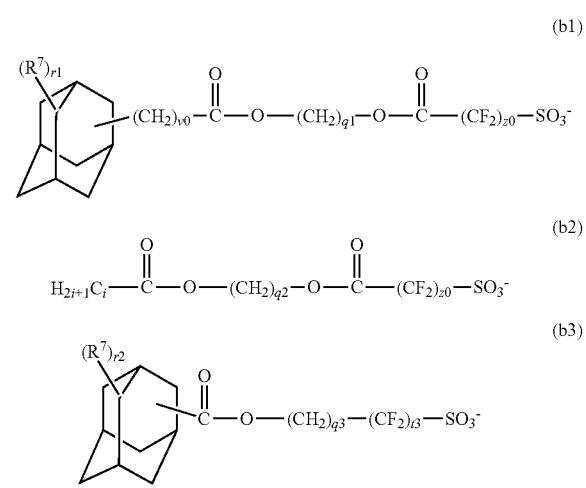

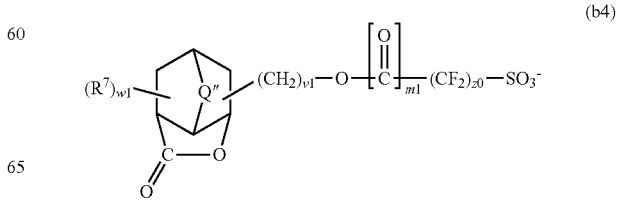

-continued (b5)
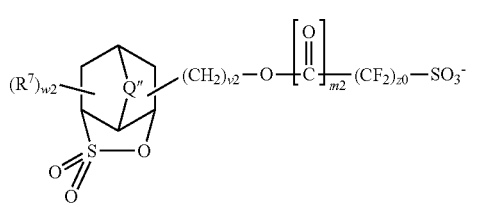

(b6)
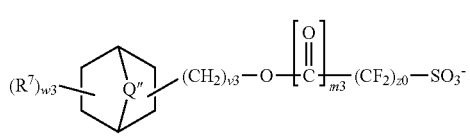

(b7)
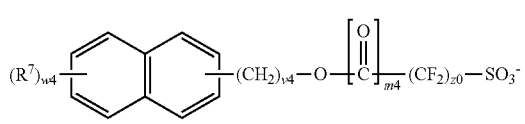

(b8)
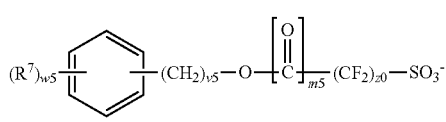

In the formulas, z0 represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; i represents an integer of 1 to 20; $R^7$ represents a substituent; each of m1 to m5 independently represents 0 or 1; each of v0 to v5 independently represents an integer of 0 to 3; each of w1 to w5 independently represents an integer of 0 to 3; and Q" is the same as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1, r2, and w1 to w5, then the two or more of the $R^7$ groups may be the same or different from each other.

Further, onium salt-based acid generators in which the anion moiety in general formula (b-1) or (b-2) is replaced by an anion represented by general formula (b-3) or (b-4) shown below (the cation moiety is the same as (b-1) or (b-2)) may be used.

[Chemical Formula 55]

(b-3)
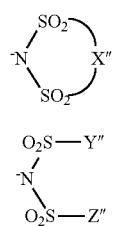

(b-4)

O₂S—Y"
\
N
/
O₂S—Z"

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 56]

(b-5)
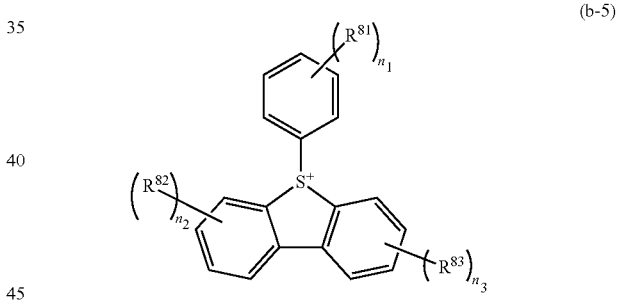

(b-6)
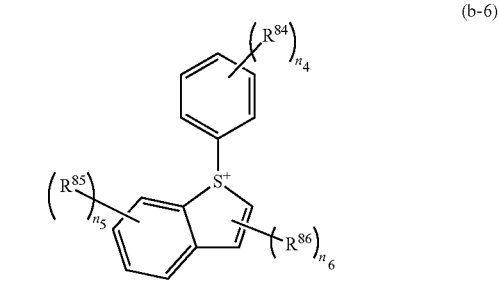

In formulas (b-5) and (b-6) above, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{81}$ to $R^{86}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$, then the two or more of the individual $R^{81}$ to $R^{86}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b-1) or (b-2) shown above; and anion moieties represented by general formula (b-3) or (b-4) shown above.

In the present description, an oximesulfonate acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 57]

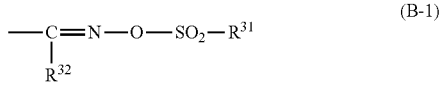

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 58]

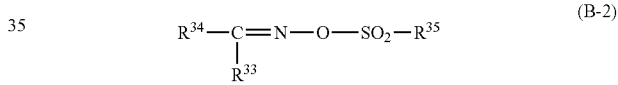

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 59]

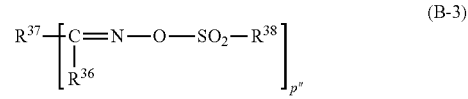

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated allyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxylinino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 60]

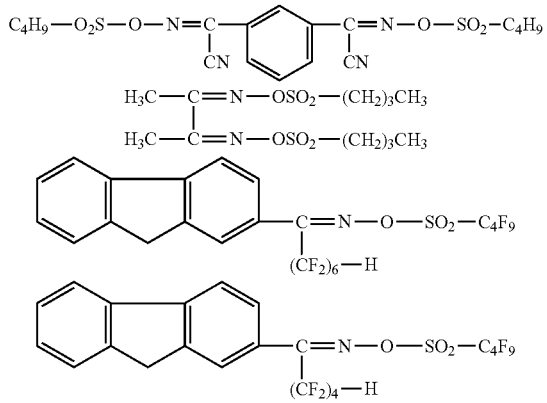

Of the aforementioned diazomethane acid generators, specific examples of suitable bisalkyl or bisaryl sulfonyl diazomethanes include bis(isopropylsulfonyl)diazomethane, bis (p-toluenesulfonyl)diazomethane, bis(1,1-dimethylethylsulfonyl)diazomethane, bis (cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis (phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis (cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the present invention, as the component (B), it is preferable to use an onium salt having a fluorinated alkylsulfonic acid ion as the anion moiety.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Component (F)> [Structural Unit (f1)]

In the component (F), the structural unit (f1) has an "alkali developing solution decomposable group" that is decomposable by an alkali developing solution. An "alkali developing solution decomposable group" refers to a group which is dissociated due to hydrolysis caused by the action of an alkali developing solution generally used in the fields of lithography (e.g., a 2.38% by weight aqueous solution of tetramethylammonium hydroxide (TMAH) at 23° C.).

The alkali developing solution decomposable group is dissociated due to hydrolysis caused by the action of an alkali developing solution. Therefore, a hydrophilic group is formed when the alkali developing solution decomposable group is dissociated and the hydrophilicity of the component (F) is enhanced. As a result, the compatibility of the component (F) with the alkali developing solution is improved.

The alkali developing solution decomposable group is not particularly limited as long as it is an organic group that falls under the definition described above, and the alkali developing solution decomposable group may or may not contain a fluorine atom. In the structural unit (f1), when no fluorine atom is contained in portions other than the alkali developing solution decomposable group, it is necessary that the alkali developing solution decomposable group contain a fluorine atom. On the other hand, when a fluorine atom is contained in a portion other than the alkali developing solution decomposable group, the alkali developing solution decomposable group may or may not contain a fluorine atom.

An alkali developing solution decomposable group containing a fluorine atom refers to an alkali developing solution decomposable group in which part or all of the hydrogen atoms have been substituted with a fluorine atom.

In the structural unit (f1), it is preferable that the alkali developing solution decomposable group contains a fluorine atom. It is particularly desirable that the fluorine atom contained in the structural unit (f1) is present only in the alkali developing solution decomposable group. If the alkali developing solution decomposable group contains a fluorine atom, since the fluorine atom contained in the alkali developing solution decomposable group is also dissociated from the structural unit (f1) when the alkali developing solution decomposable group is dissociated by the action of an alkali developing solution, the affinity for the alkali developing solution is enhanced.

Specific examples of alkali developing solution decomposable groups containing a fluorine atom include those represented by general formulas (II-1) to (II-4) shown below. In the present invention, the alkali developing solution decomposable group is preferably at least one alkali developing solution decomposable group selected from those represented by general formulas (II-1) to (II-4) shown below. In terms of the effects of the present invention and ease in synthesis, a group represented by general formula (II-1) or (II-4) shown below is particularly desirable.

[Chemical Formula 61]

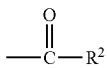
(II-1)

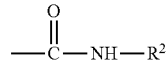
(II-2)

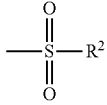
(II-3)

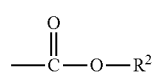
(II-4)

In the formulas, each $R^2$ independently represents an organic group which may have a fluorine atom.

In general formulas (II-1) to (II-4), $R^2$ represents an organic group which may have a fluorine atom. An "organic group" is a group containing at least one carbon atom.

The structure of $R^2$ may be linear, branched or cyclic, and is preferably linear or branched.

In $R^2$, the organic group preferably has 1 to 20 carbon atoms, more preferably 1 to 15 carbon atoms, still more preferably 1 to 10 carbon atoms, and most preferably 1 to 5 carbon atoms.

The fluorination ratio within $R^2$ is preferably 25% or more, more preferably 50% or more, and most preferably 60% or more, as the hydrophobicity of the resist film during immersion exposure is enhanced. The term "fluorination ratio" refers to the percentage (%) of the number of fluorine atoms based on the total number of hydrogen atoms and fluorine atoms contained within the organic group.

As a preferable example of $R^2$, a fluorinated hydrocarbon group which may or may not have a substituent can be given.

The hydrocarbon group may be either an aliphatic hydrocarbon group or an aromatic hydrocarbon group, and an aliphatic hydrocarbon group is preferable.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^2$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups have been substituted with a fluorine atom. The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8. Specific examples include a methyl group, an ethyl group, an n-propyl group, an n-butyl group, an n-pentyl group, an n-hexyl group, an n-heptyl group, an n-octyl group, an n-nonyl group and an n-decyl group.

The unsubstituted branched alkyl group preferably has 3 to 10 carbon atoms, and more preferably 3 to 8. As the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecyl group and a tetracyclododecyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of substituents for the fluorinated hydrocarbon group include an alkyl group of 1 to 5 carbon atoms.

As the fluorinated alkyl group for $R^2$, a linear or branched fluorinated alkyl group is preferable. In particular, a group represented by general formula (III-1) or (III-2) shown below is desirable, and a group represented by general formula (III-1) is most preferable.

[Chemical Formula 62]

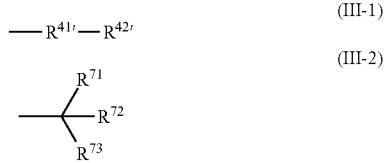

In general formula (III-1), $R^{41\prime}$ represents an unsubstituted alkylene group of 1 to 9 carbon atoms, and $R^{42\prime}$ represents a fluorinated alkyl group of 1 to 9 carbon atoms, provided that the total number of carbon atoms of $R^{41\prime}$ and $R^{42\prime}$ is no more than 10. In general formula (III-2), each of $R^{71}$ to $R^{73}$ independently represents a linear alkyl group of 1 to 5 carbon atoms, with the provision that at least one of $R^{71}$ to $R^{73}$ represents an alkyl group having a fluorine atom.

In general formula (III-1), the alkylene group for $R^{41\prime}$ may be linear, branched or cyclic, and is preferably linear or branched. Further, the number of carbon atoms within the alkylene group is preferably within a range of from 1 to 5.

As $R^{41\prime}$, a methylene group, an ethylene group or a propylene group is particularly desirable.

As $R^{42\prime}$, a linear or branched fluorinated alkyl group of 1 to 5 carbon atoms is preferable, and a perfluoroalkyl group is particularly desirable. Among perfluoroalkyl groups, a trifluoromethyl group and a tetrafluoroethyl group is preferable.

In general formula (III-2), as the alkyl group for $R^{71}$ to $R^{73}$, an ethyl group or a methyl group is preferable, and a methyl group is particularly desirable. At least one of the alkyl groups for $R^{71}$ to $R^{73}$ is a fluorinated alkyl group, and all of the alkyl groups for $R^{71}$ to $R^{73}$ may be fluorinated alkyl groups.

As a preferable example of the structural unit (f1), a structural unit represented by general formula (f1-1) shown below can be given.

[Chemical Formula 63]

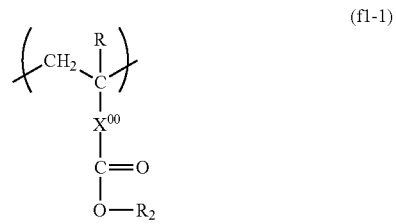

In the formula, R represents a hydrogen atom, an alkyl group of 1 to 5 carbon atoms or a halogenated alkyl group of 1 to 5 carbon atoms; $X^{00}$ represents a divalent linking group which may have a substituent; and $R^2$ represents an organic group which may have a fluorine atom; provided that at least one of $X^{00}$ and $R^2$ has a fluorine atom.

In general formula (f1-1), R represents a hydrogen atom, an alkyl group of 1 to 5 carbon atoms or a halogenated alkyl group of 1 to 5 carbon atoms, and is the same as defined for R described above in the explanation of the component (A).

Specific examples of the alkyl group of 1 to 5 carbon atoms for R include linear or branched alkyl groups of 1 to 5 carbon atoms such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms represented by R include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, a hydrogen atom or a methyl group is more preferable, and a methyl group is particularly desirable.

In general formula (f1-1), $X^{00}$ represents a divalent linking group which may have a substituent.

With respect to the divalent linking group represented by $X^{00}$, the divalent linking group may "have a substituent" means that part or all of the hydrogen atoms of the linking group may be substituted with groups or atoms other than hydrogen atoms.

The divalent linking group for $X^{00}$ may or may not have an acid dissociable portion in the structure thereof.

An "acid dissociable portion" refers to a portion within the $X^{00}$ group which is dissociated from the group by action of acid generated from the component (B) upon exposure. Specific examples of such acid dissociable portion include a portion that forms a cyclic or chain-like tertiary alkyl ester with the carbonyl group; and a portion in which one or more hydrogen atoms have been removed from a group bonded to the oxygen atom constituting the acetal structure of an acetal-type acid dissociable, dissolution inhibiting group such as an alkoxyalkyl group.

As preferable examples of the divalent linking group for $X^{00}$, a divalent hydrocarbon group which may have a substituent, and a divalent linking group containing a hetero atom can be given.

As examples of the divalent hydrocarbon group which may have a substituent and the divalent linking group containing a hetero atom, the same groups as those described above for the "divalent hydrocarbon group which may have a substituent" and the "divalent linking group containing a hetero atom" in relation to $R^{02}$ in general formula (a0-1) can be given.

The divalent linking group for $X^{00}$ may be the "divalent hydrocarbon group which may have a substituent" or the "divalent linking group containing a hetero atom" which may or may not have a fluorine atom.

In the present invention, the divalent linking group for $X^{00}$ is preferably a linear or branched alkylene group, a divalent linking group containing a divalent aromatic cyclic group or a hetero atom, or any of these groups containing a fluorine atom. Among these, a divalent linking group containing a hetero atom which may have a fluorine atom is particularly desirable.

When $X^{00}$ represents a linear or branched alkylene group, it preferably has 1 to 10 carbon atoms, more preferably 1 to 6, still more preferably 1 to 4, and most preferably 1 to 3. Specific examples include the same linear alkylene groups and branched alkylene groups as those described above for the "divalent hydrocarbon group which may have a substituent".

When $X^{00}$ represents a divalent aromatic cyclic group, examples of the aromatic cyclic group include a divalent aromatic hydrocarbon group in which one hydrogen atom has been removed from the nucleus of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

When $X^{00}$ represents a divalent linking group containing a hetero atom, preferable examples of the divalent linking group include —O—, —C(=O)—O—, —C(=O)—, —O—C(=O)—O—, —C(=O)—NH—, —NR$^{04}$— (R$^{04}$ represents a substituent such as an alkyl group or an acyl group), —S—, —S(=O)$_2$—, —S(=O)$_2$—O—, a group represented by the formula —C(=O)—O—R$^{08}$—, a group represented by the formula —O—R$^{08}$—, a group represented by the formula —R$^{09}$—O— and a group represented by the formula —R$^{09}$—O—R$^{08}$—.

$R^{08}$ represents a divalent hydrocarbon group which may have a substituent, preferably a linear or branched aliphatic hydrocarbon group, and more preferably an alkylene group or an alkylalkylene group.

As the alkylene group, a methylene group or an ethylene group is particularly desirable.

The alkyl group within the alkylalkylene group is preferably a linear alkyl group of 1 to 5 carbon atoms, more preferably a linear alkyl group of 1 to 3 carbon atoms, and most preferably an ethyl group.

The $R^{08}$ groups may or may not contain a fluorine atom.

$R^{09}$ represents a divalent aromatic cyclic group, preferably a group in which one hydrogen atom has been removed from the nucleus of a monovalent aromatic hydrocarbon group, and most preferably a group in which one hydrogen atom has been removed from a naphthyl group.

In general formula (f1-1), $R^2$ represents an organic group which may have a fluorine atom, and is the same as defined for $R^2$ in general formulas (II-1) to (II-4).

Among the aforementioned examples, when the structural unit (f1) is represented by general formula (f1-1) in which $X^{00}$ is a single bond, $R^2$ is preferably a methyl group or an ethyl group.

On the other hand, when the structural unit (f1) is represented by general formula (f1-1) in which $X^{00}$ is a divalent linking group which may have a fluorine atom, it is preferably a structural unit represented by general formula (f1-1-1) shown below or general formula (f1-1-2) described later.

[Chemical Formula 64]

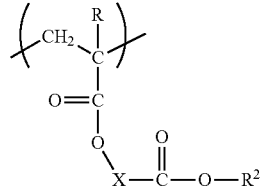

(f1-1-1)

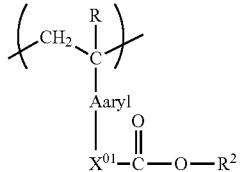

(f1-1-2)

In the formulas, each R independently represents a hydrogen atom, an alkyl group of 1 to 5 carbon atoms or a halogenated alkyl group of 1 to 5 carbon atoms; X represents a divalent linking group which may have a substituent; $A_{aryl}$ represents a divalent aromatic group which may have a substituent; $X^{01}$ represents a single bond or a divalent linking group which may have a substituent; and $R^2$ represents an organic group which may have a fluorine atom; provided that in general formula (f1-1-1), at least one of X and $R^2$ has a fluorine atom, and in general formula (f1-1-2), at least one of $X^{01}$ and $R^2$ has a fluorine atom.

In general formulas (f1-1-1) and (f1-1-2), as the alkyl group of 1 to 5 carbon atoms represented by R, a linear or branched lower alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms include groups in which part or all of the hydrogen atoms of the aforementioned "alkyl group of 1 to 5 carbon atoms" have been substituted with a halogen atom. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is more preferable in terms of industrial availability.

In formulas (f1-1) and (f1-1-2), $R^2$ is the same as defined above. In general formula (f1-1-1), when X has no fluorine atom, as $R^2$, a fluorinated hydrocarbon group is preferable, a fluorinated alkyl group is more preferable, a fluorinated alkyl group of 1 to carbon atoms is still more preferable, and —CH$_2$—CF$_3$, —CH$_2$—CF$_2$—CF$_3$, —CH(CF$_3$)$_2$, —CH$_2$—CF$_2$—CF$_2$—CF$_3$, and —CH$_2$—CH$_2$—CF$_2$—CF$_2$—CF$_3$ are most preferable.

In general formula (f1-1-1), when X has a fluorine atom, in addition to those described above, an alkyl group of 1 to 5 carbon atoms is preferable, and a methyl group is particularly desirable.

In general formula (f1-2), R$^2$ is the same as defined above. In general formula (f1-2), as R$^2$, a fluorinated hydrocarbon group is preferable, a fluorinated alkyl group is more preferable, a fluorinated alkyl group of 1 to 5 carbon atoms is still more preferable, and —CH$_2$—CF$_3$, —CH$_2$—CF$_2$—CF$_3$, —CH(CF$_3$)$_2$, —CH$_2$—CF$_2$—CF$_2$—CF$_3$, and —CH$_2$—CH$_2$—CF$_2$—CF$_2$—CF$_3$ are most preferable.

In general formula (f1-1-1), X represents a divalent linking group which may have a substituent.

X may or may not have an acid dissociable portion. An "acid dissociable portion" refers to a portion within the organic group which is dissociated from the organic group by the action of acid generated upon exposure. When X has an acid dissociable portion, it is preferable that the acid dissociable portion has a tertiary carbon atom.

Preferable examples of X include a hydrocarbon group which may have a substituent, and a group containing a hetero atom.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be either saturated or unsaturated, but in general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable.

Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (═O). Among these, a chain-like aliphatic hydrocarbon group containing a fluorine atom is preferable. In general formula (f-1-1), at least one of X and R$^2$ has a fluorine atom.

As examples of the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

With respect to a divalent group containing a hetero atom, a hetero atom is an atom other than carbon and hydrogen, and examples thereof include an oxygen atom, a nitrogen atom, a sulfur atom and a halogen atom.

Specific examples of divalent groups containing a hetero atom include —O—, —C(═O)—, —C(═O)—O—, a carbonate bond (—O—C(═O)—O—), —NH—, 13 NR$^{004}$ (in the formula, R$^{004}$ represents an alkyl group), —NH—C(═O)—, ═N—, and a combination of any of these "groups" with a divalent hydrocarbon group. As examples of the divalent hydrocarbon group, the same groups as those described above for the hydrocarbon group which may have a substituent can be given, and a linear or branched aliphatic hydrocarbon group is preferable.

In general formula (f1-1-2), A$_{aryl}$ represents a divalent aromatic cyclic group which may have a substituent. A specific example of A$_{aryl}$ includes an aromatic hydrocarbon ring (which may have a substituent) having two hydrogen atoms removed therefrom.

The ring skeleton of the aromatic cyclic group for A$_{aryl}$ preferably has 6 to 15 carbon atoms. Examples of the ring skeleton include a benzene ring, a naphthalene ring, a phenanthrene ring and an anthracene ring. Among these, a benzene ring or a naphthalene ring is particularly desirable.

Examples of substituents for the aromatic cyclic group represented by A$_{aryl}$ include a halogen atom, an alkyl group, an alkoxy group, a halogenated alkyl group of 1 to 5 carbon atoms, and an oxygen atom (═O). Examples of the halogen atom include a fluorine atom, a chlorine atom, an iodine atom and a bromine atom. As the substituent for the aromatic cyclic group represented by A$_{aryl}$, a fluorine atom is preferable.

A$_{aryl}$ may be either an aromatic cyclic group having no substituent, or an aromatic cyclic group having a substituent, although an aromatic cyclic group having no substituent is preferable.

When A$_{aryl}$ represents an aromatic cyclic group having a substituent, the number of the substituent may be 1 or more, preferably 1 or 2, and more preferably 1.

$X^{01}$ represents a single bond or a divalent linking group which may have a substituent. Examples of divalent linking groups include an alkylene group of 1 to 10 carbon atoms, —O—, —C(=O)—, —C(=O)—O—, a carbonate bond (—O—C(=O))—O—), —NH—C(=O)—, and a combination of these groups. Of these, a combination of —O— with an alkylene group of 1 to 10 carbon atoms is particularly desirable. Examples of the substituent include a fluorine atom, a fluorinated alkyl group of 1 to 5 carbon atoms, and an oxygen atom (=O). Among these, a substituent group containing a fluorine atom is preferable. In general formula (f1-1-2), at least one of $X^{01}$ and $R^2$ has a fluorine atom.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

Among structural units represented by the aforementioned general formula (f1-1-1), structural units represented by general formulas (1-01-11) to (f1-01-17) shown below are preferable.

Further, among structural units represented by the aforementioned general formula (f1-1-2), structural units represented by general formulas (f1-01-21) to (f1-01-26) shown below are preferable.

[Chemical Formula 65]

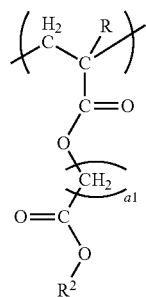

(f1-01-11)

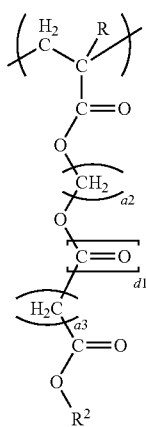

(f1-01-12)

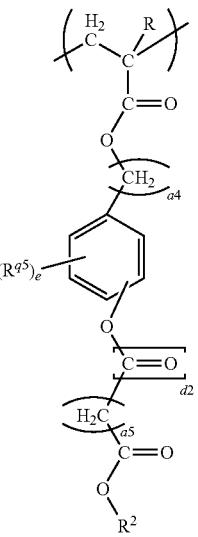

(f1-01-13)

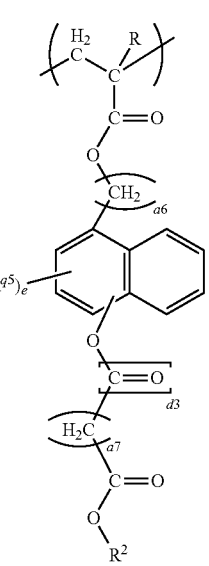

(f1-01-14)

[Chemical Formula 66]

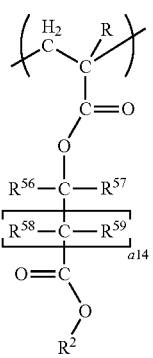

(f1-01-15)

(f1-01-16)
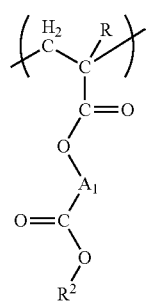
(f1-01-17)
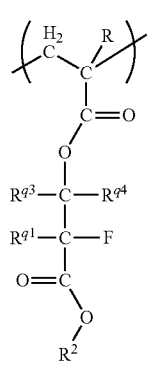
[Chemical Formula 67]
(f1-01-21)
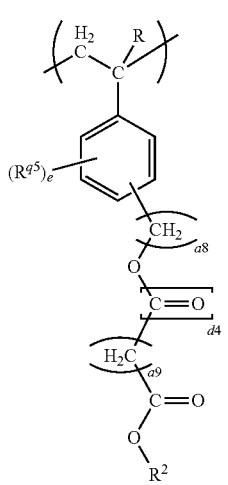
(f1-01-22)
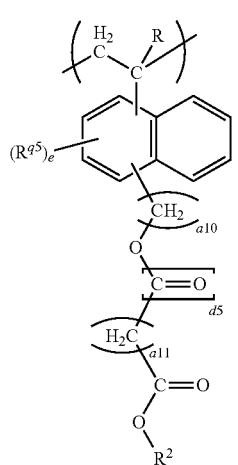
(f1-01-23)
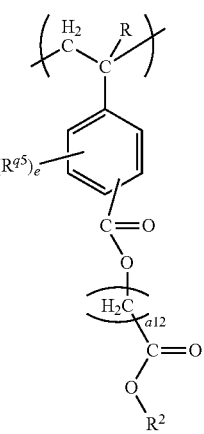
(f1-01-24)
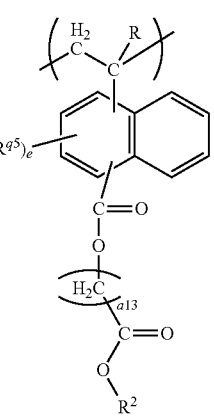
[Chemical Formula 68]
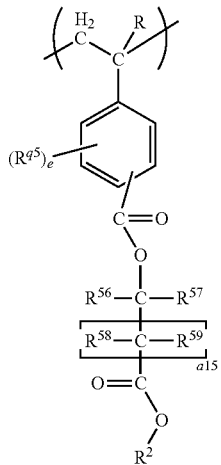

-continued

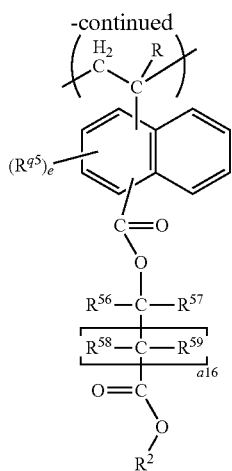

In general formulas (f1-01-11) to (f1-01-17) and (f1-01-21) to (f1-01-26), R and $R^2$ are the same as defined above; each of $R^{56}$ and $R^{57}$ independently represents an alkyl group of 1 to 12 carbon atoms; each of $R^{58}$ and $R^{59}$ independently represents a hydrogen atom or an alkyl group of 1 to 12 carbon atoms; each of a1, a2, a3, a5, a7 a9 and a11 to a13 independently represents an integer of 1 to 5; each of a4, a6, a8 and a10 independently represents an integer of 0 to 5; each of a14 to a16 independently represents an integer of 1 to 5; each of d1 to d5 independently represents 0 or 1; $R^{q5}$ represents a substituent; e represents an integer of 0 to 2; and $A_1$ represents a cyclic alkylene group of 4 to 20 carbon atoms.

In formulas (f1-01-11) to (f1-01-17) and (f1-01-21) to (f1-01-26), as R, a hydrogen atom or a methyl group is preferable.

In general formula (f1-01-11), a1 is preferably an integer of 1 to 3, more preferably 1 or 2.

In formula (f1-01-12), it is preferable that each of a2 and a3 independently represent an integer of 1 to 3, and more preferably 1 or 2.

d1 is preferably 0.

In formula (f1-01-13), a4 is preferably an integer of 0 to 3, more preferably an integer of 0 to 2, and most preferably 0 or 1.

a5 is preferably an integer of 1 to 3, and more preferably 1 or 2.

Examples of the substituent represented by $R^{q5}$ include a halogen atom, an alkyl group of 1 to 5 carbon atoms, an alkoxy group of 1 to 5 carbon atoms, a halogenated alkyl group of 1 to 5 carbon atoms and an oxygen atom (=O). Examples of the alkyl group of 1 to 5 carbon atoms include the same alkyl group of 1 to 5 carbon atoms as those described above for R. Examples of the halogen atom include a fluorine atom, a chlorine atom, an iodine atom and a bromine atom. Examples of the halogenated alkyl group of 1 to 5 carbon atoms include the same halogenated alkyl group of 1 to 5 carbon atoms as those described above for R.

e is preferably 0 or 1, and most preferably 0 from an industrial viewpoint.

d2 is preferably 0.

In general formula (f1-01-14), a6 is preferably an integer of 0 to 3, more preferably an integer of 0 to 2, and most preferably 0 or 1.

a7 is preferably an integer of 1 to 3, and more preferably 1 or 2.

d3 is preferably 0.

$R^{q5}$ and e are the same as defined above.

In formula (f1-01-15), a14 is preferably an integer of 0 to 3, more preferably an integer of 0 to 2, and most preferably 0 or 1.

It is preferable that each of $R^{56}$ and $R^{57}$ independently represents a linear, branched or cyclic alkyl group of 1 to 12 carbon atoms, and specific examples thereof include a methyl group, an ethyl group, an n-propyl group, an isopropyl group, an n-butyl group, an isobutyl group, a tert-butyl group, a tert-pentyl group, a cyclopentyl group, a cyclohexyl group, a cyclooctyl group, a norbornyl group, an isobornyl group, a tricyclodecyl group, an adamantyl group and a tetracyclododecyl group. Of these, an alkyl group of 1 to 6 carbon atoms is preferable, more preferably an alkyl group of 1 to 4 carbon atoms, and most preferably a methyl group or an ethyl group.

It is preferable that each of $R^{58}$ and $R^{59}$ independently represents a hydrogen atom, or a linear, branched or cyclic alkyl group of 1 to 12 carbon atoms. For $R^{58}$ and $R^{59}$, the linear, branched or cyclic alkyl group of 1 to 12 carbon atoms is the same as defined above for $R^{56}$ and $R^{57}$.

In formula (f1-01-16), $A_1$ represents a cyclic alkylene group of 4 to 20 carbon atoms, and is preferably a cyclic alkylene group of 5 to 15 carbon atoms, and more preferably a cyclic alkylene group of 6 to 12 carbon atoms. Specific examples of the cyclic alkylene group include those described above as the "cyclic aliphatic hydrocarbon group" for the aforementioned hydrocarbon group which may have a substituent, and the cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In general formula (f1-01-17), $R^{q1}$ represents a fluorine atom or a fluorinated alkyl group.

With respect to the fluorinated alkyl group for $R^{q1}$, the alkyl group prior to being fluorinated may be linear, branched or cyclic.

The linear or branched alkyl group preferably has 1 to 5 carbon atoms, more preferably 1 to 3 carbon atoms, and most preferably 1 or 2 carbon atoms.

In general formula (f1-01-17), each of $R^{q3}$ and $R^{q4}$ independently represents a hydrogen atom, an alkyl group or a fluorinated alkyl group, wherein $R^{q3}$ and $R^{q4}$ may be mutually bonded to form a ring.

The alkyl group for $R^{q3}$ and $R^{q4}$ may be linear, branched or cyclic, and is preferably linear or branched.

The linear or branched alkyl group is preferably a linear or branched alkyl group of 1 to 5 carbon atoms, more preferably a methyl group or an ethyl group, and most preferably an ethyl group.

The cyclic alkyl group preferably has 4 to 15 carbon atoms, more preferably 4 to 12, and most preferably 5 to 10. Specific examples include groups in which one or more hydrogen atoms have been removed from a monocycloalkane or a polycycloalkane such as a bicycloalkane, tricycloalkane or tetracycloalkane. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these examples, a group in which one or more hydrogen atoms have been removed from adamantane is preferable.

The fluorinated alkyl group for $R^{q3}$ and $R^{q4}$ is an alkyl group in which part or all of the hydrogen atoms have been substituted with a fluorine atom.

In the fluorinated alkyl group, the alkyl group prior to being substituted with a fluorine atom may be linear, branched or cyclic, and examples thereof include the same groups as those described above for the alkyl group represented by $R^{q3}$ and $R^{q4}$.

$R^{q3}$ and $R^{q4}$ may be mutually bonded to form a ring. Such a ring constituted of $R^{q3}$, $R^{q4}$ and the carbon atom having $R^{q3}$ and $R^{q4}$ bonded thereto can be mentioned as a group in which two hydrogen atoms have been removed from a monocycloalkane or a polycycloalkane described above for the aforementioned cyclic alkyl group, preferably a 4- to 10-membered ring, and more preferably a 5- to 7-membered ring.

Among these, $R^{q3}$ and $R^{q4}$ preferably represents a hydrogen atom or an alkyl group.

In formula (f1-01-21), a8 is preferably an integer of 0 to 3, more preferably an integer of 0 to 2, and most preferably 0 or 1.

a9 is preferably an integer of 1 to 3, and more preferably 1 or 2.

d4 is preferably 0.

$R^5$ and e are the same as defined above.

In formula (f1-01-22), a10 is preferably an integer of 0 to 3, more preferably an integer of 0 to 2, and most preferably 0 or 1.

a11 is preferably an integer of 1 to 3, and more preferably 1 or 2.

d5 is preferably 0.

$R^{q5}$ and e are the same as defined above.

In formula (f1-01-23), a12 is preferably an integer of 1 to 3, and more preferably 1 or 2.

$R^{q5}$ and e are the same as defined above.

In formula (f1-01-24), a13 is preferably an integer of 1 to 3, and more preferably 1 or 2.

$R^{q5}$ and e are the same as defined above.

In formulas (f1-01-25) and (f1-01-26), each of a15 and a16 is preferably an integer of 0 to 3, more preferably an integer of 0 to 2, and most preferably 0 or 1.

$R^{56}$, $R^{57}$, $R^{58}$ and $R^{59}$ are the same as defined above.

In general formulas (f-1-01-25) and (f-1-01-26), $R^{q5}$ and e are the same as defined above.

Specific examples of structural units represented by the above general formulas (f1-01-11) to (f1-01-17) and (f1-01-21) to (f1-01-26) are shown below.

[Chemical Formula 69]

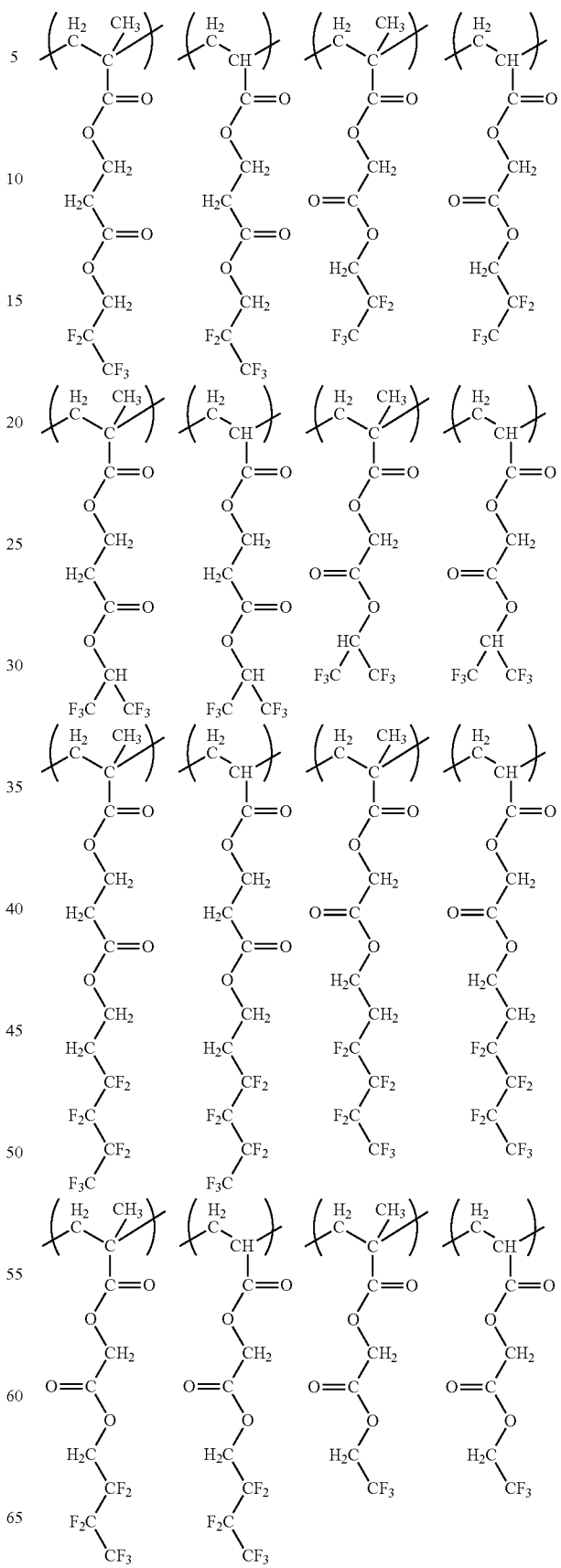

125
-continued
[Chemical Formula 70]
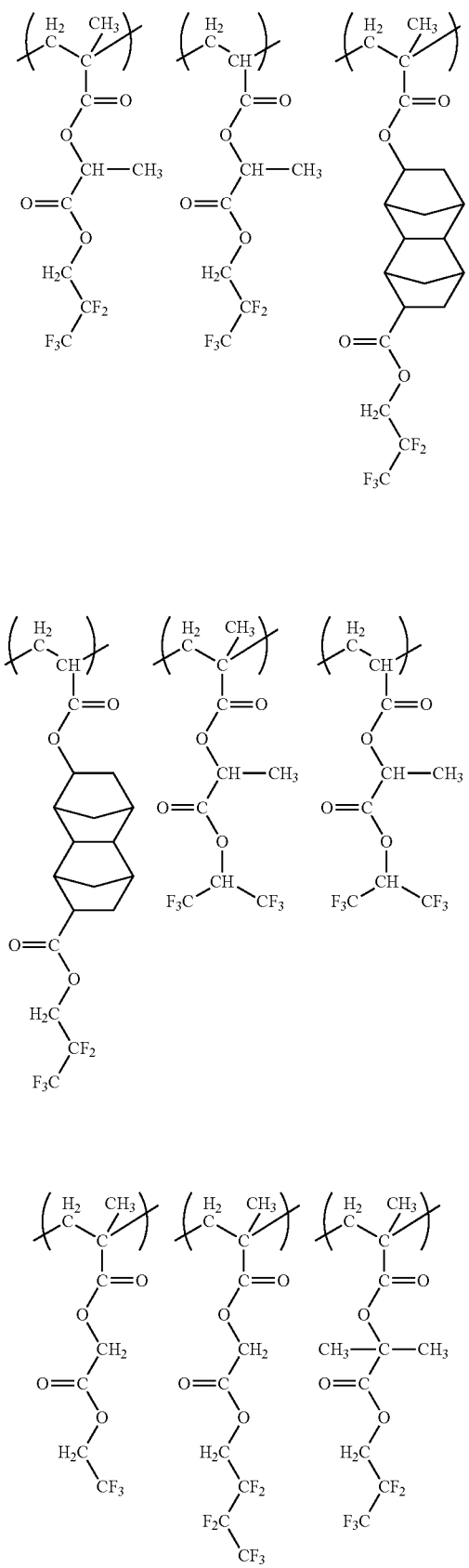
126
-continued
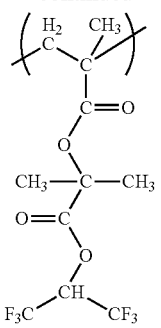
[Chemical Formula 71]
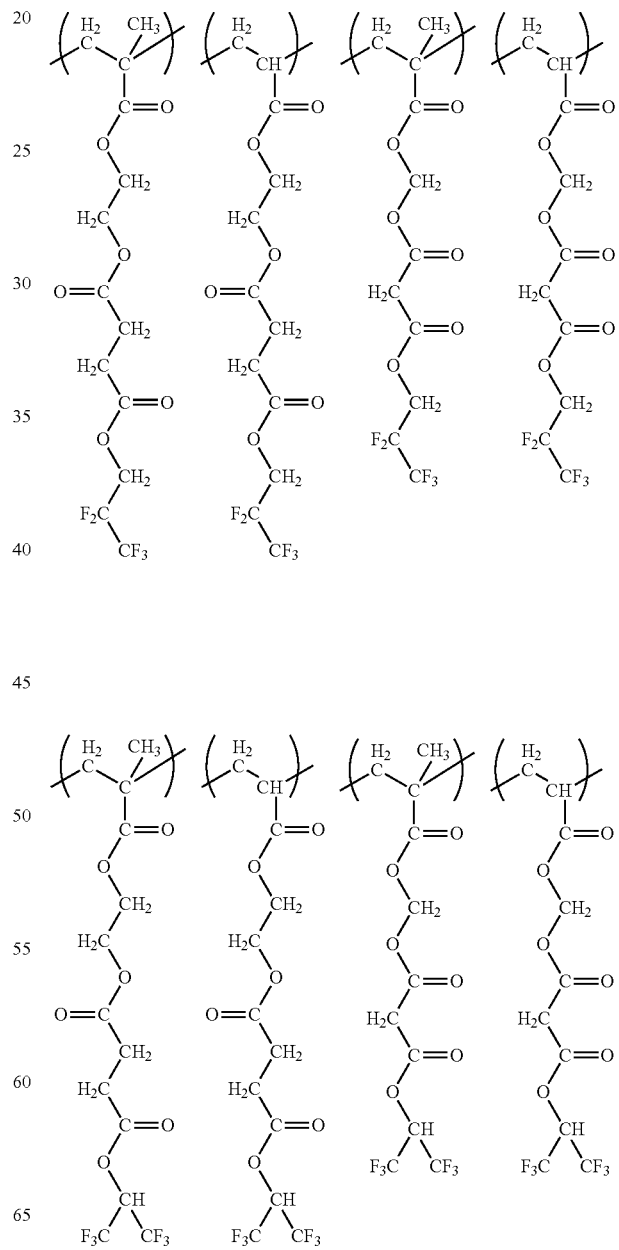

-continued
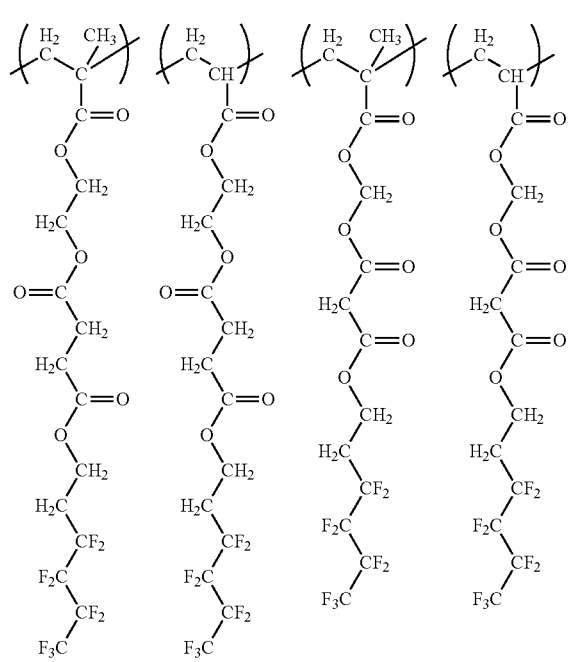
[Chemical Formula 72]
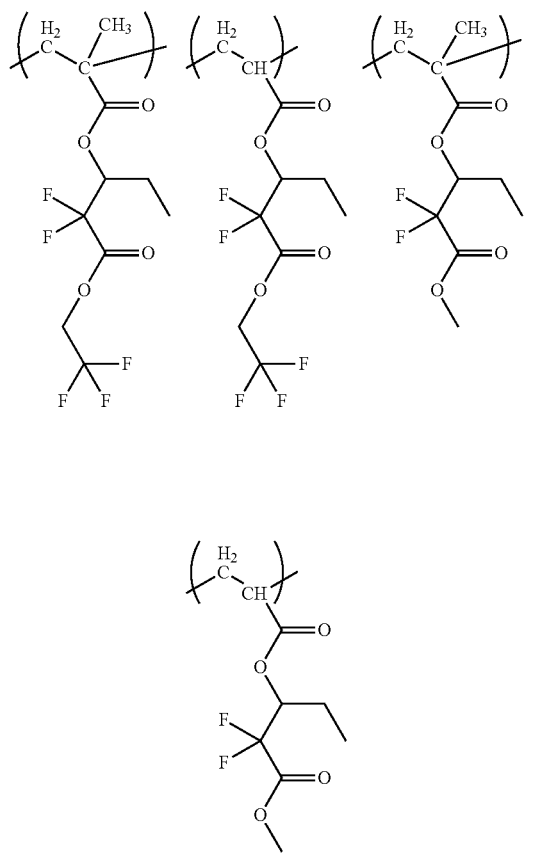
[Chemical Formula 73]
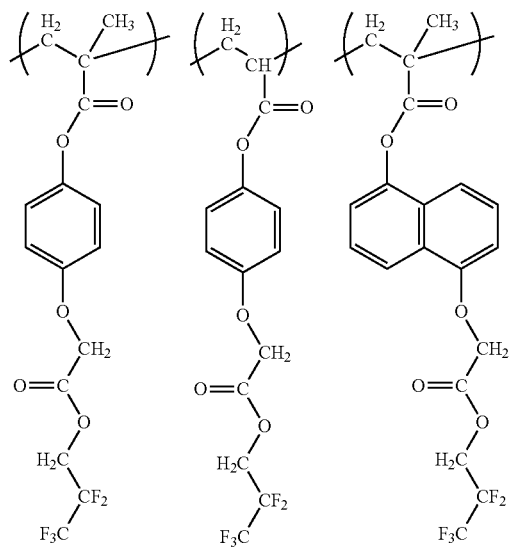
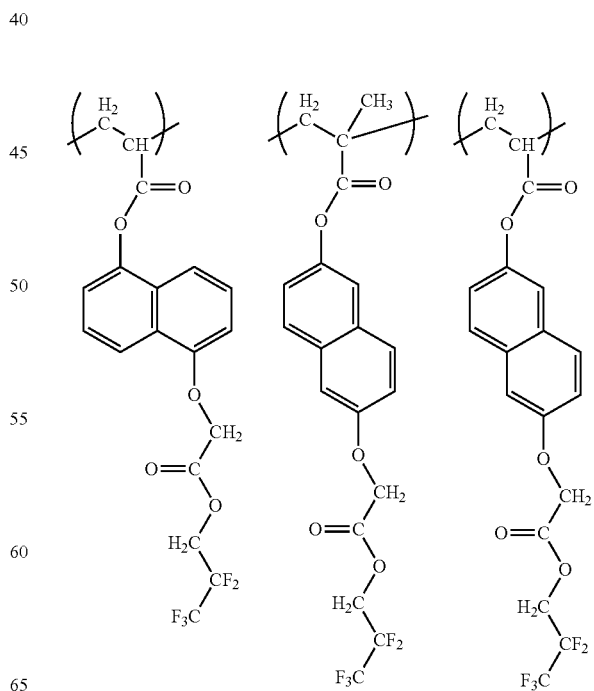

[Chemical Formula 74]
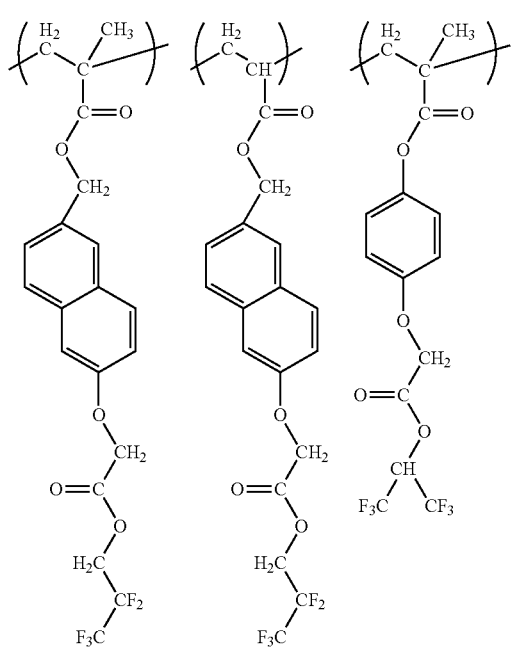
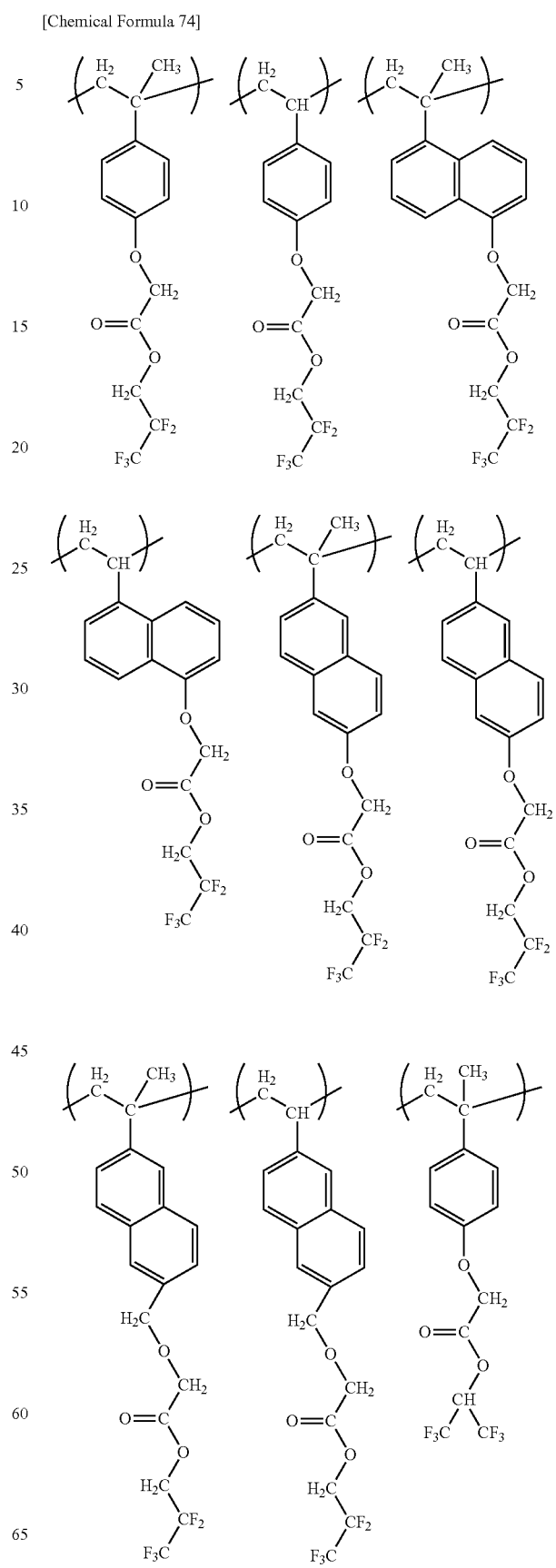

-continued

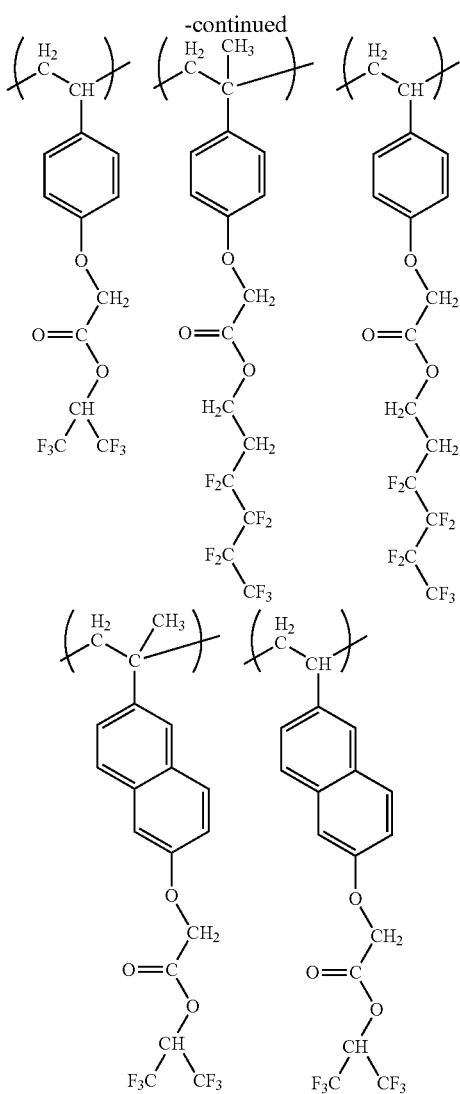

As the structural unit (f1-1), at least one structural unit selected from the group consisting of structural units represented by the aforementioned general formulas (f1-01-11) to (f1-01-17) and (f1-01-21) to (f1-01-26) is preferable, at least one structural unit selected from the group consisting of structural units represented by the aforementioned general formulas (f1-01-11) to (f1-01-17) and (f1-01-21) to (f1-01-24) is more preferable, at least one structural unit selected from the group consisting of structural units represented by the aforementioned general formulas (f1-01-11) to (f1-01-17), (f1-01-21) and (f1-01-22) is still more preferable, and at least one structural unit selected from the group consisting of structural units represented by the aforementioned general formulas (f1-01-11), (1-01-17) and (f1-01-22) is most preferable.

Examples of the monomers from which the structural unit represented by general formula (f1-1) is derived include compounds in which an alkali developing solution decomposable group and a polymerizable group are bonded via a divalent linking group.

A "polymerizable group" refers to a group that renders a compound having the group polymerizable by a radical polymerization or the like, and examples of the polymerizable groups include groups containing an ethylenic double bond.

Examples of the groups containing an ethylenic double bond include a group represented by $CH_2=CR-$ (in the formula, R is the same as defined above).

Examples of the divalent linking groups include a group represented by the formula $-A_{aryl}-X_{01}-$ (in the formula, $A_{aryl}$ and $X_{01}$ are the same as defined above) and a group represented by the formula $-C(=O)-O-X-$ (in the formula, X is the same as defined above).

Examples of the monomers from which the structural unit represented by general formula (f1-1-1) is derived include a fluorine-containing compound represented by general formula (f1-01-10) shown below, and examples of the monomers from which the structural unit represented by general formula (f1-1-2) is derived include a fluorine-containing compound represented by general formula (f1-01-20) shown below.

[Chemical Formula 75]

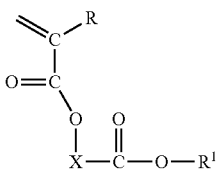

(f1-01-10)

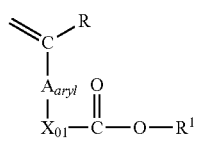

(f1-01-20)

In the formulas, R, X, $A_{aryl}$, $X_{01}$ and $R^1$ are the same as defined above.

A fluorine-containing compound represented by general formula (f1-01-10) or (f1-01-20) (hereafter, frequently referred to as "fluorine-containing compound (F0)") can be produced, for example, by introducing the $R^1$ group ($R^1$ is the same as defined above) into the carboxy group of a compound represented by general formula (f0-1-0) or (f-0-2-0) shown below (hereafter, collectively referred to as "compound (V-1)") (i.e., substituting the hydrogen atom at the terminal of the carboxy group with the $R^1$ group).

The $R^1$ group can be introduced by a conventional method. For example, a compound (V-1) can be reacted with a compound (V-2) represented by general formula (V-2) shown below, to thereby obtain a fluorine-containing compound (F0).

[Chemical Formula 76]

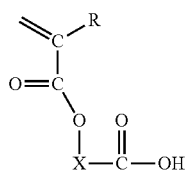

(f0-1-0)

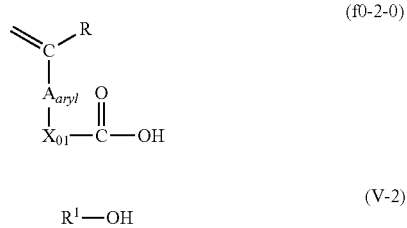

(f0-2-0)

$$R^1—OH \quad (V-2)$$

In the formulas, R, X, $A_{aryl}$, $X_{01}$ and $R^1$ are the same as defined above.

The method of reacting a compound (V-1) with a compound (V-2) is not particularly limited. For example, a method in which a compound (V-1) comes in contact with a compound (V-2) in a reaction solvent in the presence of a base can be used.

As a compound (V-1) and a compound (V-2), commercially available compounds can be used. Alternatively, a compound (V-1) and a compound (V-2) can be synthesized.

As a compound (V-1), for example, a low molecular weight compound derived from an acrylate ester such as a carboxyalkyl (meth)acrylate or a mono((meth)acryloyloxyalkyl) succinate, or a polymeric compound including a structural unit derived from an acrylate ester can be used.

As a compound (V-2), for example, a fluorinated alkylalcohol or the like can be used.

As the reaction solvent, any solvent capable of dissolving a compound (V-1) and a compound (V-2) (which are raw materials) can be used. Specific examples include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine; and inorganic bases such as sodium hydride, $K_2CO_3$ and $Cs_2CO_3$.

Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

The amount of the compound (V-2) added, relative to the compound (V-1) is preferably within a range from 1 to 3 equivalents, and more preferably from 1 to 2 equivalents.

The reaction temperature is preferably −20 to 40° C., more preferably 0 to 30° C.

The reaction time varies depending on factors such as the reactivity of the compound (V-1) and the compound (V-2) and the reaction temperature. However, in general, the reaction time is preferably within a range from 30 to 480 minutes, and more preferably from 60 to 360 minutes.

In the component (F1), the amount of the structural unit (f1), based on the combined total of all structural units constituting the component (F1) is preferably 10 to 95 mol %, more preferably 30 to 80 mol %, and still more preferably 40 to 70 mol %.

When the amount of the structural unit represented by general formula (f1-01) is at least as large as the lower limit of the above-mentioned range, a high hydrophobicity can be achieved during formation of a resist pattern, and a resist film exhibiting excellent lithography properties can be obtained.

In the component (F1), as the structural unit (f1), one type of structural unit may be used, or two or more types may be used in combination.

In the component (F), the fluorine-containing polymeric compound (F1) may include a structural unit other than the structural unit (f1) (hereafter, referred to as "structural unit (f2)" or "structural unit (f3)"), as long as the effects of the present invention are not impaired.

(Structural Unit (f2))

Examples of the structural unit (f2) include the structural units (a0) to (a4) described above in relation to the resin component (A1), and the structural unit (a1) is preferable.

In the component (F1), as the structural unit (f2), one type of structural unit may be used, or two or more types may be used in combination.

Of the various structural units classified as the structural unit (a1), structural units represented by general formula (a1-0-11), (a1-0-12) or (a1-0-2) is preferable, and structural units represented by general formulas (a1-1-16) to (a1-1-23), (a1-1-32) and (a1-1-33) are particularly desirable.

In the component (F), as the structural unit (f2), one type of structural unit may be used alone, or two or more types of structural units may be used in combination.

In the component (F), the amount of the structural unit (f2) based on the combined total of all structural units constituting the component (F) is preferably 5 to 80 mol %, more preferably 10 to 60 mol %, still more preferably 15 to 50 mol %, and most preferably 20 to 40 mol %. When the amount of the structural unit (f2) is at least as large as the lower limit of the above-mentioned range, the characteristic feature of exhibiting hydrophobicity during immersion exposure, but then exhibiting increased hydrophilicity during exposure and post exposure baking (PEB) is improved. Moreover, formation of bridge-type defects in a line and space pattern or formation of "Not Open" defects in which a portion of, or all of, a contact hole pattern is not open can be suppressed. Furthermore, the proportion of hydrocarbon groups within the component (F) increases and the water tracking ability during immersion exposure using a scanning-type immersion exposure apparatus is improved. On the other hand, when the amount of the structural unit (f2) is no more than the upper limit of the above-mentioned range, a good balance can be achieved with the structural unit (f1), and the effects of the present invention are improved.

(Structural Unit (f3))

There are no particular limitations on the structural unit (f3), provided the structural unit is derived from a compound that is copolymerizable with the compound from which the structural unit (f1) is derived and the compound from which the structural unit (f2) is derived. Examples of such structural units include structural units which have been proposed for the base resin of a conventional chemically amplified resist. Among these, a structural unit that contains an alkali-soluble group such as a carboxy group or a hydroxy group in the structure thereof is particularly desirable.

As an example of the structural unit (f3), a structural unit represented by general formula (f3-1) shown below can be given.

[Chemical Formula 77]

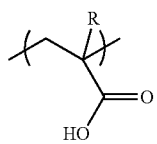
(f3-1)

In the formulas, R is the same as defined above.

In the component (F), as the structural unit (f3), one type of structural unit may be used alone, or two or more types of structural units may be used in combination. In the component (F), the amount of the structural unit (f3) based on the combined total of all structural units constituting the component (F) is preferably 5 to 80 mol %, more preferably 10 to 60 mol %, still more preferably 15 to 50 mol %, and most preferably 20 to 40 mol %.

In the present invention, the component (F) is preferably a copolymer including the structural unit (f1) and at least one of the structural unit (f2) and the structural unit (f3). Examples of such copolymers include a copolymer consisting of the structural unit (f1) and the structural unit (f2); a copolymer consisting of the structural unit (f1) and the structural unit (f3); and a copolymer consisting of the structural unit (f1), the structural unit (f2) and the structural unit (f3).

The weight average molecular weight (Mw) (the polystyrene equivalent value determined by gel permeation chromatography) of the component (F) is not particularly limited, but is preferably 2,000 to 50,000, more preferably 3,000 to 30,000, and most preferably 4,000 to 25,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

The component (F) can be produced, for example, by polymerization of the monomers corresponding with each of the structural units that constitute the component (F) by a living radical polymerization using a living radical polymerization initiator (e.g., azobisisobutyronitrile (AIBN) or dibutyl telluride) or any other conventional polymerization method capable of block copolymerization.

Polymerization of a block copolymer can be conducted by a conventional method (see, for example, Japanese Unexamined Patent Application, First Publication No. 2004-323693, Japanese Unexamined Patent Application, First Publication No. 2005-126459, Japanese Unexamined Patent Application, First Publication No. 2006-299278 and Japanese Unexamined Patent Application, First Publication No. 2008-247919). For example, a compound from which a structural unit (f1) can be derived (hereafter, referred to as "compound (f1)") can be reacted with compounds represented by formulas (V-3), (V-4) and (V-5) shown below, to thereby obtain a fluorine-containing polymeric compound (F01).

[Chemical Formula 78]

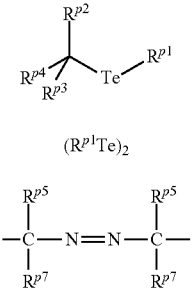

(V-3)

(V-4)

(V-5)

In the formulas, $R^{p1}$ represents an alkyl group of 1 to 8 carbon atoms, an aryl group, a substituted aryl group or an aromatic heterocyclic group; each of $R^{p2}$ and $R^{p3}$ independently represents a hydrogen atom or an alkyl group of 1 to 8 carbon atoms; $R^{p4}$ represents an aryl group, a substituted aryl group, an aromatic heterocyclic group, an acyl group, an oxycarbonyl group or a cyano group; $R^{p5}$ and $R^{p6}$ represent an alkyl group of 1 to 10 carbon atoms, an alkyl group of 1 to 4 carbon atoms which has been substituted with a carboxy group, a phenyl group which may have a substituent, wherein $R^{p5}$ and $R^{p6}$ may be the same or different from each other, and $R^{p5}$ and $R^{p6}$ may form an aliphatic cyclic group together with the carbon atom having the $R^{p5}$ group and the $R^{p6}$ group bonded thereto; and $R^{p7}$ represents a cyano group, an acetoxy group, a carbamoyl group or an alkoxycarbonyl group in which the alkoxy group has 1 to 4 carbon atoms.

The method of reacting a compound (f1) with a compound (V-3), a compound (V-4) and a compound (V-5) is not particularly limited. For example, the compound (f1) can be allowed to come in contact with the compounds (V-3), (V-4) and (V-5) in an inert gas-purged vessel.

As a compound (V-3), a compound (V-4) and a compound (V-5), commercially available compounds can be used. Alternatively, the compounds can be synthesized.

As a compound (V-3), an organic tellurium compound may be used.

As a compound (V-4), a ditelluride compound may be used.

As a compound (V-5), an azo-type polymerization initiator may be used.

Although the reaction can be performed without a solvent, a reaction solvent may be used. As the reaction solvent, any solvent which is capable of dissolving the compounds as the raw materials can be used. Specific examples of such solvents include tetrahydrofuran (THF), acetone, dimethylformamide (DMF), dimethylacetamide, dimethylsulfoxide (DMSO) and dioxane.

The amount of the compound (f1) added, relative to the compounds (V-3) to (V-5) is preferably within a range from 5 to 10,000 equivalents, and more preferably from 50 to 5,000 equivalents.

The amount of the compounds (V-3) to (V-5) is not particularly limited. The amount of the compound (V-4) relative to the compound (V-3) is preferably 0.1 to 10 equivalents, and the amount of the compound (V-5) relative to the compound (V-3) is preferably 0.1 to 10 equivalents.

The reaction temperature is preferably within the range of 40 to 150° C., and more preferably 50 to 120° C.

The reaction time depends on the reactivity of the compounds, the reaction temperature or the like. However, in general, the reaction time is preferably 0.5 to 96 hours, and more preferably 1 to 48 hours.

In the present invention, the component (F) contains a fluorine-containing polymeric compound (F1) which has the structural unit (f1).

Preferable examples of the fluorine-containing polymeric compound (F1) include a copolymer consisting of the structural unit (f1) and the structural unit (f2), and a copolymer consisting of the structural unit (f1), the structural unit (f2) and the structural unit (f3).

In the present invention, as the component (F1), those which have the structural units as shown below (fluorine-containing polymeric compounds (F1-1) to (F1-4)) are particularly desirable.

[Chemical Formula 79]

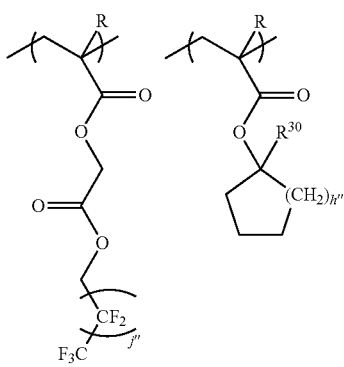

(F1-1)

In formula (F1-1), R represents a hydrogen atom, an alkyl group of 1 to 5 carbon atoms or a halogenated alkyl group of 1 to 5 carbon atoms, wherein the plurality of R may be the same or different from each other; j" represents an integer of 1 to 3; $R^{30}$ represents an alkyl group of 1 to 5 carbon atoms; and h" represents an integer of 1 to 6.

In formula (F1-1), R is the same as defined for R in the aforementioned formulas (f1-1) to (f1-3).

j" is preferably 1 or 2, and most preferably 1.

$R^{30}$ is the same as defined for the alkyl group of 1 to 5 carbon atoms represented by R, preferably a methyl group or an ethyl group, and an ethyl group is particularly desirable.

h" is preferably 3 or 4, and most preferably 4.

[Chemical Formula 80]

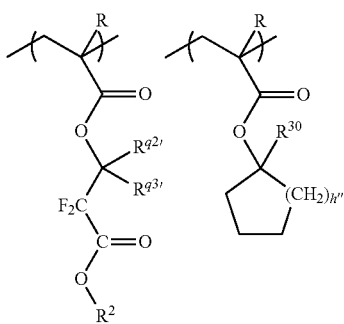

(F1-2)

In formula (F1-2), R represents a hydrogen atom, an alkyl group of 1 to 5 carbon atoms or a halogenated alkyl group of 1 to 5 carbon atoms, wherein the plurality of R may be the same or different from each other; each of $R^{q2'}$ and $R^{q3'}$ independently represents a hydrogen atom or an alkyl group; $R^2$ represents an alkyl group; $R^{30}$ represents an alkyl group of 1 to 5 carbon atoms; and h" represents an integer of 1 to 6.

In formula (F1-1), R is the same as defined for R in the aforementioned formula (F1-1).

$R^{q2'}$ and $R^{q3'}$ are respectively the same as defined for $R^{q2'}$ and $R^{q3'}$ in formula (F1-2).

$R^2$ is the same as defined above, preferably an alkyl group of 1 to 5 carbon atoms, and more preferably a methyl group or an ethyl group.

$R^{30}$ and h" are respectively the same as defined for $R^{30}$ and h" in formula (F1-1).

[Chemical Formula 81]

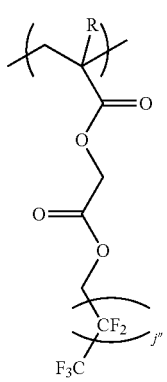

(F1-3)

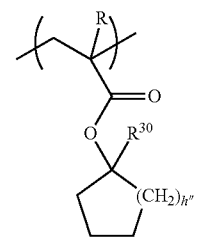

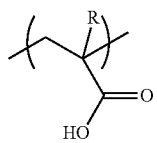

In formula (F1-3), R represents a hydrogen atom, an alkyl group of 1 to 5 carbon atoms or a halogenated alkyl group of 1 to 5 carbon atoms, wherein the plurality of R may be the same or different from each other; j" represents an integer of 1 to 3; $R^{30}$ represents an alkyl group of 1 to 5 carbon atoms; and h" represents an integer of 1 to 6.

In formula (F1-3), R is the same as defined for R in the aforementioned formulas (f1-1) to (f1-3).

j" is preferably 1 or 2, and most preferably 1.

$R^{30}$ is the same as defined for the alkyl group of 1 to 5 carbon atoms represented by R, preferably a methyl group or an ethyl group, and an ethyl group is particularly desirable.

h" is preferably 3 or 4, and most preferably 4.

[Chemical Formula 82]

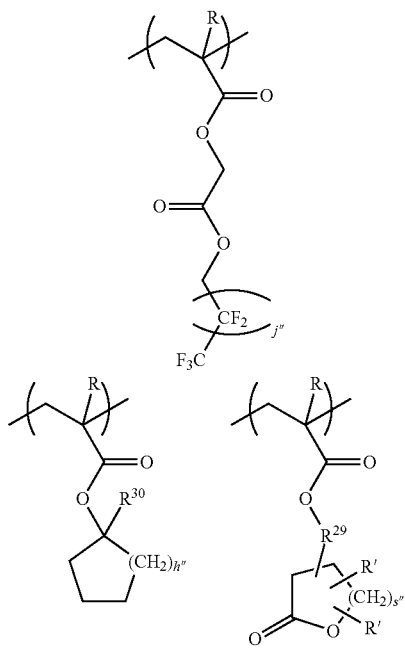

(F1-4)

In formula (F1-4), R represents a hydrogen atom, an alkyl group of 1 to 5 carbon atoms or a halogenated alkyl group of 1 to 5 carbon atoms, wherein the plurality of R may be the same or different from each other; j" represents an integer of 1 to 3; $R^{30}$ represents an alkyl group of 1 to 5 carbon atoms; h" represents an integer of 1 to 6; each R' independently represents a hydrogen atom, an alkyl group of 1 to 5 carbon atoms, an alkoxy group of 1 to 5 carbon atoms or —COOR"; $R^{29}$ represents a single bond or a divalent linking group; and s" represents an integer of 0 to 2.

In formula (F1-4), R is the same as defined for R in the aforementioned formulas (f1-1) to (f1-3).

j" is preferably 1 or 2, and most preferably 1.

$R^{30}$ is the same as defined for the alkyl group of 1 to 5 carbon atoms represented by R, and a methyl group or an ethyl group is particularly desirable.

In terms of industrial availability, R' is preferably a hydrogen atom.

$R^{29}$ represents a single bond or a divalent linking group. Among these, an alkylene group, an ester bond (—C(=O)—O—) or a combination of these is preferable. The alkylene group as a divalent linking group for $R^{29}$ is preferably a linear or branched alkylene group.

s" is preferably 1 or 2.

In the component (F), as the component (F1), one type may be used alone, or two or more types may be used in combination.

In the positive resist composition of the present invention, the amount of the component (F) relative to 100 parts by weight of the component (A) is preferably 0.1 to 50 parts by weight, more preferably 0.1 to 40 parts by weight, still more preferably 0.3 to 30 parts by weight, and most preferably 0.5 to 15 parts by weight. When the amount of the component (F) is at least as large as the lower limit of the above-mentioned range, the hydrophobicity of a resist film formed using the positive resist composition can be enhanced, so that the resist film exhibits hydrophobicity suitable for immersion exposure. On the other hand, when the amount of the component (F) is no more than the upper limit of the above-mentioned range, the lithography properties are improved.

The thus explained fluorine-containing resin component can also be preferably used as an additive for a resist composition for immersion exposure.

<Component (D)>

In the positive resist composition of the present invention, a nitrogen-containing organic compound (D) (hereafter referred to as the component (D)) may be added as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used, although an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

As the component (D), one type of compound may be used alone, or two or more types may be used in combination.

In the present invention, as the component (D), it is preferable to use a trialkylamine of 5 to 10 carbon atoms.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

<Optional Components>

[Component (E)]

Furthermore, in the positive resist composition of the present invention, for preventing any deterioration in sensitivity, and improving the resist pattern shape and the post exposure stability of the latent image formed by the patternwise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, PGMEA, PGME, EL and γ-butyrolactone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 0.5 to 20% by weight, and preferably from 1 to 15% by weight.

Dissolving of the resist materials in the component (S) can be conducted by simply mixing and stirring each of the above components together using conventional methods, and where required, the composition may also be mixed and dispersed using a dispersion device such as a dissolver, a homogenizer, or a triple roll mill. Furthermore, following mixing, the composition may also be filtered using a mesh, or a membrane filter or the like.

<<Method of Forming a Resist Pattern>>

The method of forming a resist pattern according to a second aspect of the present invention includes: using a positive resist composition of the present invention to from a resist film on a substrate; conducting exposure of the resist film; and alkali-developing the resist film to form a resist pattern.

More specifically, the method for forming a resist pattern according to the present invention can be performed, for example, as follows.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed with an ArF exposure apparatus, an electron beam exposure apparatus, an EUV exposure apparatus or the like through a mask pattern or directly irradiated with electron beam without a mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

The method of forming a resist pattern according to the present invention is also applicable to a double exposure method or a double patterning method.

As described hereinabove, by the positive resist composition and method of forming a resist pattern according to the present invention, a resist film exhibiting an excellent hydrophobicity on the film surface can be formed.

A resist film formed using the positive resist composition of the present invention contains the fluorine-containing polymeric compound (F1) having the structural unit (f1).

As described above, since the component (F1) contains a fluorine atom, a resist film formed using the positive resist composition exhibits a high hydrophobicity, as compared to the case where a positive resist composition which does not contain the fluorine-containing polymeric compound is used.

Thus, a resist film formed using the positive resist composition of the present invention exhibits a high hydrophobicity during immersion exposure, as compared to the case of using a conventional resist composition. Therefore, the resist film exhibits an excellent water tracking ability (tracking ability of water with respect to the movement of the lens) which is required when immersion exposure is conducted using a scanning-type immersion exposure apparatus as disclosed in Non-Patent Document 1, and a high scanning speed can be achieved.

In a resist film formed using the positive resist composition of the present invention, by virtue of using the component (F1) and the component (A1), the hydrophobicity of the resist film is enhanced as compared to the case where a conventional positive resist composition is used, and the contact angles against water, e.g., the static contact angle (the contact angle between the surface of a water droplet on the resist film in a horizontal state and the resist film surface), the dynamic contact angle (the contact angle at which a water droplet starts to slide when the resist film is inclined, including the contact angle at the front-end point of the water droplet in the sliding direction (advancing angle) and the contact angle at the rear-end point of the water droplet in the sliding direction (receding angle)) and sliding angle (the inclination angle at which a water droplet starts to slide when the resist film is inclined) are changed. For example, the higher the hydrophobicity of a resist film, the higher the static contact angle and the dynamic contact angle and the smaller the sliding angle.

FIG. 1 is an explanatory diagram of an advancing angle ($\theta_1$), a receding angle ($\theta_2$) and a sliding angle ($\theta_3$).

As shown in FIG. 1, when a droplet 1 is placed on a plane 2 and the plane 2 is gradually inclined, the advancing angle is the angle $\theta_1$ formed between the lower end 1a of the droplet 1 and the plane 2 as the droplet 1 starts to move (slide) on the plane 2.

Further, at this point (the point when the liquid droplet 1 starts to move (slide) down the flat surface 2), the angle $\theta_2$ between the surface of the liquid droplet at the top edge 1b of the liquid droplet 1 and the flat surface 2 is the receding angle, and the inclination angle $\theta_3$ of the flat surface 2 is the sliding angle.

In the present description, the static contact angle, the dynamic contact angle and the sliding angle are measured in the following manner.

First, a resist composition solution is spin-coated onto a silicon substrate, and then heated under predetermined conditions, for example, at a temperature of 110° C. to 115° C. for 60 seconds to form a resist film.

Subsequently, the contact angles can be measured using commercially available measurement apparatuses such as DROP MASTER-700 (product name; manufactured by Kyowa Interface Science Co. Ltd.), AUTO SLIDING ANGLE: SA-30 DM (product name; manufactured by Kyowa Interface Science Co. Ltd.), and AUTO DISPENSER: AD-31 (product name; manufactured by Kyowa Interface Science Co. Ltd.).

With respect to the positive resist composition of the present invention, the measured value of the receding angle of a resist film formed using the positive resist composition is preferably 70 degrees (°) or more, more preferably 73° or more, and still more preferably 75° or more. The larger the receding angle, the higher the hydrophobicity of the resist film surface, thereby enabling high-speed scanning during immersion exposure. Further, the effect of suppressing elution of a substance (leaching) can be improved. It is presumed that one of the main reasons why these effects can be achieved is related to the hydrophobicity of the resist film. More specifically, it is presumed that, since an aqueous substance such as water is used as the immersion medium, higher hydrophobicity has an influence on the swift removal of the immersion medium from the surface of the resist film after the immersion exposure. The upper limit value of the receding angle is not particularly limited, and can be, for example, 90° or less.

For the same reasons as described above, with respect to a resist film formed using the positive resist composition of the present invention, it is particularly desirable that the static contact angle as measured prior to conducting exposure and development is 80 to 100°.

Further, with respect to a resist film formed using the positive resist composition of the present invention, the sliding angle as measured prior to exposure and development is preferably 25° or less, and more preferably 20° or less. When the sliding angle is no more than the upper limit of the above-mentioned range, the effect of suppressing the elution of a substance during immersion exposure is enhanced. The lower limit of the sliding angle is not particularly limited, and can be, for example, 5° or more.

Furthermore, with respect to a resist film formed using the positive resist composition of the present invention, the advancing angle as measured prior to exposure and development is preferably 80 to 100°, and more preferably 80 to 90°. When the advancing angle is within the above-mentioned range, various lithography properties can be improved, e.g., the risk of defect generation can be reduced.

The level of the above-mentioned various contact angles (static contact angle, dynamic contact angle and sliding angle) can be adjusted by the formulation of the positive resist composition, e.g., the type of the component (A1), the amount of the structural unit (a0) within the component (A), the type of the component (F1), the amount of the component (F1), and the like. For example, the larger the amount of the structural unit (a0) within the component (A) or the amount of the component (F1), the higher the hydrophobicity of the resist film formed. In particular, the receding angle becomes larger. Further, in particular, by adjusting the amount of the component (F1) and the amount of fluorine contained in the structural unit(s), the advancing angle can be adjusted (the smaller the amount of fluorine, the smaller the advancing angle).

In addition, by using the positive resist composition of the present invention, elution of a substance (leaching) from the resist film during immersion exposure can be suppressed.

As described above, immersion exposure is a method in which exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air. In immersion exposure, when the resist film comes into contact with the immersion medium, elution of substances within the resist film (component (B), component (D), and the like) into the immersion medium occurs. This elution of a substance causes phenomenon such as degeneration of the resist film and change in the refractive index of the immersion medium, thereby adversely affecting the lithography properties.

The amount of the eluted substance is affected by the properties of the resist film surface (e.g., hydrophilicity, hydrophobicity, and the like). Therefore, it is presumed that the amount of eluted substance can be reduced by enhancing the hydrophobicity of the resist film surface.

Since a resist film formed using the positive resist composition of the present invention includes the component (F1), the resist film exhibits high hydrophobicity prior to conducting exposure and developing, as compared to a resist composition which does not contain the component (F1). Thus, by the positive resist composition of the present invention, elution of a substance during immersion exposure can be suppressed.

Since elution of a substance can be suppressed, by using the positive resist composition of the present invention, phenomenon such as degeneration of the resist film and change in the refractive index of the immersion medium, which occur during immersion exposure, can be suppressed. Further, as variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

Moreover, the positive resist composition of the present invention contains the component (F1) including the structural unit (f1) having an alkali developing solution decomposable group.

In the present invention, for example, when the structural unit (f1) is a structural unit represented by the aforementioned general formula (f1-1), the "—O—R⁰" group in formula (f1-1) may be a group that is dissociable by the action of a base (alkali developing solution). Alternatively, the structural unit (f1) may be a structural unit represented by the aforementioned general formula (f1-1) in which the ester bond "—C(=O)—O—" in general formula (f1-0) is decomposable (hydrolyzable) by the action of a base (alkali developing solution) to form a hydrophilic group "—C(=O)—OH". In such a case, the component (F1) becomes decomposable in an alkali developing solution. The expression "decomposable in an alkali developing solution" means that the group is decomposable by the action of an alkali developing solution (preferably decomposable by action of a 2.38% by weight aqueous solution of tetramethylammonium hydroxide (TMAH) at 23° C.), and exhibits increased alkali solubility in the alkali developing solution. The component (F1) is a compound that is hardly soluble in an alkali developing solution prior to decomposition, and when the component (F1) is decomposed by action of the developing solution, a carboxy group which is a hydrophilic group is formed, thereby exhibiting increased solubility in the alkali developing solution.

By using the positive resist composition of the present invention containing the component (F1), a resist pattern can be formed which is hydrophobic prior to coining in contact with an alkali developing solution (e.g., during immersion exposure), and becomes hydrophilic during alkali developing. Especially when the portion hydrolyzed by the action of an alkali developing solution has a fluorine atom, because the portion containing a fluorine atom is dissociated, the effect for increasing the hydrophilicity is enhanced.

Furthermore, when the structural unit (f1) is block copolymerized, the portion containing a fluorine atom is localized, as compared to when the structural unit (f1) is random polymerized. As a result, hydrophobicity is enhanced prior to development, and after development, since the hydrophilic group formed by hydrolysis is localized, hydrophilicity is enhanced. Thus, the effect of enhancing hydrophilicity after development is further improved.

By using such a positive resist composition in which the hydrophilicity is enhanced during alkali developing, generation of defects during immersion exposure (especially defects caused by a deposit generated after the development process) can be effectively suppressed. The reasons for these effects are explained below.

In an immersion exposure process, it is preferable to enhance the hydrophobicity of the resist film so as to prevent the resist film from being affected by the immersion medium such as water.

However, when the hydrophobicity of the resist film is high, it is disadvantageous in that the risk of defects caused by a deposit generated after the development process becomes high. The reason for this is that the deposit is a residue which was not washed off the resist film by the hydrophilic developing solution and remaining on the resist film. Since this deposit is hydrophobic, the deposit becomes easier to be adhered to the resist film as the hydrophobicity of the resist film becomes higher.

In view of the above, the resist film is required to be hydrophobic during immersion exposure and become hydrophilic during alkali developing.

As described above, the component (F1) according to the present invention is decomposable by an alkali developing solution. Therefore, it becomes possible to form a resist film that is hydrophobic prior to coming in contact with an alkali developing solution (e.g., during immersion exposure), and becomes hydrophilic during alkali developing.

In the conventional techniques, when a resist film exhibits high hydrophobicity, defects (e.g., water mark defects caused by the immersion medium such as water or an alkali developing solution and other defects including bridge-type defects and "Not Open" defects in which portion of, or all of, a hole pattern is not open) are likely to be formed on the surface of resist patterns following developing. In contrast, because a resist film formed using the resist composition of the present invention exhibits increased hydrophilicity after alkali developing, it becomes possible to reduce the occurrence of these defects. Moreover, the effect of enhancing hydrophilicity after development is not limited to immersion exposure, and is effective in improving defects in any exposure process including a development step using an alkali developing solution.

Thus, the positive resist composition of the present invention is capable of effectively reducing defects (especially defects caused by a deposit generated after the development process), and is very useful in an immersion exposure process.

Further, when the component (F1) has a structural unit represented by general formula (f1-1) for example, since the structural unit has a carbonyloxy group (—C(=O)—O—) exhibiting a relatively high polarity, the component (F1) exhibits improved compatibility with other components of the resist composition. Therefore, the positive resist composition of the present invention is expected to exhibit improved stability over time.

In addition, a resist film formed using the positive resist composition of the present invention hardly swells due to being exposed to water. Therefore, a very fine resist pattern can be formed with a high precision.

Also, the positive resist composition of the present invention exhibits excellent lithography properties with respect to sensitivity, resolution, etching resistance and the like, and is capable of forming a resist pattern without any practical problems when used as a resist for immersion exposure. For example, by using the positive resist composition of the present invention, a very fine resist pattern with a size of 65 nm or smaller can be formed. Thus, the positive resist composition of the present invention exhibits excellent lithography properties, and is capable of forming a resist pattern without any practical problems when used as a resist for immersion exposure. More specifically, the positive resist composition of the present invention exhibits not only excellent lithography properties generally required (sensitivity, resolution, etching resistance, and the like), but also excellent properties required for a resist material used in immersion exposure (hydrophobicity, ability of suppressing elution of a substance, water tracking ability, and the like). Therefore, the positive resist composition of the present invention is preferable for use in immersion exposure.

Furthermore, by virtue of the aforementioned features, the fluorine-containing polymeric compound (F1) is useful as an additive for a resist composition.

There are no particular limitations on the resist composition containing the added fluorine-containing compound, although a chemically amplified resist composition including a base component that exhibits changed solubility in an alkali developing solution under the action of acid, and an acid generator component that generates acid upon irradiation is ideal.

EXAMPLES

Synthesis of Fluorine-Containing Compound Component (F)

The fluorine-containing polymeric compounds used as the fluorine-containing compound component (F) in the present examples were synthesized in accordance with the following polymer synthesis examples.

Synthesis Example 1

Synthesis of Fluorine-Containing Compound (1)

(i) Synthesis of compound (1)-2
61 g (600 mmol) of triethylamine and 64 g (418 mmol) of methyl bromoacetate were added to 300 ml of a THF solution containing 30 g (348 mmol) of methacrylic acid in a nitrogen atmosphere at 0° C., and the temperature was elevated to room temperature, followed by stirring for 3 hours. After conducting thin-layer chromatography (TLC) to confirm that the raw materials had dissipated, the reaction solution was subjected to distillation under reduced pressure to remove the solvent. Then, water was added to the resultant, and extraction was conducted with ethyl acetate three times. The resulting organic phase was washed with water twice, and then subjected to distillation under reduced pressure to remove the solvent, thereby obtaining 47 g of a compound (1)-1 in the form of a colorless liquid (yield: 85%).

Subsequently, 700 ml of a THF solution containing 30 g (190 mmol) of the compound (1)-1 was prepared, and 700 ml of a 2.38% by weight aqueous solution of TMAH was added thereto, followed by stirring at room temperature for 3 hours. After conducting thin-layer chromatography (TLC) to confirm that the raw materials had dissipated, THY was distilled off under reduced pressure. Then, the resulting aqueous reaction solution was cooled to 0° C., and 50 ml of a 10N hydrochloric acid was added thereto to render the aqueous reaction solution acidic, followed by extraction with ethyl acetate three times. The resulting organic phase was washed with water twice, and the solvent was distilled off under reduced pressure, thereby obtaining 26 g of a compound (1)-2 shown below in the form of a colorless liquid (yield: 95%).

[Chemical Formula 83]

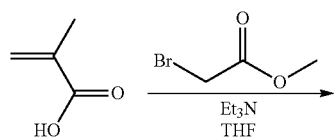

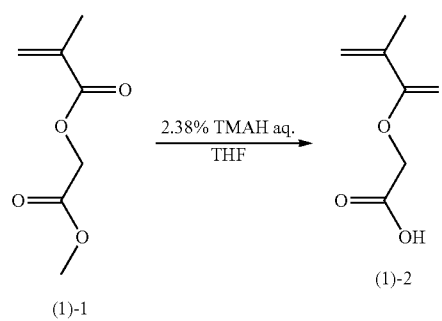

The obtained compounds (1)-1 and (1)-2 were analyzed by $^1$H-NMR. The results are shown below.

Spectrum Data of Compound (1)-1

$^1$H-NMR(CDCl$_3$) 6.23 (s, 1H, Hb), 5.67 (d, 1H, Hb), 4.13 (s, 2H, Hc), 3.78 (s, 3H, Hd), 2.00 (s, 3H, Ha)

Spectrum Data of Compound (1)-2

$^1$H-NMR(CDCl$_3$) 6.23 (s, 1H, Hb), 5.67 (d, 1H, Hb), 4.69 (s, 2H, Hc), 2.00 (s, 3H, Ha)

[Chemical Formula 84]

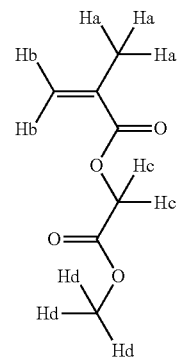

(1)-1

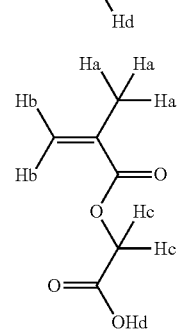

(1)-2

(ii) Synthesis of Fluorine-Containing Compound (1)

26 g (180.39 mmol) of a compound (1)-2 was added to 200 ml of a THF solution containing 23.48 g (234.5 mmol) of 2,2,2-trifluoroethanol, 51.9 g (270.6 mmol) of ethyldiisopropylaminocarbodiimide (EDCl) hydrochloride and 0.11 g (0.9 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had dissipated, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 25 g of a fluorine-containing compound (1) shown below in the form of a colorless liquid.

[Chemical Formula 85]

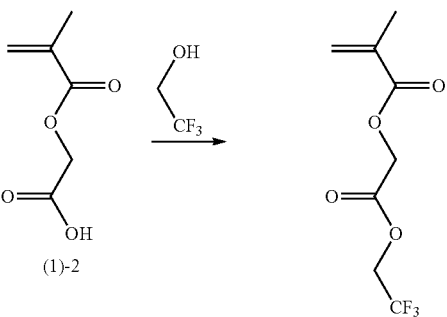

Fluorine-containing compound (1)

The obtained fluorine-containing compound (1) was analyzed by $^1$H-NMR. The results are shown below.

$^1$H-NMR (CDCl$_3$) 6.24 (s, 1H, Hb), 5.70 (s, 1H, Hb), 4.80 (s, 2H, Hc), 4.60-4.51 (m, 2H, Hd), 1.99 (s, 3H, Ha)

From the results shown above, it was confirmed that the fluorine-containing compound (1) had a structure shown below.

[Chemical Formula 86]

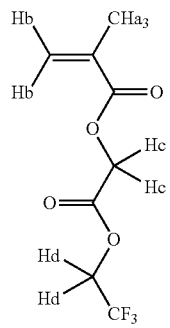

Synthesis Example 2

Synthesis of Fluorine-Containing Compound (2)

25 g (125 mmol) of a compound (2-1) shown below was added to 200 ml of a THF solution containing 30.1 g (200 mmol) of 2,2,3,3,3-pentafluoropropanol, 47.9 g (250 mmol) of ethyldiisopropylaminocarbodiimide (EDCI) hydrochloride and 1.0 g of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had dissipated, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 22 g of a fluorine-containing compound (2) shown below in the form of a colorless liquid.

[Chemical Formula 87]

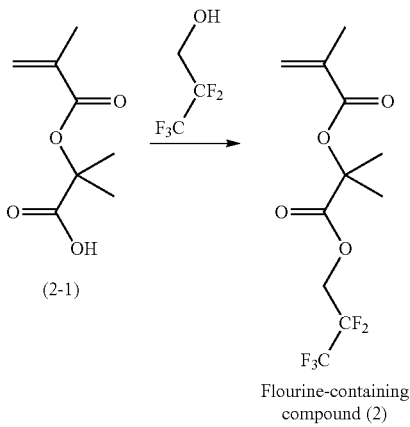

Flourine-containing compound (2)

The obtained fluorine-containing compound (2) was analyzed by $^1$H-NMR. The results are shown below.

$^1$H-NMR (CDCl$_3$)[ppm]: 6.16 (s, 1H, Hb), 5.50 (s, 1H, Hb), 4.57 (t, 2H, Hd), 1.92 (s, 3H, Ha), 1.65 (s, 6H, Hc)

[Chemical Formula 88]

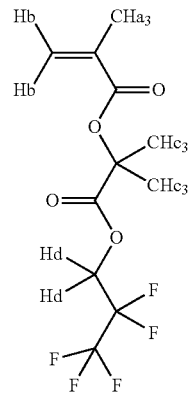

Synthesis Example 3

Synthesis of Fluorine-Containing Polymeric Compound (1): Synthesis of Block Copolymer In a glove box purged with nitrogen, 0.333 g of ethyl-2-methyl-2-butyltellanyl-propionate, 0.205 g of dibutyltellunide, 0.091 g of azobisisobutyronitrile, 9.96 g of the fluorine-containing compound (1) and 12.17 g of 1,4-dioxane were added to a reaction vessel, and a polymerization reaction was performed at 65° C. for 10 hours.

Subsequently, a mixture containing 10.04 g of a compound (5) shown below, 12.27 g of 1,4-dioxane and 0.023 g of azobisbutyronitrile was dropwise added to the reaction system, and the reaction was continued for 12 hours.

Thereafter, 22.23 g of 1,4-dioxane was added thereto, and the reaction mixture was heated to 80° C. while stirring. While maintaining the temperature at 80° C., a mixed solution containing 4.02 g of 1,4-dioxane and 2.01 g of a 30% oxygenated water was dropwise added thereto over 1 hour. After the dropwise addition, the resultant was stirred at 80° C. for 12 hours.

The reaction solution was cooled, and diluted with 91 g of ethyl acetate. Then, the organic phase was washed with 55 g of a 3% aqueous oxalic acid in a separatory funnel, followed by washing with 55 g of ion exchanged water 4 times to wash the organic phase with a total of 220 g of ion exchanged water. The resultant was poured to 1,000 g of a hexane solution of the organic phase, and the formed precipitate was separated by filtration. The collected precipitate was dried under reduced pressure, thereby obtaining 14.3 g of the desired fluorine-containing polymeric compound shown below.

The obtained polymer was analyzed by GPC. As a result, it was found that Mn=12,500, and Mw/Mn=1.38.

Further, as a result of C-NMR analysis, it was found that the polymer compositional ratio was $f_{111}:f_2=49:51$

[Chemical Formula 89]

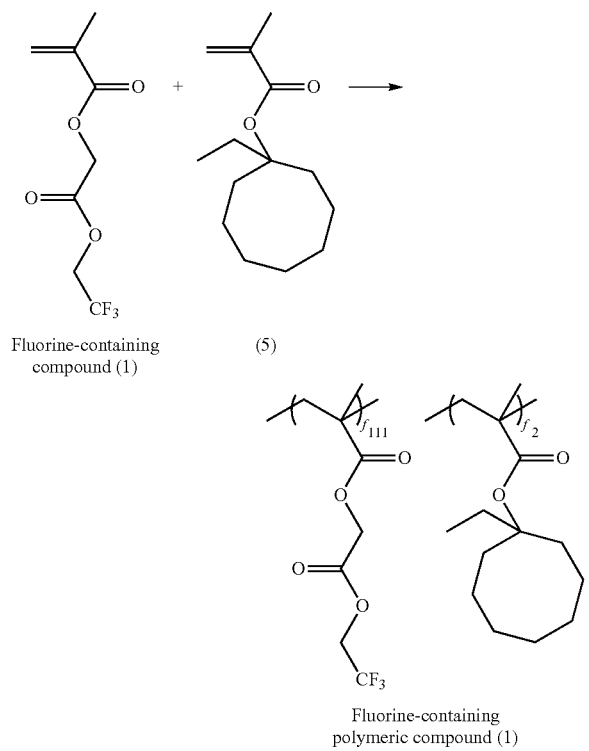

Fluorine-containing compound (1)     (5)

Fluorine-containing polymeric compound (1)

Synthesis Example 4

Synthesis of Fluorine-Containing Polymeric Compound (2): Synthesis of Partial Block Copolymer In a glove box purged with nitrogen, 0.345 g of ethyl-2-methyl-2-butyltellanyl-propionate, 0.212 g of dibutyltellunide, 0.094 g of azobisisobutyronitrile, 6.93 g of the fluorine-containing compound (1) and 8.47 g of 1,4-dioxane were added to a reaction vessel, and a polymerization reaction was performed at 65° C. for 5 hours.

Subsequently, a mixture containing 11.45 of the compound (1), 4.62 g of the compound (5), 19.64 g of 1,4-dioxane and 0.024 g of azobisbutyronitrile was dropwise added to the reaction system, and the reaction was continued for 17 hours.

Thereafter, 22.23 g of 1,4-dioxane was added thereto, and the reaction mixture was heated to 80° C. while stirring. While maintaining the temperature at 80° C., a mixed solution containing 3.63 g of 1,4-dioxane and 1.81 g of a 30% oxygenated water was dropwise added thereto over 1 hour. After the dropwise addition, the resultant was stirred at 80° C. for 12 hours.

The reaction solution was cooled, and diluted with 105 g of ethyl acetate. Then, the organic phase was washed with 64 g of a 3% aqueous oxalic acid in a separatory funnel, followed by washing with 64 g of ion exchanged water 4 times to wash the organic phase with a total of 256 g of ion exchanged water. The resultant was poured to 1,150 g of a hexane solution of the organic phase, and the formed precipitate was separated by filtration. The collected precipitate was dried under reduced pressure, thereby obtaining 10.0 g of the desired fluorine-containing polymeric compound (2) shown below.

The obtained polymer was analyzed by GPC. As a result, it was found that Mn=15,900, and Mw/Mn=1.14.

Further, as a result of C-NMR analysis, it was found that the polymer compositional ratio was $f_{111}:f_2=41:59$

[Chemical Formula 90]

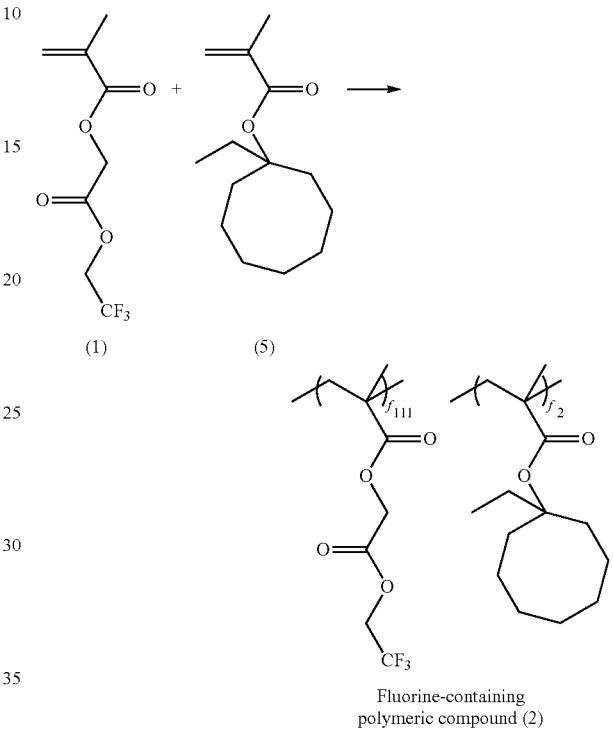

(1)     (5)

Fluorine-containing polymeric compound (2)

Synthesis Example 5

Synthesis for Comparative Example 20.00 g (88.44 mmol) of the fluorine-containing compound (1) and 6.60 g (29.48 mmol) of the compound (5) were added to a three-necked flask equipped with a thermometer and a reflux tube and were dissolved by adding 39.90 g of tetrahydrofuran thereto. Then, 23.58 mmol of dimethyl 2,2'-azobis (isobutyrate) (V-601) as a polymerization initiator was added and dissolved in the resulting solution. The resulting solution was dropwise added to 22.17 g of tetrahydrofuran that was heated to 67° C. under a nitrogen atmosphere over 3 hours, and was then subjected to a polymerization reaction. The resulting reaction solution was heated while stirring for 4 hours, and then cooled to room temperature. The resulting polymer solution was dropwise added to an excess amount of n-heptane to precipitate a polymer. Then, the precipitated polymer was separated by filtration, followed by washing and drying, thereby obtaining 13 g of a fluorine-containing polymeric compound (11) shown below as an objective compound.

With respect to the fluorine-containing polymeric compound (11), the weight average molecular weight and the dispersity were determined by the polystyrene equivalent value as measured by gel permeation chromatography (GPC). As a result, it was found that the weight average molecular weight (Mw) was 13,800, and the dispersity (Mw/Mn) was 1.50. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was $f_{111}/f_2=77.6/22.4$.

[Chemical Formula 91]

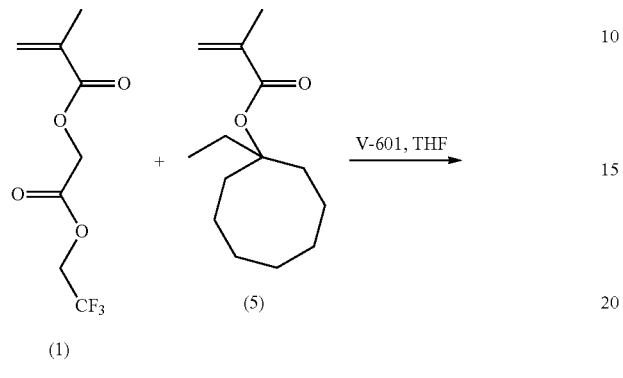

(1)  (5)

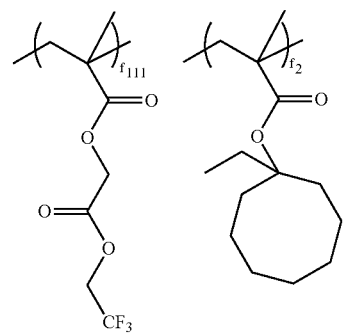

Flourine-containing
polymeric compound (11)

Each polymeric compound shown in Table 1 were synthesized in the manner as described above.

TABLE 1

| | Synthesis method | Block synthesis portion | | Random synthesis portion | | Mw | Mw/Mn |
|---|---|---|---|---|---|---|---|
| Fluorine-containing polymeric compound 1 | Synthesis Example 3 | Fluorine-containing compound (1) [80.2] | Compound (5) [19.8] | | | 17000 | 1.54 |
| Fluorine-containing polymeric compound 2 | Synthesis Example 3 | Fluorine-containing compound (1) [51] | Compound (5) [49] | | | 12500 | 1.38 |
| Fluorine-containing polymeric compound 3 | Synthesis Example 3 | Fluorine-containing compound (1) [20.4] | Compound (5) [79.6] | | | 14000 | 1.28 |
| Fluorine-containing polymeric compound 4 | Synthesis Example 3 | Fluorine-containing compound (2) [80.5] | Compound (5) [19.5] | | | 16000 | 1.40 |
| Fluorine-containing polymeric compound 5 | Synthesis Example 4 | Fluorine-containing compound (1) [60.1] | | Compound (5) [19.5] | Fluorine-containing compound (1) [20.4] | 16000 | 1.14 |
| Fluorine-containing polymeric compound 6 | Synthesis Example 4 | Fluorine-containing compound (1) [76.3] | | Compound (5) [15.8] | Compound (6) [7.9] | 17500 | 1.48 |
| Fluorine-containing polymeric compound 7 | Synthesis Example 4 | Fluorine-containing compound (1) [33.1] | | Compound (5) [46.8] | Compound (7) [20.1] | 15500 | 1.27 |
| Fluorine-containing polymeric compound 8 | Synthesis Example 4 | Fluorine-containing compound (1) [26] | | Compound (5) [50.3] | Compound (8) [23.5] | 15000 | 1.24 |
| Fluorine-containing polymeric compound 9 | Synthesis Example 3 | Fluorine-containing compound (3) [75.6] | Compound (5) [24.4] | | | 16000 | 1.31 |
| Fluorine-containing polymeric compound 10 | Synthesis Example 3 | Fluorine-containing compound (4) [80.6] | Compound (5) [19.4] | | | 17000 | 1.35 |
| Fluorine-containing polymeric compound 11 | Synthesis Example 5 | | | Fluorine-containing compound (1) [76.8] | Compound (5) [23.2] | 18000 | 1.59 |

In Table 1, the reference characters indicate the following. Further, the values in brackets [ ] indicate the amount (mol %) of the respective structural units.

Compounds (3), (4), (6) to (8): compounds represented by chemical formulas shown below

[Chemical Formula 92]

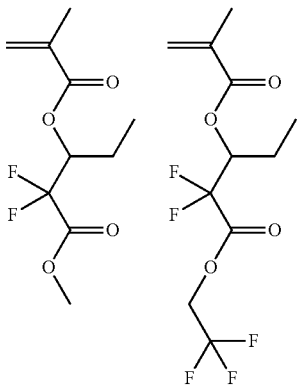

Fluorine-containing compound (3)   Fluorine-containing compound (4)

[Chemical Formula 93]

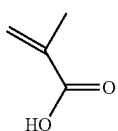

Compound (6)

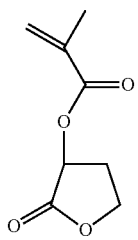

Compound (7)

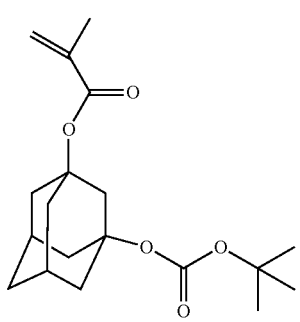

Compound (8)

Examples 1 to 14, Comparative Examples 1 to 5

The components shown in Tables 2 and 3 were mixed together and dissolved to obtain positive resist compositions.

TABLE 2

| | Component (A) | Component (B) | Component (D) | Component (F) | Component (S) | |
|---|---|---|---|---|---|---|
| Ex. 1 | (A)-1 [100] | (B)-1 [10] | (D)-1 [0.3] | (F)-1 [0.5] | (S)-1 [2500] | (S)-2 [10] |
| Ex. 2 | (A)-1 [100] | (B)-1 [10] | (D)-1 [0.3] | (F)-1 [1] | (S)-1 [2500] | (S)-2 [10] |
| Ex. 3 | (A)-1 [100] | (B)-1 [10] | (D)-1 [0.3] | (F)-1 [3] | (S)-1 [2500] | (S)-2 [10] |
| Ex. 4 | (A)-1 [100] | (B)-1 [10] | (D)-1 [0.3] | (F)-1 [100] | (S)-1 [2500] | (S)-2 [10] |
| Ex. 5 | (A)-1 [100] | (B)-1 [10] | (D)-1 [0.3] | (F)-2 [0.5] | (S)-1 [2500] | (S)-2 [10] |
| Ex. 6 | (A)-1 [100] | (B)-1 [10] | (D)-1 [0.3] | (F)-2 [1] | (S)-1 [2500] | (S)-2 [10] |
| Ex. 7 | (A)-1 [100] | (B)-1 [10] | (D)-1 [0.3] | (F)-2 [3] | (S)-1 [2500] | (S)-2 [10] |
| Ex. 8 | (A)-1 [100] | (B)-1 [10] | (D)-1 [0.3] | (F)-2 [100] | (S)-1 [2500] | (S)-2 [10] |
| Ex. 9 | (A)-1 [100] | (B)-1 [10] | (D)-1 [0.3] | (F)-5 [3] | (S)-1 [2500] | (S)-2 [10] |
| Ex. 10 | (A)-1 [100] | (B)-1 [10] | (D)-1 [0.3] | (F)-6 [3] | (S)-1 [2500] | (S)-2 [10] |
| Ex. 11 | (A)-1 [100] | (B)-1 [10] | (D)-1 [0.3] | (F)-7 [3] | (S)-1 [2500] | (S)-2 [10] |
| Ex. 12 | (A)-1 [100] | (B)-1 [10] | (D)-1 [0.3] | (F)-9 [3] | (S)-1 [2500] | (S)-2 [10] |
| Ex. 13 | (A)-1 [100] | (B)-1 [10] | (D)-1 [0.3] | (F)-10 [3] | (S)-1 [2500] | (S)-2 [10] |
| Comp. Ex. 1 | (A)-1 [100] | (B)-1 [10] | (D)-1 [0.3] | — | (S)-1 [2500] | (S)-2 [10] |
| Comp. Ex. 2 | (A)-1 [100] | (B)-1 [10] | (D)-1 [0.3] | (F)-11 [0.5] | (S)-1 [2500] | (S)-2 [10] |
| Comp. Ex. 3 | (A)-1 [100] | (B)-1 [10] | (D)-1 [0.3] | (F)-11 [1] | (S)-1 [2500] | (S)-2 [10] |
| Comp. Ex. 4 | (A)-1 [100] | (B)-1 [10] | (D)-1 [0.3] | (F)-11 [3] | (S)-1 [2500] | (S)-2 [10] |

TABLE 3

| | Component (A) | | Component (B) | | Component (D) | Component (F) | Component (S) | |
|---|---|---|---|---|---|---|---|---|
| Ex. 14 | (A)-2 [85] | (A)-3 [15] | (B)-2 [6.7] | (B)-3 [2.6] | (D)-1 [0.6] | (F)-1 [3] | (S)-1 [2500] | (S)-2 [10] |
| Comp. Ex. 5 | (A)-2 [85] | (A)-3 [15] | (B)-2 [6.7] | (B)-3 [2.6] | (D)-1 [0.6] | (F)-11 [3] | (S)-1 [2500] | (S)-2 [10] |

In Tables 2 and 3, the reference characters indicate the following. Further, the values in brackets [ ] indicate the amount (in terms of parts by weight) of the component added.

(A)-1: a copolymer represented by chemical formula (A)-1 shown below, having an Mw of 8,000 and Mw/Mn of 1.65. In the formula, the subscript numerals shown to the bottom right of the parentheses ( ) indicate the percentage (mol %) of the respective structural units within the copolymer.

(A)-2: a copolymer represented by chemical formula (A)-2 shown below, having an Mw of 10,000 and Mw/Mn of 1.70. In the formula, the subscript numerals shown to the bottom right of the parentheses ( ) indicate the percentage (mol %) of the respective structural units within the copolymer.

(A)-3: a copolymer represented by chemical formula (A)-3 shown below, having an Mw of 7,000 and Mw/Mn of 1.65. In the formula, the subscript numerals shown to the bottom right of the parentheses ( ) indicate the percentage (mol %) of the respective structural units within the copolymer.

(B)-1: a compound represented by chemical formula (B)-1 shown below.

(B)-2: a compound represented by chemical formula (B)-2 shown below (B)-3: a compound represented by chemical formula (B)-3 shown below (D)-1: tri-n-pentylamine (S)-1: a mixed solvent of PGMEA/PGME=6/4 (weight ratio)

(S)-2: γ-butyrolactone (F)-1: the aforementioned [fluorine-containing polymeric compound 1]

(F)-2: the aforementioned [fluorine-containing polymeric compound 2]

(F)-3: the aforementioned [fluorine-containing polymeric compound 3]

(F)-4: the aforementioned [fluorine-containing polymeric compound 4]

(F)-5: the aforementioned [fluorine-containing polymeric compound 5]

(F)-6: the aforementioned [fluorine-containing polymeric compound 6]

(F)-7: the aforementioned [fluorine-containing polymeric compound 7]

(F)-8: the aforementioned [fluorine-containing polymeric compound 8]

(F)-9: the aforementioned [fluorine-containing polymeric compound 9]

(F)-10: the aforementioned [fluorine-containing polymeric compound 10]

(F)-11: the aforementioned [fluorine-containing polymeric compound 11]

(D)-1: tri-n-pentylamine (S)-1: a mixed solvent of PGMEA/PGME=6/4 (weight ratio)

(S)-2: γ-butyrolactone

[Chemical Formula 94]

(A)-1

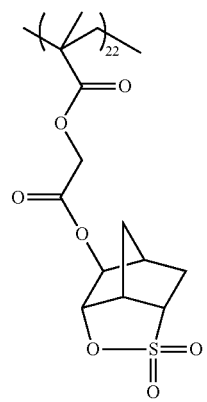
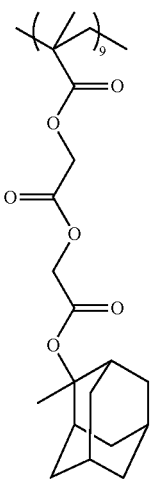
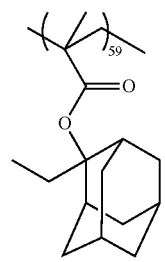

-continued

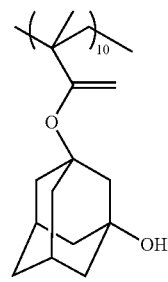

[Chemical Formula 95]

(A)-2

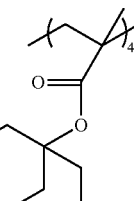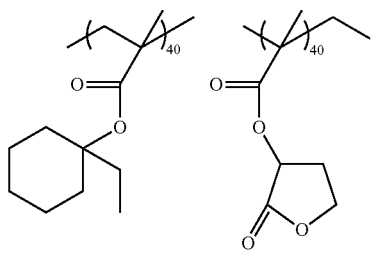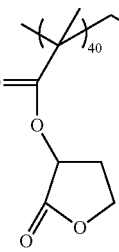

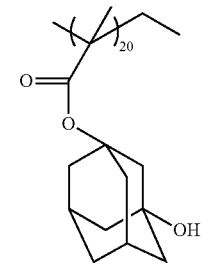

[Chemical Formula 96]

(A)-3

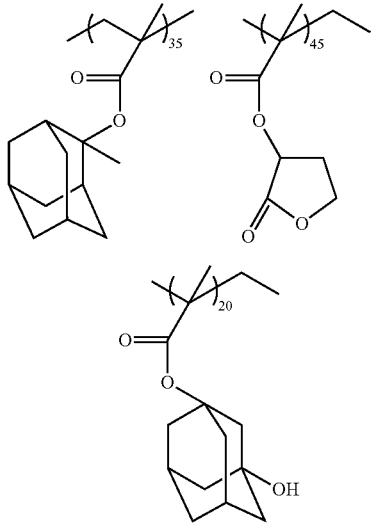

[Chemical Formula 97]

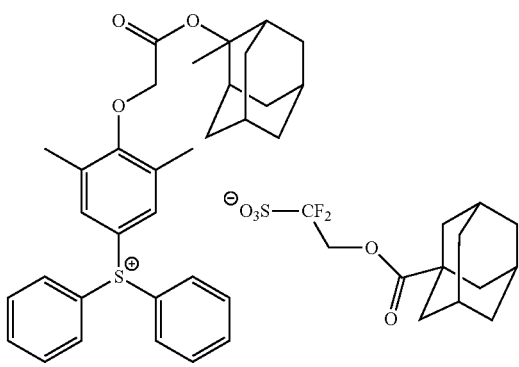

(B)-1

[Chemical Formula 98]

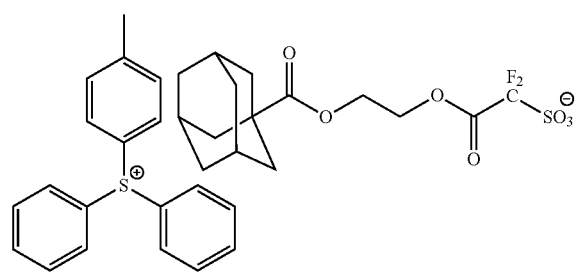

(B)-2

[Chemical Formula 99]

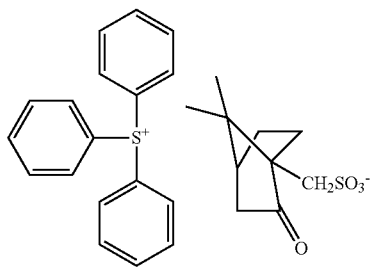

(B)-3

[Measurement of Contact Angle of Resist Film]

Using a spinner, each resist composition solution obtained in Examples 1 to 13 and Comparative Examples 1 to 4 was applied to an 8-inch silicon wafer that had been treated with hexamethyldisilazane (HMDS), and the solution was then prebaked and dried on a hotplate at 110° C. for 60 seconds, thus forming a resist film with a film thickness of 100 nm.

A water droplet was dripped onto the surface of each resist film (the resist film prior to exposure), and a DROP MASTER-700 apparatus (product name; manufactured by Kyowa Interface Science Co. Ltd.) was used to measure the static contact angle and dynamic contact angle (receding angle) (contact angle measurement: water 2 μl). The measured value was defined as the "contact angle after application (°)".

Following measurement of the contact angle, the wafer was subjected to an alkali developing treatment for 30 seconds at 23° C. in a 2.38% by weight aqueous solution of tetramethylammonium hydroxide (TMAH). The wafer was then rinsed with pure water for 15 seconds, followed by drying by shaking. Subsequently, the contact angles were measured in the same manner as described above. The measured values were defined as the "contact angle (°) after development".

The results are shown in Table 4.

TABLE 4

| | Contact angle after application | | Contact angle after development | |
|---|---|---|---|---|
| | Static contact angle (°) | Receding angle (°) | Static contact angle (°) | Receding angle (°) |
| Comp. Ex. 1 | 72.8 | 61.7 | 70 | 52.8 |
| Comp. Ex. 2 | 80.8 | 68.3 | 63.4 | 36.8 |
| Comp. Ex. 3 | 84 | 71.7 | 60.9 | 28.9 |
| Comp. Ex. 4 | 88.8 | 74 | 59.5 | 29 |
| Comp. Ex. 5 | 88.2 | 73.5 | 59.2 | 28.6 |
| Ex. 1 | 81.2 | 71.2 | 49.1 | 23.4 |
| Ex. 2 | 83.7 | 72.2 | 47.8 | 21.2 |
| Ex. 3 | 86.5 | 75.2 | 45.6 | 16.9 |
| Ex. 4 | 88.7 | 71.4 | 46.5 | 16.4 |
| Ex. 5 | 80.5 | 68.5 | 60.3 | 29.7 |
| Ex. 6 | 82.8 | 70 | 59.2 | 28.3 |
| Ex. 7 | 87.5 | 74.5 | 50.3 | 20 |
| Ex. 8 | 88.2 | 71.7 | 50.2 | 17.6 |
| Ex. 9 | 85.6 | 70.1 | 47.6 | 23.1 |
| Ex. 10 | 86.3 | 74.3 | 52.4 | 25.8 |
| Ex. 11 | 82.6 | 68.3 | 53.9 | 25.6 |
| Ex. 12 | 87.6 | 74.5 | 48.1 | 23.1 |
| Ex. 13 | 92.7 | 84.8 | 52.5 | 25.8 |
| Ex. 14 | 88.4 | 74.1 | 45.6 | 16.4 |

As is evident from the above results shown in Table 4, the resist films formed using the resist compositions of Examples 1 to 13 which included the fluorine-containing polymeric compounds according to the present invention exhibited a high contact angle prior to development, as compared to the resist films formed using the resist compositions of Comparative Examples 1 to 4 which did not include the fluorine-containing polymeric compound. Therefore, it was found that by virtue of including a fluorine-containing compound of the present invention, the hydrophobicity of the resist film is enhanced. As a result, it is expected that not only can the water tracking ability during immersion exposure using a scanning-type immersion exposure apparatus be improved, but also elution of a substance can be suppressed. Further, from the results of decrease in the contact angle and receding angle after development, it was confirmed that hydrophilicity is enhanced.

[Formation of Resist Pattern]

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Then, each of the resist compositions of Examples 14 and Comparative Example 5 was applied onto the anti-reflection film using a spinner, and was then prebaked (PAB) on a hotplate at 110° C. for 60 seconds and dried, thereby forming a resist film having a film thickness of 100 nm.

Subsequently, the resist film was selectively irradiated with an ArF excimer laser (193 nm) through a mask pattern, using an ArF immersion exposure apparatus NSR-S609B (manufactured by Nikon Corporation, NA (numerical aperture)= 1.07, σ0.97). Thereafter, a post exposure bake (PEB) treatment was conducted at 100° C. for 60 seconds, followed by alkali development at 23° C. in a 2.38% by weight aqueous solution of tetramethylammonium hydroxide (TMAH), wherein the development time was varied from 5 to 60 seconds. Then, the resist was washed for 30 seconds with pure water, followed by drying by shaking.

[Defect]

Subsequently, a surface defect inspection device KLA2371 (a product name) manufactured by KLA Tencor Corporation was used to observe the surface of the abovementioned resist pattern, to thereby determine the number of defects on the surface of resist portions (unexposed portions) within the substrate. With respect to the number of defects described above, those compositions with not more than 1,000 defects were evaluated as "A", those compositions with 1,001 to 10,000 defects were evaluated as "B", and those compositions with 10,001 or more defects were evaluated as "C". The results are shown in Table 5.

TABLE 5

| | Development time | | | | |
|---|---|---|---|---|---|
| | 5 sec | 10 sec | 20 sec | 30 sec | 60 sec |
| Comp. Ex. 2 | C | C | C | B | A |
| Comp. Ex. 5 | C | C | C | B | A |
| Ex. 1 | C | B | A | A | A |
| Ex. 9 | C | B | A | A | A |
| Ex. 14 | C | B | A | A | A |

As is evident from the above results shown in Table 5, the resist film formed using the resist composition of Example 14 which included the fluorine-containing polymeric compound according to the present invention exhibited an excellent effect of reducing defects especially in a short-time development, as compared to the resist film formed using the resist composition of Comparative Example 5 which did not include the fluorine-containing polymeric compound.

From the results shown above, it was confirmed that the fluorine-containing polymeric compound of the present invention is useful as an additive for an immersion exposure resist composition, and also useful as an additive for improving defects.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a fluorine-containing polymeric compound (F) which contains a structural unit (f1) represented by general formula (f1-1) shown below as a block copolymer portion, a base component (A) that exhibits increased solubility in an alkali developing solution under the action of acid, and an acid generator component (B) that generates acid upon exposure:

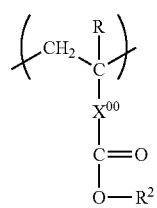

(f1-1)

wherein R represents a hydrogen atom, an alkyl group of 1 to 5 carbon atoms or a halogenated alkyl group of 1 to 5 carbon atoms; $X^{00}$ represents a divalent linking group which may have a substituent; and $R^2$ represents a fluorinated hydrocarbon group which may have a substituent.

2. The positive resist composition according to claim 1, wherein the structural unit (f1) is a structural unit represented by general formula (f1-1-1) or (f1-1-2) shown below:

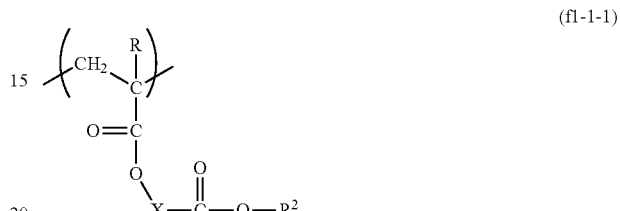

(f1-1-1)

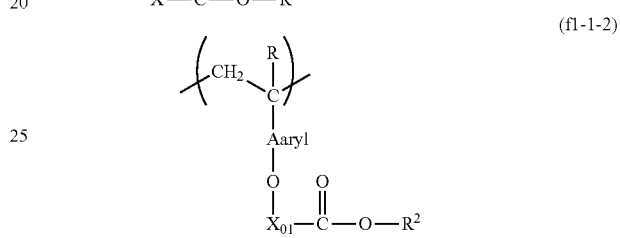

(f1-1-2)

wherein each R independently represents a hydrogen atom, an alkyl group of 1 to 5 carbon atoms or a halogenated alkyl group of 1 to 5 carbon atoms; X represents a divalent linking group which may have a substituent; $A_{aryl}$ represents a divalent aromatic group which may have a substituent; $X^{01}$ represents a single bond or a divalent linking group which may have a substituent; and $R^2$ represents a fluorinated hydrocarbon group which may have a substituent.

3. The positive resist composition according to claim 1, wherein the base component (A) comprises a resin component (A1) comprised of a structural unit (a1) derived from an acrylate ester containing an acid dissociable, dissolution inhibiting group.

4. The positive resist composition according to claim 3, wherein the resin component (A1) further comprises a structural unit (a2) derived from an acrylate ester containing a lactone-containing cyclic group.

5. The positive resist composition according to claim 3, wherein the resin component (A1) further comprises a structural unit (a3) derived from an acrylate ester containing a polar group-containing aliphatic hydrocarbon group.

6. The positive resist composition according to claim 1, which further comprises a nitrogen-containing organic compound (D).

7. A method of forming a resist pattern, comprising: using a positive resist composition of claim 1 to from a resist film on a substrate; conducting exposure of the resist film; and alkali-developing the resist film to form a resist pattern.

* * * * *

UNITED STATES PATENT AND TRADEMARK OFFICE
CERTIFICATE OF CORRECTION

PATENT NO. : 8,404,428 B2
APPLICATION NO. : 12/824089
DATED : March 26, 2013
INVENTOR(S) : Matsumiya et al.

Page 1 of 3

It is certified that error appears in the above-identified patent and that said Letters Patent is hereby corrected as shown below:

On the Title Page Item [56], Column 2, Line 34, under Other Publications, delete "Lithograhy," and insert --Lithography,-- therefor.

In the Specifications

Column 18, Line 10 (approx.), delete "include" and insert --include:-- therefor.

Column 20, Line 33, delete "$R^{'4}$" and insert --$R^{14}$-- therefor.

Column 20, Line 37, delete "formulas (I-1)" and insert --formulas (1-1)-- therefor.

Column 24, Line 27, delete "heteratom," and insert --heteroatom,-- therefor.

Column 25, Line 58, delete "As $R^1$, $R^{2'}$," and insert --As $R^{1'}$, $R^{2'}$,-- therefor.

Column 37, Lines 13-24 (approx.) (Structure (a1-2-24)), delete "  " and insert -- -- therefor.

Column 53, Line 14, delete "in the" and insert --In the-- therefor.

Column 60, Line 43, delete "β-propiolatone," and insert --β-propiolactone,-- therefor.

Column 74, Line 19 (approx.), delete "(a-4-1)" and insert --(a4-1)-- therefor.

Column 70, Line 20 (approx.), delete "(a-4-5)" and insert --(a4-5)-- therefor.

Column 76, Line 19, delete "[—$CH_2)_6$—]." and insert --[—$(CH_2)_6$—].-- therefor.

Signed and Sealed this
Eleventh Day of March, 2014

Michelle K. Lee
*Deputy Director of the United States Patent and Trademark Office*

CERTIFICATE OF CORRECTION (continued)
U.S. Pat. No. 8,404,428 B2

Column 78, Line 45, delete "include" and insert --include.-- therefor.

Column 81, Line 57, delete "dicyclohexylcarboxylmide" and insert --dicyclohexylcarboxyimide-- therefor.

Column 85, Line 38, delete "—C(O)—(O)g-" and insert -- —C(=O)—(O)g— -- therefor.

Column 106, Line 58, delete "allyl" and insert --alkyl-- therefor.

Column 114, Lines 25-32 (approx.) (Structure (f1-1-2)),

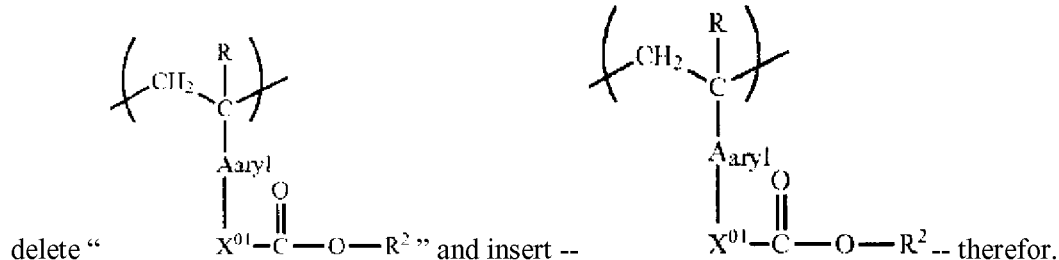

Column 114, Line 67, delete "1 to carbon" and insert --1 to 5 carbon-- therefor.

Column 115, Lines 45-48, delete "Specific examples............]." and insert the same on Col. 115, Line 44 after "preferable." as a continuation of the same paragraph.

Column 116, Line 36, delete "13 $NR^{004}$" and insert -- —$NR^{004}$.-- therefor.

Column 117, Line 5, delete "(—O—C(=O))—O—)," and insert -- —(—O—C(=O)—O—),-- therefor.

Column 123, Line 62, delete "(f-1-01-25) and (f-1-01-26)," and insert --(f1-01-25) and (f1-01-26),-- therefor.

Column 131, Line 57, delete "(1-01-17)" and insert --(f1-01-17)-- therefor.

Column 132, Line 5, delete "-$A_{aryl}$-$X_{01}$—" and insert -- -$A_{aryl}$-$X^{01}$— -- therefor.

Column 132, Line 6 (approx.), delete "and $X_{01}$" and insert --and $X^{01}$-- therefor.

Column 132, Lines 32-36 (approx.) (Structure (f1-01-20)),

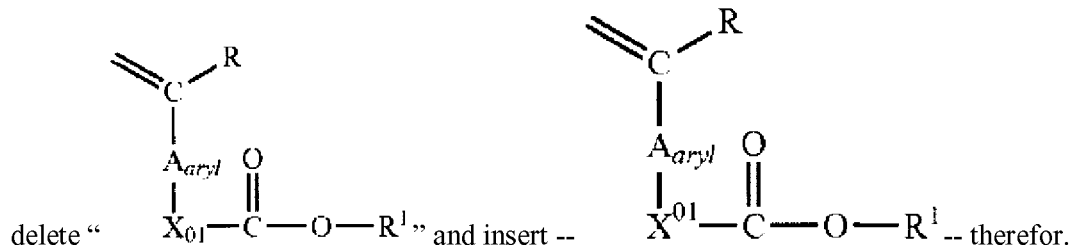

Column 132, Line 40 (approx.), delete "$A_{aryl}$, $X_{01}$" and insert --$A_{aryl}$, $X^{01}$-- therefor.

Column 132, Line 47 (approx.), delete "(f-0-2-0)" and insert --(f0-2-0)-- therefor.

CERTIFICATE OF CORRECTION (continued)
U.S. Pat. No. 8,404,428 B2

Column 133, Lines 3-8 (approx.) (Structure (f0-2-0)), delete " 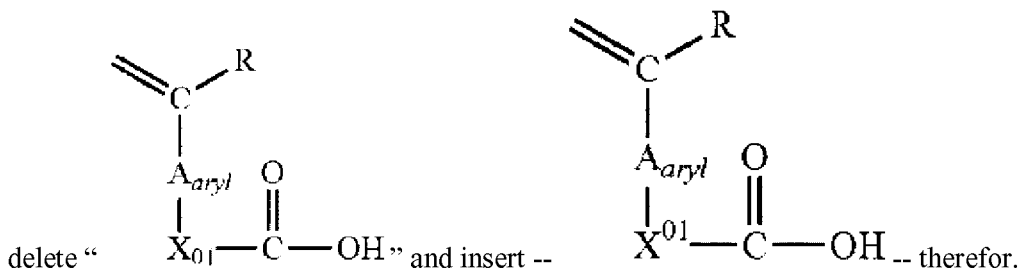 " and insert -- -- therefor.

Column 133, Line 14 (approx.), delete "$A_{aryl}$, $X_{01}$" and insert --$A_{aryl}$, $X^{01}$-- therefor.

Column 133, Line 41 (approx.), delete "dicyclohexylcarboxylmide" and insert --dicyclohexylcarboxyimide-- therefor.

Column 142, Lines 51-53, before "Firstly" delete "More specifically, the method for forming a resist pattern according to the present invention can be performed, for example, as follows.".

Column 143, Line 61, delete "long at it" and insert --long as it-- therefor.

Column 147, Line 17, delete "to coining" and insert --to coming-- therefor.

Column 149, Line 14, delete "a THE" and insert --a THF-- therefor.

Column 152, Lines 37-38, delete "of dibutyltellunide," and insert --of dibutyltelluride,-- therefor.

Column 153, Lines 44-45, delete "of dibutyltellunide," and insert --of dibutyltelluride,-- therefor.

Column 157, Line 5 (approx.), delete "below" and insert --below.-- therefor.

Column 162, Line 5, delete "Conact" and insert --Contact-- therefor.

In the Claims

Column 164, Lines 22-28 (approx.) (Structure (f1-1-2)), in Claim 2, delete

" 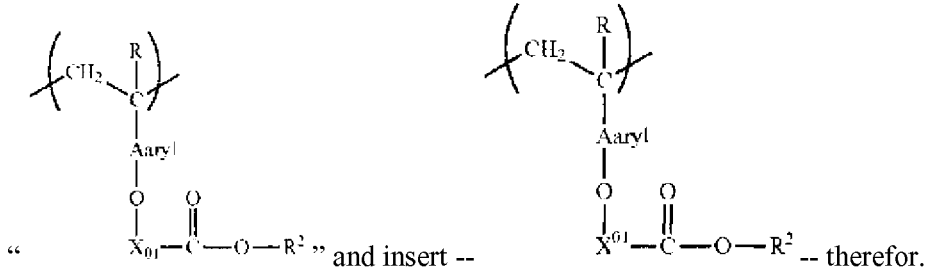 " and insert -- -- therefor.

Column 164, Line 60, in Claim 7, delete "to from a" and insert --to form a-- therefor.